United States Patent
Bamji et al.

(10) Patent No.: US 7,994,465 B1
(45) Date of Patent: Aug. 9, 2011

(54) METHODS AND DEVICES FOR IMPROVED CHARGE MANAGEMENT FOR THREE-DIMENSIONAL AND COLOR SENSING

(75) Inventors: Cyrus Bamji, Fremont, CA (US); Hakan Yalcin, Fremont, CA (US)

(73) Assignee: Microsoft Corporation, Redmond, WA (US)

( * ) Notice: Subject to any disclaimer, the term of this patent is extended or adjusted under 35 U.S.C. 154(b) by 561 days.

(21) Appl. No.: 12/079,686

(22) Filed: Mar. 28, 2008

Related U.S. Application Data

(63) Continuation-in-part of application No. 11/349,017, filed on Feb. 6, 2006, now Pat. No. 7,352,454.

(51) Int. Cl.
*H01J 40/14* (2006.01)

(52) U.S. Cl. .............. 250/214 R; 250/214.1; 250/216; 356/141.1

(58) Field of Classification Search .............. 250/214 R, 250/214.1, 216; 356/141.1
See application file for complete search history.

(56) References Cited

U.S. PATENT DOCUMENTS 7,718,948 B2 * 5/2010 Kiesel et al. .................. 250/216

* cited by examiner

*Primary Examiner* — Seung C Sohn
(74) *Attorney, Agent, or Firm* — Vierra Magen Marcus & DeNiro LLP

(57) ABSTRACT

TOF and color sensing detector structures have x-axis spaced-apart y-axis extending finger-shaped gate structures with adjacent source collection regions. X-dimension structures are smaller than y-dimension structure and govern performance, characterized by high x-axis electric fields and rapid charge movement, contrasted with lower y-axis electric fields and slower charge movement. Preferably a potential barrier is implanted between adjacent gates and a bias gate is formed intermediate a gate and associated source region. For color detection sensor devices, gate bias voltage signals $V_A$, $V_B$ coupled to the finger-shaped gate structures are high during sub-integration periods $t_1$ and are low during a shorter charge movement period $t_2$. In one embodiment, alternate finger-shaped gate structures preferable have different high magnitude sub-integration period voltages that enable detected ambient optical energy of different wavelengths to be discerned. Resultant detector structures can be operated at the more extreme gate voltages that are desirable for high performance.

16 Claims, 35 Drawing Sheets

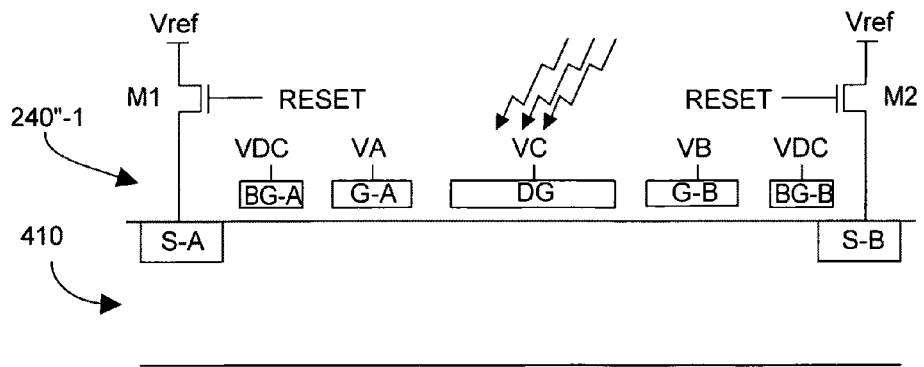
FIG. 17A
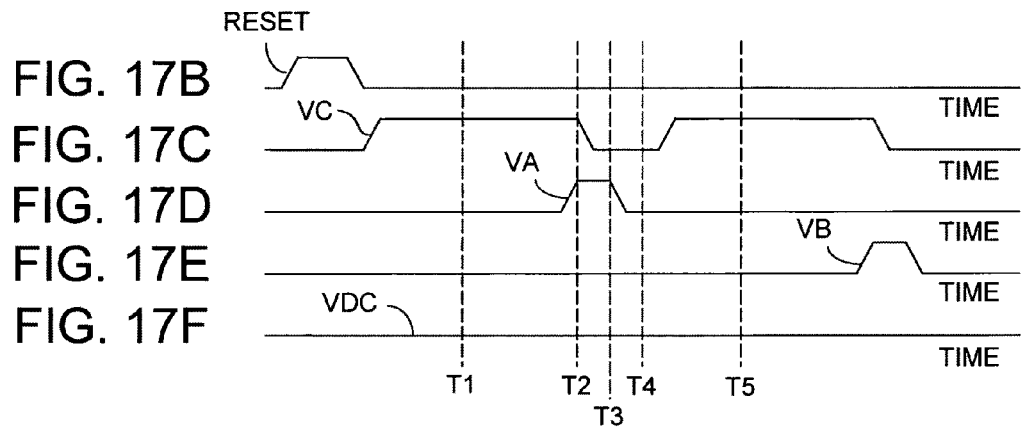
FIG. 17B
FIG. 17C
FIG. 17D
FIG. 17E
FIG. 17F
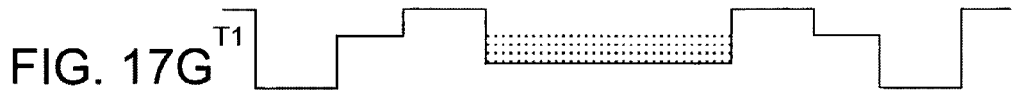
FIG. 17G T1
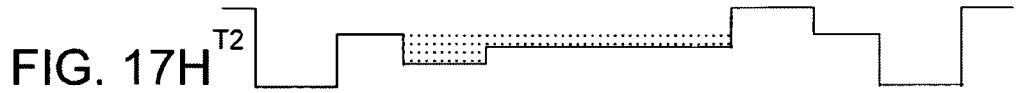
FIG. 17H T2
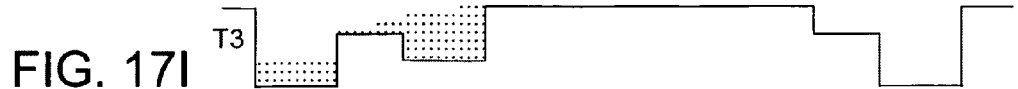
FIG. 17I T3
FIG. 17J T4
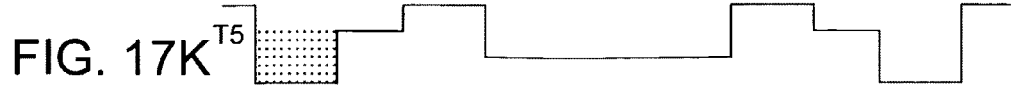
FIG. 17K T5

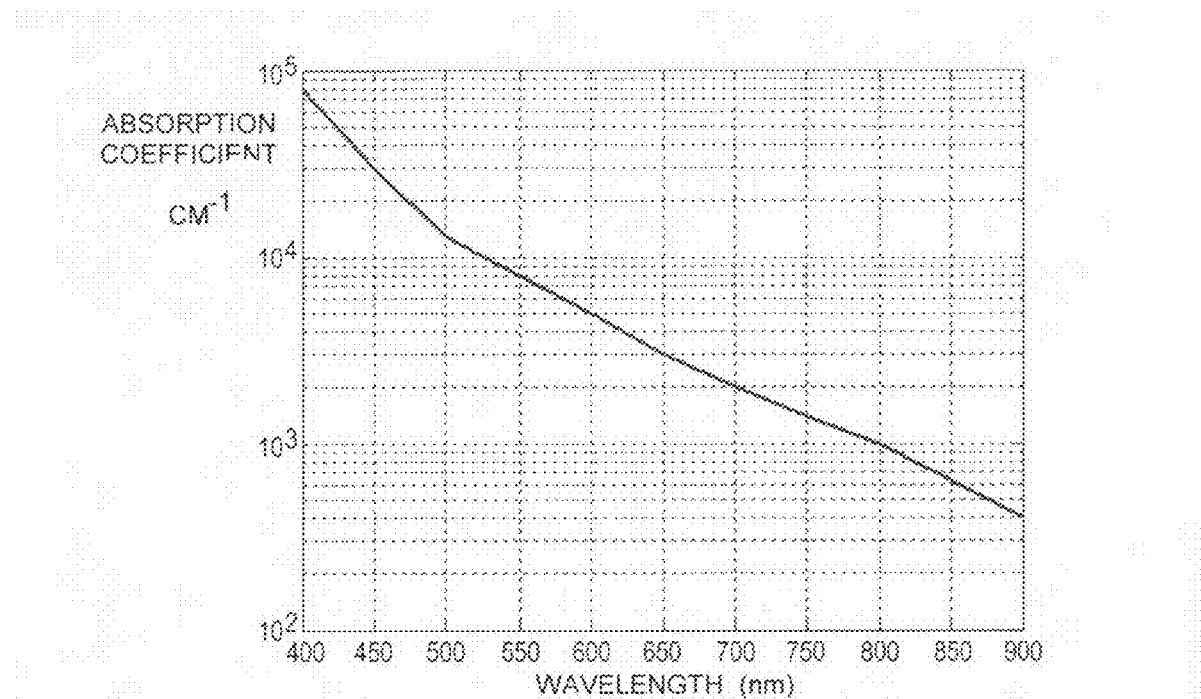
FIG. 20A (PRIOR ART)
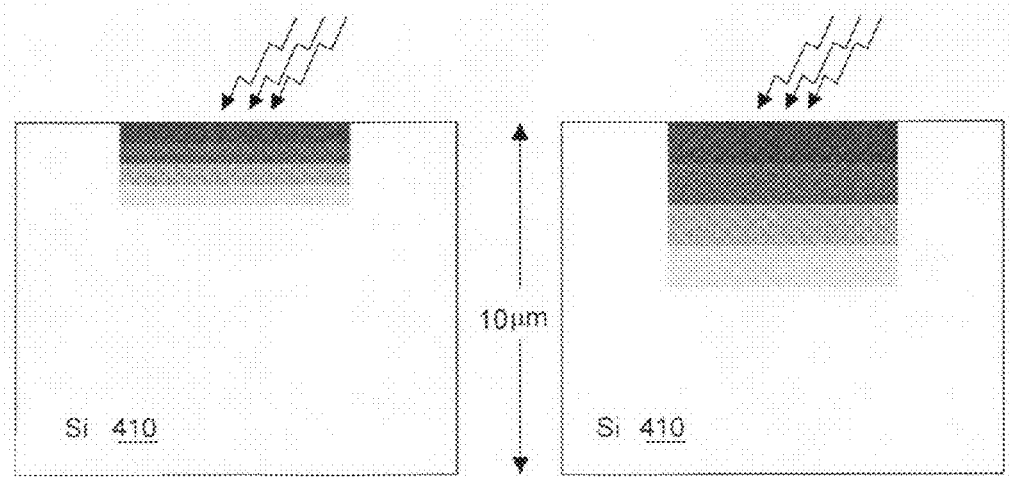
FIG. 20B
(PRIOR ART)
FIG. 20C
(PRIOR ART)

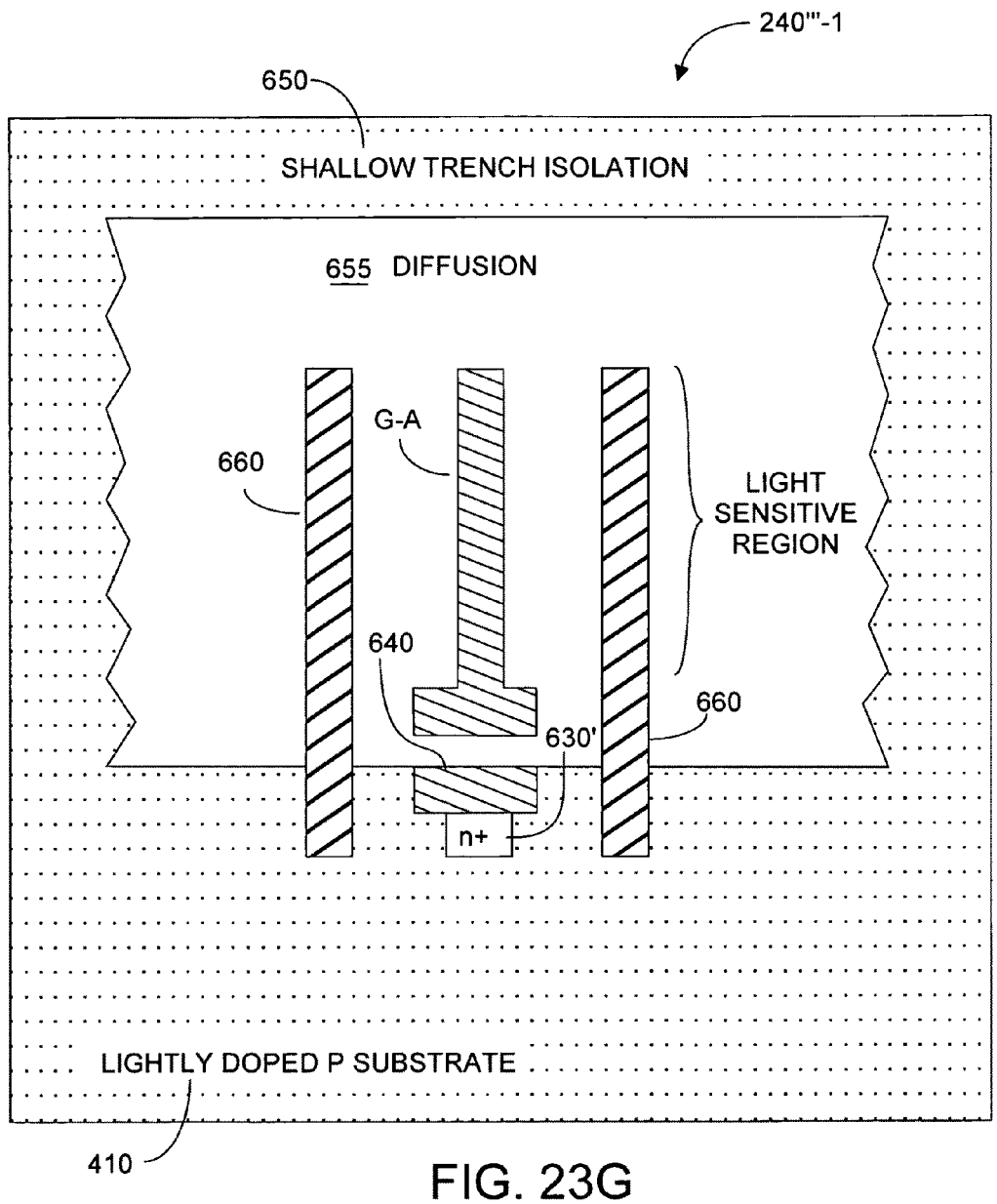
FIG. 23G
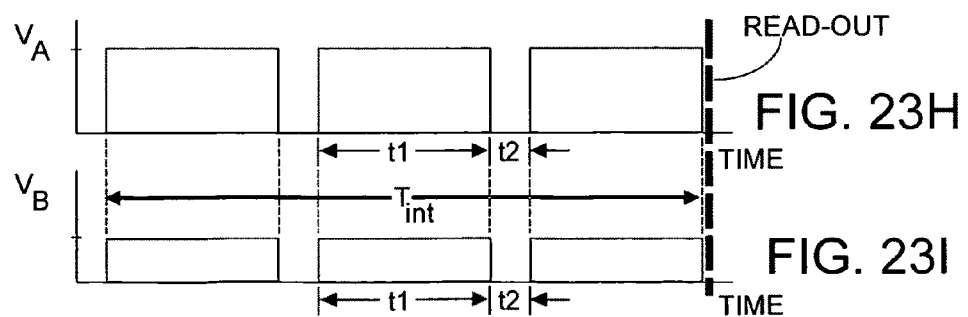
FIG. 23H
FIG. 23I

METHODS AND DEVICES FOR IMPROVED CHARGE MANAGEMENT FOR THREE-DIMENSIONAL AND COLOR SENSING

CROSS-REFERENCE TO CO-PENDING APPLICATION

This is a continuation-in-part application from co-pending U.S. patent application Ser. No. 11/349,017 filed 6 Feb. 2006 entitled Methods and Devices for Improved Charge Management for Three-Dimensional and Color Sensing, C. Bamji and H. Yalcin, inventors. This parent '017 application was assigned to Canesta, Inc. of Sunnyvale, Calif., assignee herein, and is soon to be issued as U.S. Pat. No. 7,352,454.

The parent '017 application was a continuation-in-part application from U.S. patent application Ser. No. 11/028,290 (the '290 application) entitled Methods and Devices for Charge Management for Three-Dimensional and Color Sensing, which '290 application was a divisional application from U.S. patent application Ser. No. 10/464,299 (the '299 application), which became U.S. Pat. No. 6,906,793 entitled Methods and Devices for Charge Management for Three-Dimensional Sensing. The '299 application was a continuation-in-part application from U.S. patent application Ser. No. 10/020,339 (the '339 application), entitled "Systems for CMOS-Compatible Three-Dimensional Image Sensing Using Quantum Efficiency Modulation", which became U.S. Pat. No. 6,580,496 (2003). The '339 application claimed priority from U.S. provisional application No. 60/247,158 (filed 9 Nov. 2000), and U.S. provisional application No. 60/254,873 (filed 11 Dec. 2000). The '299 application also claimed priority from U.S. provisional patent application No. 60/393,408 filed 1 Jul. 2002 entitled "3D Sensing Using Differential Charge Transfer Method", from U.S. provisional patent application No. 60/396,422 filed 15 Jul. 2002 entitled "Local Charge Collection Based High Speed QE Modulation Structures", and from U.S. provisional patent application No. 60/400,002 filed on 29 Jul. 2002 entitled "Electrically Wavelength Programmable CMOS Color Sensor". The '017 application also claimed priority from U.S. provisional patent application No. 60/650,915 filed 8 Feb. 2005 entitled "Protected Gate Long Finger Shutter Diode", C. Bamji and H. Yalcin inventors. Each of the above-reference utility and provisional applications and patents is assigned to Canesta, Inc. Applicants incorporate herein by reference each of the above-referenced co-pending provisional and utility patent applications.

BACKGROUND OF THE INVENTION

Field of the Invention

The invention relates generally to CMOS-implementable image sensors suitable for three-dimensional applications that may include range finders, image mapping, three-dimensional image capture, and capture of images with color perception not limited by human color perception, to improving charge collection and detection characteristics of such detectors.

Electronic camera and range sensor systems that provide a measure of distance z from the system to a target object are known in the art. Many such systems approximate the range to the target object based upon luminosity or brightness information obtained from the target object. Some such systems are passive and respond to ambient light reflected from the target object, while other systems emit and then detect emitted light reflected from the target object. However brightness or luminosity-based systems may erroneously yield the same measurement information for a distant target object that may be large with a shiny surface and is thus highly reflective, as for a smaller target object that is closer to the system but has a dull surface that is less reflective.

Some range finder autofocus cameras employ detectors to approximate average distance from the camera to the target object by examining relative luminosity (brightness) data obtained from the object. In some applications such as range finding binoculars, the field of view is sufficiently small such that all objects in focus will be at substantially the same distance. But in general, luminosity-based systems do not work well and are subject to error, as noted above.

Some cameras and binoculars employ active infrared (IR) autofocus systems that produce a single distance value that is an average or a minimum distance to all targets within the field of view. Other camera autofocus systems often require mechanical focusing of the lens onto the subject to determine distance. At best these prior art focus systems can focus a lens onto a single object in a field of view, but cannot simultaneously measure distance for all objects in the field of view.

In general, a reproduction or approximation of original luminosity values in a scene permits the human visual system to understand what objects were present in the scene and to estimate their relative locations stereoscopically. For non-stereoscopic images such as those rendered on an ordinary television screen, the human brain assesses apparent size, distance and shape of objects using past experience. Specialized computer programs can approximate object distance under special conditions.

Stereoscopic images allow a human observer to more accurately judge the distance of an object. However it is challenging for a computer program to judge object distance from a stereoscopic image. Errors are often present, and the required signal processing requires specialized hardware and computation. Stereoscopic images are at best an indirect way to produce a three-dimensional image suitable for direct computer use.

Many applications require directly obtaining a three-dimensional rendering of a scene. But in practice it is difficult to accurately extract distance and velocity data along a viewing axis from luminosity measurements. Other applications may require accurate distance and velocity tracking, for example an assembly line welding robot that must determine the precise distance and speed of the object to be welded, or an imaging warning system for use in a motor vehicle. The necessary distance measurements may be erroneous due to varying lighting conditions and other shortcomings noted above. Such applications would benefit from a system that could directly capture three-dimensional imagery.

Some prior art system seek to acquire three dimensional images using mechanical devices. For example, scanning laser range finding systems raster scan an image by using mirrors to deflect a laser beam in the x-axis and perhaps the y-axis plane. The angle of deflection of each mirror is used to determine the coordinate of an image pixel being sampled. Such systems require precision detection of the angle of each mirror to determine which pixel is currently being sampled. Understandably having to provide precision moving mechanical parts add bulk, complexity, and cost to such range finding system. Further, because these systems sample each pixel sequentially, the number of complete image frames that can be sampled per unit time is limited. (It is understood that the term "pixel" can refer to an output result produced from one or more detectors in an array of detectors.) Although specialized three dimensional imaging systems exist in the nuclear magnetic resonance and scanning laser tomography fields, such systems require substantial equipment expenditures. Further, these systems are obtrusive, and are dedicated to specific tasks, e.g., imaging internal body organs.

Rather than rely exclusively upon acquiring luminosity data, actively or passively, a more accurate distance measuring system is the so-called time-of-flight (TOF) system. FIG. 1 depicts an exemplary TOF system, as described in U.S. Pat. No. 6,323,942 entitled CMOS-Compatible Three-Dimensional Image Sensor IC (2001), which patent is incorporated herein by reference as further background material. TOF system 100 can be implemented on a single IC 110, without moving parts and with relatively few off-chip components. System 100 includes a two-dimensional array 130 of pixel detectors 140, each of which has dedicated circuitry 150 for processing detection charge output by the associated detector. In a typical application, array 130 might include 100×100 pixels 230, and thus include 100×100 processing circuits 150. IC 110 also includes a microprocessor or microcontroller unit 160, memory 170 (which preferably includes random access memory or RAM and read-only memory or ROM), a high speed distributable clock 180, and various computing and input/output (I/O) circuitry 190. Among other functions, controller unit 160 may perform distance to object and object velocity calculations.

Under control of microprocessor 160, a source of optical energy 120 is periodically energized and emits optical energy via lens 125 toward an object target 20. Typically the optical energy is light, for example emitted by a laser diode or LED device 120. Some of the emitted optical energy will be reflected off lens, collectively 135, and will fall upon two-dimensional array 130 of pixel detectors 140 where an image is formed. Each imaging pixel detector 140 measures both intensity or amplitude of the optical energy received, and the phase-shift of the optical energy as it travels from emitter 120, through distance Z to target object 20, and then distance again back to imaging sensor array 130. For each pulse of optical energy transmitted by emitter 120, a three-dimensional image of the visible portion of target object 20 is acquired.

Emitted optical energy traversing to more distant surface regions of target object 20 before being reflected back toward system 100 will define a longer time-of-flight than radiation falling upon and being reflected from a nearer surface portion of the target object (or a closer target object). For example the time-of-flight for optical energy to traverse the roundtrip path noted at t1 is given by t1=2·Z1/C, where C is velocity of light. A TOF sensor system can acquire three-dimensional images of a target object in real time. Such systems advantageously can simultaneously acquire both luminosity data (e.g., signal amplitude) and true TOF distance measurements of a target object or scene.

As described in U.S. Pat. No. 6,323,942, in one embodiment of system 100 each pixel' detector 140 has an associated high speed counter that accumulates clock pulses in a number directly proportional to TOF for a system-emitted pulse to reflect from an object point and be detected by a pixel detector focused upon that point. The TOF data provides a direct digital measure of distance from the particular pixel to a point on the object reflecting the emitted pulse of optical energy. In a second embodiment, in lieu of high speed clock circuits, each pixel detector 140 is provided with a charge accumulator and an electronic shutter. The shutters are opened when a pulse of optical energy is emitted, and closed thereafter such that each pixel detector accumulates charge as a function of return photon energy falling upon the associated pixel detector. The amount of accumulated charge provides a direct measure of round-trip TOF. In either embodiment, TOF data permits reconstruction of the three-dimensional topography of the light-reflecting surface of the object being imaged.

In some TOF systems, array 130 may comprise an array of charge-coupled devices (CCDs) or CMOS devices. CCDs typically are configured in a so-called bucket-brigade whereby light-detected charge by a first CCD is serial-coupled to an adjacent CCD, whose output in turn is coupled to a third CCD, and so on. Bucket-brigade configurations generally preclude fabricating processing circuitry on the same IC containing the CCD array. Further, CCDs provide a serial readout as opposed to a random readout. For example, if a CCD range finder system were used in a digital zoom lens application, even though most of the relevant data would be provided by a few of the CCDs in the array, it would nonetheless be necessary to readout the entire array to gain access to the relevant data, a time consuming process. In still and some motion photography applications, CCD-based systems might still find utility.

Many factors including ambient light can affect reliability of data acquired by TOF systems. In some applications the transmitted optical energy may be emitted multiple times using different systems settings to increase reliability of the acquired TOF measurements. For example, the initial phase of the emitted optical energy might be varied to cope with various ambient and reflectivity conditions. The amplitude of the emitted energy might be varied to increase system dynamic range. The exposure duration of the emitted optical energy may be varied to increase dynamic range of the system. Further, frequency of the emitted optical energy may be varied to improve the unambiguous range of the system measurements.

U.S. Pat. No. 6,580,496 entitled Systems for CMOS-Compatible Three-Dimensional Image-Sensing Using Quantum Efficiency Modulation (2003) discloses a sophisticated system in which relative phase ($\phi$) shift between the transmitted light signals and signals reflected from the target object is examined to acquire distance z. Detection of the reflected light signals over multiple locations in a pixel array results in measurement signals that are referred to as depth images. FIG. 2A depicts a system 100' according to the '496 patent, in which an oscillator 115 is controllable by microprocessor 160 to emit high frequency (perhaps 200 MHz) component periodic signals, ideally representable as $A \cdot \cos(\omega t)$. Emitter 120 transmitted optical energy having low average and peak power in the tens of mW range, which emitted signals permitted use of inexpensive light sources and simpler, narrower bandwidth (e.g., a few hundred KHz) pixel detectors 140'. Unless otherwise noted, elements in FIG. 2A with like reference numerals to elements in FIG. 1 may be similar or identical elements.

In system 100' there will be a phase shift due to the time-of-flight (TOF) required for energy transmitted by emitter 120 ($S_1 = \cos(\omega t)$) to traverse distance z to target object 20, and the return energy detected by a photo detector 140' in array 130', $S_2 = A \cdot \cos(\omega t + \phi)$, where A represents brightness of the detected reflected signal and may be measured separately using the same return signal that is received by the pixel detector. FIGS. 2B and 2C depict the relationship between phase shift $\phi$ and time-of-flight, again assuming for ease of description a sinusoidal waveform. The period for the waveforms of FIGS. 2B and 2C is $T = 2\pi/\omega$.

The phase shift $\phi$ due to time-of-flight is:

$$\phi = 2 \cdot \omega \cdot z/C = 2 \cdot (2\pi f) \cdot z/C$$

where C is the speed of light 300,000 Km/sec. Thus, distance z from energy emitter (and from detector array) to the target object is given by:

$$z=\phi \cdot C/2\omega =\phi \cdot C/\{2\cdot (3\pi f)\}$$

As noted above, many types of three-dimensional imaging systems are known in the art. But even if reasonably accurate depth images can be acquired by such systems, it can be important to rapidly analyze the acquired data to discern whether objects are present that may require immediate response. For example, systems such as described in the '496 patent may be used as robotic sensors to determine whether certain objects are nearby whose presence may dictate the immediate shut-down of equipment for safety reasons. Systems including systems described in the '496 patent may be used within motor vehicle to help the vehicle operator quickly recognize objects whose presence may require immediate response, braking to avoid hitting pedestrians in the vehicle's path.

Various techniques for acquiring and processing three dimensional imaging have been developed by assignee herein Canesta, Inc. of San Jose, Calif. For example, U.S. Pat. No. 6,522,395 (2003) to Bamji et al. discloses Noise Reduction Techniques Suitable for Three-Dimensional Information Acquirable with CMOS-Compatible Image Sensor ICs; and U.S. Pat. No. 6,512,838 to Rafii et al. (2003) discloses Methods for Enabling Performance and Data Acquired from Three-Dimensional Image Systems.

Further, changes in the very structure of sensors used in three-dimensional imaging systems can improve charge collection, and thus detection performance of the overall system. Although not prior art by virtue of the continuation status of this present application, applicants's parent '299-'339 application, now U.S. Pat. No. 6,906,793, described an improved detector structure. Structures according to embodiments of the '793 patent had spaced-apart elongated finger-like gate collection structures that reduced loss of collected charge. Photo-generated charge was rapidly collected in the spaced-apart direction, with collected charge moving less rapidly in the elongated direction. Detector response was substantially independent of the rate of collection in the elongated direction. While the detector structures and systems described in the '793 patent, worked well, some leakage of collected charge still occurred. In those structures, shallow trench isolation (STI) was provided to surround the N+ source regions, to improve detector performance. However the close proximity of the STI to the source regions permitted dark current to flow within STI-diffusion interface. Further, trap sites within the STI existed, which created an undesired time lag for photo-emitted electrons that became trapped in such sites for a while. Further, while such detector structures could have good modulation contrast (defined later herein), modulation contrast diminished at the higher voltage levels desired to enhance retention of collected charge.

Thus there is a need for further improvement in CMOS detector structures used in three-dimensional image sensing, such that detection charge loss is inhibited, without collection error due to dark current and/or trapping sites. Preferably such structures should exhibit improved modulation contrast, even in the presence of elevated detector operating potentials. Finally, such structures should be implementable using standard CMOS fabrication steps.

The present invention provides such a system and detectors.

SUMMARY OF THE INVENTION

The invention of the parent '299 application and '399 application (now U.S. Pat. No. 6,906,793 and U.S. Pat. No. 6,580,496) provided a CMOS-implementable system that required no moving parts and measured distance and velocity in real time using time-of-flight (TOF) data rather than relying upon luminosity data. The system could be fabricated on a single IC containing both a two-dimensional array of CMOS-compatible pixel detectors that sense photon light energy, and associated processing circuitry. A companion to the application giving rise to the '496 patent is now U.S. Pat. No. 6,515,740 to Bamji et al. (2003) entitled "Methods for CMOS-Compatible Three-Dimensional Image Sensing Using Quantum Efficiency Modulation".

By way of overview, in applicants' '942 patent, a microprocessor on a CMOS-compatible IC continuously triggered a preferably LED or laser light source whose light output pulses were at least partially reflected by points on the surface of the object to be imaged. For good image resolution, e.g., a cm or so, a large but brief pulse of optical energy was required, for example, peak pulse energy of perhaps 10 W, a pulse width of about 15 ns, and a repetition rate of about 3 KHZ. While average energy in applicants' earlier system was only about 1 mW, the desired 10 W peak power essentially dictated the use of relatively expensive laser diodes as a preferred energy light source. Each pixel detector in the detector array had associated electronics to measure time-of-flight from transmission of an optical energy pulse to detection of a return signal. In that invention, the transmission of high peak power narrow energy pulses required the use of high bandwidth pixel detector amplifiers.

In applicants' above-referenced '740 patent and '496 patent, the system transmitted high frequency component periodic signals having low average power and low peak power, e.g., tens of mW rather than watts. For ease of analysis, optical energy periodic signals such as an ideal sinusoid waveform, e.g., cos(ωt), were assumed, and will be assumed herein. Emitting such low peak power high frequency component periodic signals permitted use of inexpensive light sources and simpler, narrower bandwidth pixel detectors. Bandwidths could be on the order of a few hundred KHz with an operating (emitted energy modulation) frequency of about 200 MHz. Good resolution accuracy was still obtainable using a low peak power optical emitter in that the effective duty cycle is greater than the output from a narrow-pulsed optical emitter of higher peak power.

In a system according to the '740 patent, the '496 patent, as well as in the present invention, it is convenient to assume that the energy emitted from the optical source is approximately $S_1=K\cdot\cos(\omega t)$ where K is an amplitude coefficient, $\omega=2\pi f$, and frequency f is perhaps 200 MHz. Assume further that distance z separates the optical energy emitter from the target object. For ease of mathematical representation, K=1 will be assumed although coefficients less than or greater than one may be used. The term "approximately" is used in recognition that perfect sinusoid waveforms can be difficult to generate. Due to the time-of-flight (TOF) required for the energy to traverse distance z, there will be a phase shift φ between the transmitted energy and the energy detected by a photo detector in the array, $S_2=A\cdot\cos(\omega t+\phi)$. Coefficient A represents brightness of the detected reflected signal and may be measured separately using the same return signal that is received by the pixel detector.

The phase shift φ due to time-of-flight is:

$$\phi=2\cdot\omega\cdot z/C=2\cdot(2\pi f)\cdot z/C$$

where C is the speed of light 300,000 Km/sec. Thus, distance z from energy emitter (and from detector array) is given by:

$$z=\phi \cdot C/2\omega =\phi \cdot C/\{2\cdot (2\pi f)\}$$

Distance z is known modulo $2\pi C/(2\omega)=C/(2f)$. If desired, several different modulation frequencies of optically emitted energy may be used, e.g., $f_1, f_2, f_3 \ldots$, to determine z modulo $C/(2f_1), C/(2f_2), C/(2f_3)$. The use of multiple different modulation frequencies advantageously can reduce aliasing. If $f_1$, $f_2, f_3$ are integers, aliasing is reduced to the least common multiplier of $f_1, f_2, f_3$, denoted $LCM(f_1, f_2, f_3)$. If $f_1, f_2, f_3$ are not integers, they preferably are modeled as fractions expressible as $a_1/D$, $a_2/D$, and $a_3/D$, where I in a is an integer, and D=(GCD) represents the greatest common divisor of $a_1$, $a_2, a_3$. From the above, distance z may be determined modulo $LCM \cdot (a_1, a_2, a_3)/D$. This same analytical approach is also practiced with the various embodiments of the present invention, described later herein.

Phase $\phi$ and distance z were determined by mixing (or homodyning) the signal detected by each pixel detector $S_2 = A \cdot \cos(\omega t + \phi)$ with the signal driving the optical energy emitter $S_1 = \cos(\omega t)$. The mixing product $S_1 \cdot S_2$ is $0.5 \cdot A \cdot \{\cos(2\omega t + \phi) + \cos(\phi)\}$ and will have a time average value of $0.5 \cdot A \cdot \cos(\phi)$. If desired, the amplitude or brightness A of the detected return signal may be measured separately from each pixel detector output.

To implement homodyne determination of phase N and distance z, each pixel detector in the detector array had its own dedicated electronics that included a low noise amplifier to amplify the signal detected by the associated pixel detector, a variable phase delay unit, a mixer, a lowpass filter, and an integrator. The mixer mixed the output of low noise amplifier with a variable phase delay version of the transmitted sinusoidal signal. The mixer output was lowpass filtered, integrated and feedback to control phase shift of the variable phase delay unit. In the equilibrium state, the output of each integrator will be the phase (where $\psi = \phi \pm \pi/2$) associated with the TOF or distance z between the associated pixel detector and a point a distance z away on the target object. The analog phase information is readily digitized, and an on-chip microprocessor can then calculate z-values from each pixel detector to an associated point on the target object. The microprocessor further can calculate dz/dt (and/or dx/dt, dy/dt) and other information if desired.

In applicants's '740 and '496 patents, detection sensitivity for such systems was enhanced even while using low peak power high frequency component periodic signals, with phase delay used to determine TOF, dz/dt (and/or dx/dt, dy/dt, and other information. More specifically, an improved mixer was described, in which mixing results from modulating quantum efficiency (QE) of the photodiodes in the detector array, for example through use of a MOS transistor gate or altering reverse bias of the photodiodes. Such mixing offered many advantages including improved high frequency sensitivity, improved detection signal/noise, smaller form factor, lower power consumption, and less cost to fabricate.

Several embodiments or categories of QE modulation were described in the '740 and '496 patents. For example, these patents disclosed variable phase delay ("category one") and QE modulation (as opposed to the use of dedicated electronic mixers such as Gilbert cells), as well as mixing with fixed phase delays ("category two") using QE modulation, to implement a variety of spatial and temporal multiplexing approaches. Advantageously, such methods could modulate QE of MOS-implemented photodiodes by changing photodiode reverse bias, or by providing MOS-implemented photodiodes with a photogate, and then changing the gate voltage. Single-ended or double-ended differential signal processing could be employed. Differential QE modulation advantageously allowed faster QE modulation, and provided a differential output with substantially removed common mode effects due to ambient light and photodiode dark current. The disclosed methods advantageously could accumulate photodetector signal charge on a photodiode capacitor, and accumulated charge could be examined periodically when QE modulation is stopped. Such signal accumulation approaches were preferred over methods that sought to directly measure a high frequency small magnitude photocurrent.

Using variable phase delay (VPD, or category one), photocurrent from each QE-modulated pixel photodiode (or photogate photodiode) was coupled as input to an associated relatively high input impedance amplifier that need not exhibit high bandwidth, high frequency response, or high closed-loop gain. The amplifier output fed directly to a low pass filter (LPF) whose output drove an integrator. The integrator output was coupled as to control phase of the VPD that controlled QE modulation signals driving the photodetector diodes. The VPD was also driven by a signal from the periodic signal generator that controls the optical energy emitter. A DC offset could (but need not) be associated with the output signal from the pixel photodiode detectors and with the homodyne drive signal. Assuming no offsets, at steady-state the LPF output is zero. Assuming appropriate DC offsets, at steady-state the LPF output is a minima or a maxima. VPD methods may be implemented single-ended or preferably double-ended using a complementary approach in which positive and negative signals are derived from photodiodes that are QE modulated out of phase.

Using fixed phase delay (FPD or category two) fixed homodyne signals were used to QE modulate each photodetector. In category two, different groups or banks of photodiode detectors could be defined in a non-localized manner within the array. For example, a first bank of photodiode detectors may be QE modulated with fixed 0° phase shift, a second bank may be QE modulated with fixed 90° phase, shift, a third bank with fixed 180° phase shift, and a fourth bank with fixed 270° phase shift. Within each pixel, there may be photodiode detectors that correspond to every one of the four banks. Phase information and target object brightness information can be determined by examining output values for each bank within a pixel. This FPD approach simplified the electronic circuitry associated with each pixel, reduced power consumption, and could reduce IC chip area requirement, and enabled a range of techniques for temporal and spatial multiplexing including so-called tessellation.

In applicants' provisional patent application Ser. No. 60/393,408, three-dimensional sensing using differential charge transfer methods were disclosed, which methods could be used instead of or to augment QE modulation. These new methods further improved the collection of detection-induced electrons by including a pair of steering gates adjacent each detector's depletion gate. Collection-induced electrons in the detector structure are now guided from the depletion channel beneath the depletion gate to one of the two steering gates. In essence, while QE modulation techniques improve the amount of detection charge, not all of that charge is necessarily collected to contribute to the detection signal. But using differential charge transfer improves the collection of detection-induced electrons. Implementing differential charge transfer detectors per the '408 application can challenge a conventional fabrication facility. However applicants developed and used a rich set of fabrication rules that essentially trick the fabrication facility into implementing special logic operations used to form the detectors. This method of such rich rule sets has application to producing ICs other than differential charge transfer detectors.

In applicants provisional patent application Ser. No. 60/396,422, local charge collection based upon high speed QE modulation structures were disclosed. While applicants' QE modulation structures described in the '408 application employed three terminals, the '422 application discloses two terminal structures that not only make more efficient use of IC chip area while increasing effective collection area, but also provide substantial increase in QE modulation rates. The two terminal structures first collect detection-generated electrons in a horizontal direction, and then transport the collected charge vertically for final collection and contribution to the detection signal.

In applicants' provisional patent application Ser. No. 60/400,002, electrically wavelength programmable CMOS color sensors are disclosed. These structures may be similar to structures disclosed in the '422 application and indeed applicants are able to use the same structures to accomplish both TOF and color detection functions with minimal overhead. Such detection sensors make use of the fact that incoming light of different wavelengths reaches different depths within the silicon substrate of a CMOS sensor. Applicants vary magnitude of the potential applied to a polysilicon gate in the sensor structure to dynamically alter the color detection characteristics of the detector structure. The resultant detector can resolve a vast number of colors without using color filters. Unlike prior art color camera sensors in which a pixel captures but a single color, each pixel according to the '002 application can determine the spectral composition (e.g., complex color) of light. Thus for a given number of total pixels, the effective color resolution of a camera or sensor according to the '002 application is substantially higher than with a prior art color camera. Further the color sensor resolves color without limitation as to human color perception. A prior art color camera or sensor cannot distinguish between a surface reflecting yellow, and a surface that reflects both red and green, because information is lost when such camera or pixel sensor according to the '002 invention can determine the complex spectral composition of light at each pixel, and thus can discriminate between an image that reflects yellow, and an image that reflects both red and green.

In the various embodiments of the present invention, on-chip measurement information may be output in random rather than sequential order, and on-chip signal processing for object tracking and other information requiring a three-dimensional image can be readily accomplished. The overall system is small, robust, requires relatively few off-chip discrete components, and exhibits improved detection signal characteristics. On-chip circuitry can use such TOF data to readily simultaneously measure distance and velocity of all points on an object or all objects in a scene. Similarly, the on-chip circuitry can also determine spectral composition of the detected image at each pixel in the detection sensor. Advantageously a sensor whose individual pixels can determine spectral composition can also be used to determined TOF information.

In applicants' '299 application, improved detector structures and methods were provided. For example in one embodiment, the detector included closely spaced-apart, elongate or finger-shaped gate structures formed on the substrate surface of the detector structure. These structures could rapidly collect charge in the spaced-apart direction and then move the collected charge less rapidly in the elongated direction. Detector response was substantially independent of the collection rate in the elongated direction. The parent application, soon to be U.S. Pat. No. 7,352,454 improved on the detector structure of the '299 application by enhancing robustness even in the presence of elevated voltage levels preferred for high detection performance. In the present invention, the resultant structure exhibits improved detection charge retention characteristics in that more detection charge is collected in source regions and effectively processed. In one embodiment, implanted dopant regions are provided as charge barriers to reduce leakage of collected charge from one finger-shaped gate to an adjacent finger-shaped gate, even when gate potential is relatively high. Charge is collected in source regions of the detector. In another embodiment, bias gates are provided on the substrate surface to reduce loss of charge collected at the source back into the gate regions. Embodiments of the parent application invention advantageously reduce collection charge leakage, even in the presence of relatively high voltages associated with high detector performance (or high modulation contrast).

Some embodiments of the present invention detect typically ambient color or multi-spectral optical energy, and process the collected charge using the improved device structure of the parent application, e.g., a detector having closely spaced-apart, elongate or finger-shaped gate structures formed on the substrate surface that can rapidly collect charge in the spaced-apart direction and then move the collected charge less rapidly in the elongated direction. Preferably the gate voltage waveforms exhibit relatively long "high voltage magnitude" sub-integration periods $t_1$, followed by relatively short "low voltage magnitude" charge movement periods $t_2$. During periods $t_1$ optical energy generated charge collects generally beneath the elongate gate structures, and during periods $t_2$ this charge is allowed to move to adjacent source regions for collection. Many sub-integration periods $t_1$ (as well as associated smaller $t_2$ periods) comprise an integration period T, after which collected charge read-out occurs. In a so-called spatial embodiment, preferably different pairs of elongate gates have different magnitude "high" integration potentials to discern detected ambient optical energy of different (e.g., visible or otherwise color) wavelengths. In a so-called temporal embodiment, multiple read-outs after integration periods T are made using different high magnitude $V_A$ and $V_B$ gate voltage potentials.

Other features and advantages of the invention will appear from the following description in which the preferred embodiments have been set forth in detail, in conjunction with their accompanying drawings.

BRIEF DESCRIPTION OF THE DRAWINGS

FIGS. 15B-1 through 15B-4 are clock signals associated with the structure of FIG. 15A, according to the '496 application;

FIG. 17A is a side view of another embodiment of a CMOS differential charge pixel structure embodiment of the present invention, according to the '408 application;

FIGS. 17B-17F depict clock signals associated with the structure of FIG. 17A, according to embodiments of the present invention;

FIGS. 17G-17K depict surface potential and movement of detection-generated electrons during charge transfer for the structure of FIG. 17A, according to embodiments of the present invention;

FIG. 20A depicts absorption coefficient versus wavelength for light in silicon, according to the prior art;

FIGS. 20B and 20C depict generation profiles for light of 400 nm and 650 nm wavelength respectively in silicon, according to the prior art;

FIG. 23G is a plan view of a portion of the detector structure of FIG. 23F, depicting a smaller n+ region to further reduce total source capacitance, according to the present invention; and FIGS. 23H and 23I are respectively exemplary voltage waveforms $V_A$ and $V_B$ coupled to gates G-A, and G-B for the device of FIGS. 23A-23G, when used to analyze ambient color (or multi-spectral) incoming optical energy, according to an embodiment of the present invention.

DETAILED DESCRIPTION OF THE INVENTION

Figure 23A:
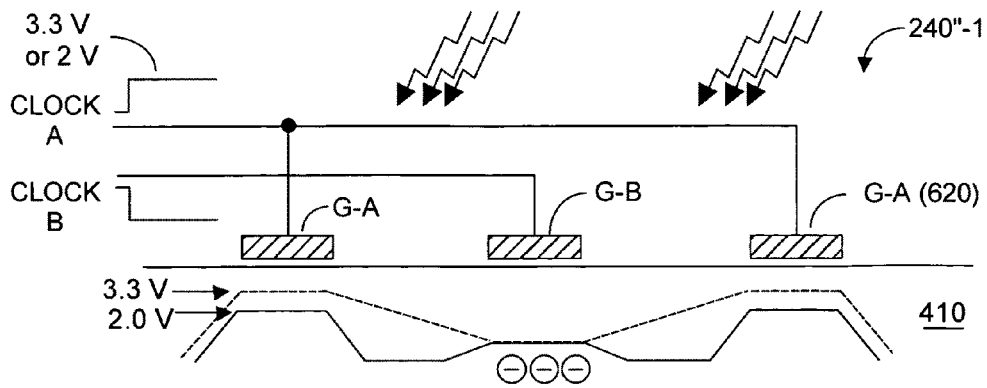
FIG. 23A is a cross-section of a sensor detector structure with a plot of surface potential at the silicon-gate oxide interface versus position along the X-direction, depicting undesired effects of high gate potential upon charge collection in an embodiment such as that shown in FIG. 19A.

A detailed description of the present invention commences with the description of FIG. 23A. However for a fuller appreciation of the present invention, it is useful to first describe the invention(s) of U.S. Pat. No. 6,580,496, or U.S. Pat. No. 6,515,740. As the '496 and '740 patents had the same specification, reference to the inventions of either will be denoted herein as being to the '496 invention.

That invention advantageously transmitted and detected optical energy that was periodic with a high frequency component, and relied upon phase shift between transmitted and detected waveforms to discern time-of-flight (TOF) and thus z-distance data. Although pulsed-type periodic waveforms could be used, the '496 invention will be described with respect to the emission and detection of sinusoidal waveforms, as such waveforms are rather easily analyzed mathematically. However it is to be understood that periodic pulsed waveforms with a high frequency component including imperfect sinusoidal waveforms are representable mathematically as groupings of perfect sinusoidal waveforms of varying coefficients and frequency multiples. The transmission and detection of such waveforms can advantageously permit use of relatively inexpensive low peak-power optical emitters, and the use of relatively lower bandwidth amplifiers. This is in contrast to applicants' referenced U.S. Pat. No. 6,323,942 (2001) in which a low duty cycle pulse train of narrow pulse widths was emitted by a very high peak power optical emitter.

Figure 2A:
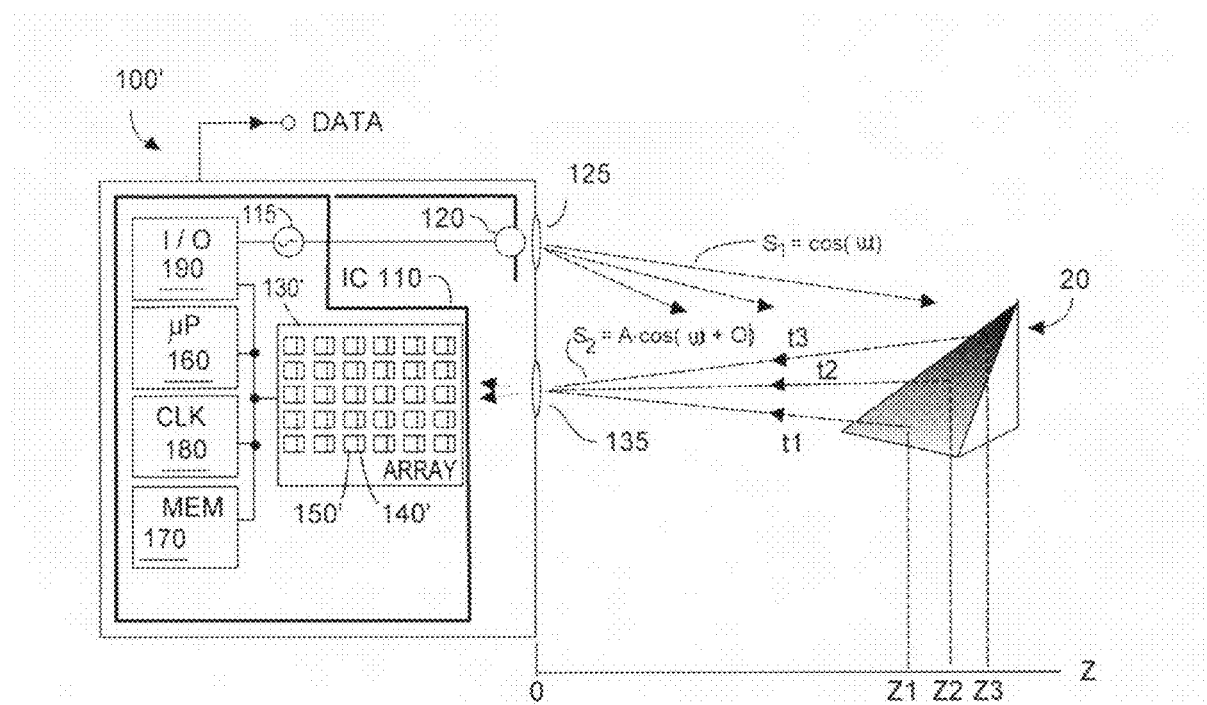
FIG. 2A depicts a phase-shift intensity and range finding system, according to the prior art.

FIG. 2A depicts the high frequency component of an exemplary idealized periodic optical energy signal as emitted by the '496 invention, here a signal represented as cos(ωt). The period T of the waveform shown is T=2π/ω. The signal is depicted as though it were AC-coupled in that any magnitude offset is not present. As described below, the operative frequency of the transmitted signal preferably was in the few hundred MHz range, and the average and the peak transmitted power may be relatively modest, e.g., less than about 50 mW or so.

Figure 2B:
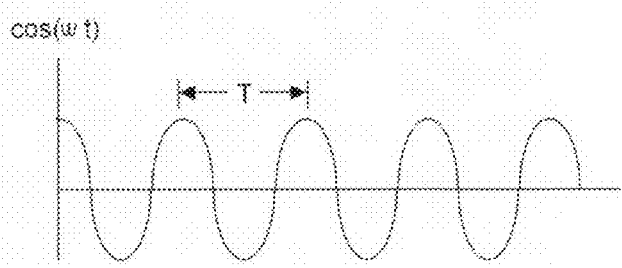
FIG. 2B depicts a transmitted periodic signal with high frequency components transmitted by the system of FIG. 2A, according to the prior art.

A portion of the transmitted energy reaches a target object and is at least partially reflected back toward the invention of the '496 patent, to be detected. FIG. 2B depicts the returned version of the transmitted waveform, denoted A·cos(ωt+φ), where A is an attenuation coefficient, and φ is a phase shift resulting from the time-of-flight (TOF) of the energy in traversing the distance from the '496 invention to the target object. Knowledge of TOF is tantamount to knowledge of distance z from a point on the object target, e.g., target 20, to the recipient pixel detector in the array of detectors within a system according to the '496 patent.

Specifying a repetition rate of the transmitted periodic optical energy signal involves tradeoffs that include considerations of the transmitted waveshape and duty cycle, the desired granularity in resolving z-distance, and peak power requirements for the optical energy emitter. For example, a transmitted periodic signal whose high frequency component is a few hundred MHz, e.g., 200 MHz, is consistent with z-distance resolution on the order of a cm or so, assuming eight-bit analog-to-digital conversion of the detected phase shift information. In practice, assuming a continuous sinusoidal-type waveform, the peak power required from the optical energy emitter will be about 10 mW. Of course if the transmitted waveform duty cycle were decreased to say 1%, the optical energy emitter peak power would have to be increased to about 500 mW, and so on. It will be appreciated that the ability to use a low peak power optical emitter is one of the distinguishing factors between the '496 invention and applicants' above-referenced U.S. Pat. No. 6,323,942 B1 (2001).

Figure 3:
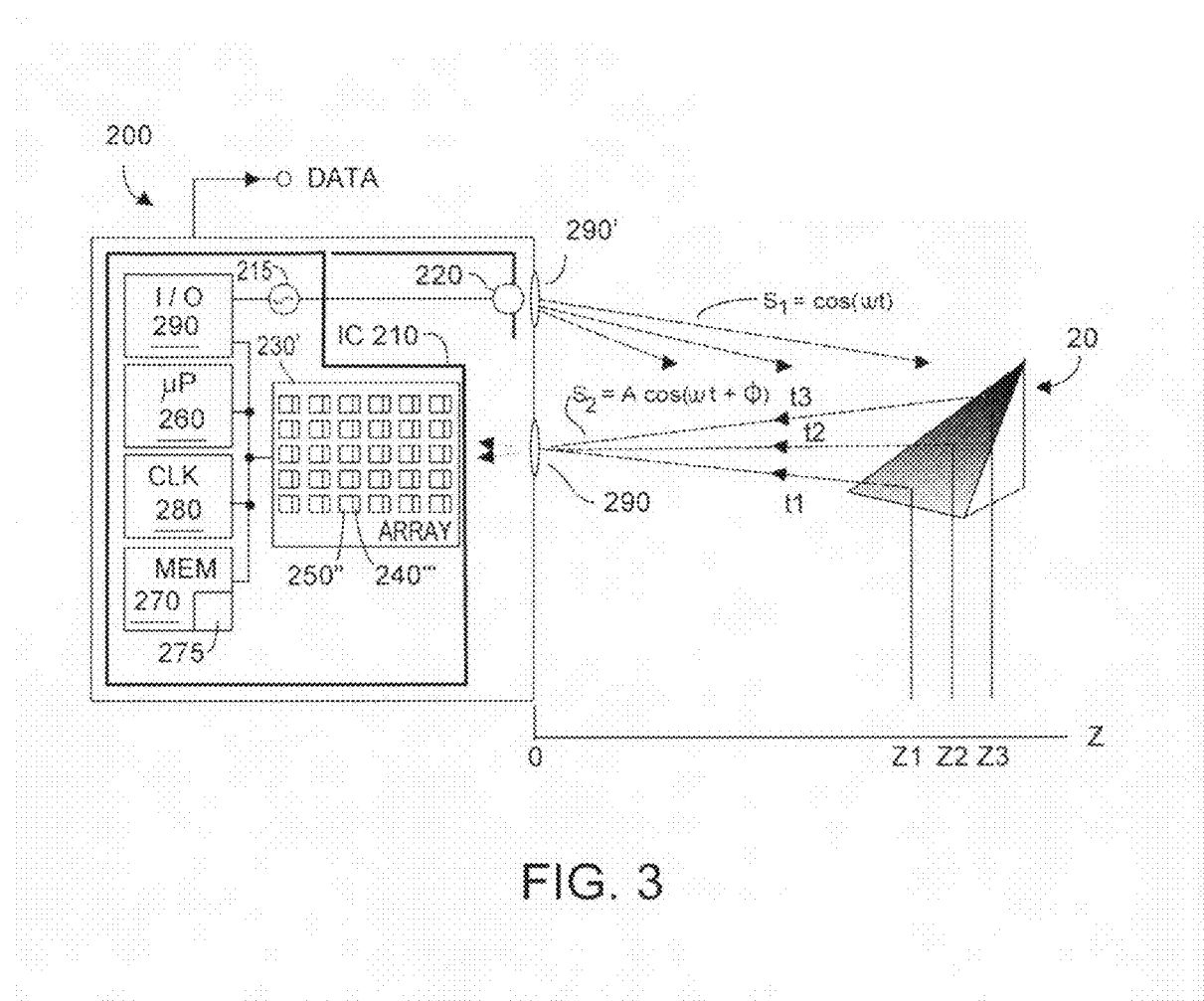
FIG. 3 is a block diagram of a preferred phase-shift system implementation useable with embodiments of the present invention.

FIG. 3 depicts an embodiment of a three-dimensional imaging system 200 with which pixel photodetectors 240" according to embodiments of the present invention may be practiced, including detection of multi-spectral or colored ambient light. But for the nature of the improved detector structures provided by the present invention, system 200 in FIG. 3 is similar to the system described in applicants's '496 invention. System 200 requires no moving parts, relatively few off-chip components and preferably is fabricated on an IC 210 using standard CMOS fabrication steps. In various embodiments of the '496 invention, preferably each photodetector 240-$x$ (denoted 240''' in FIG. 3 in accordance with the present invention) in the detector array 230' has associated electronics 250"-$x$ that implements QE modulation. Whether using variable phase delay or fixed phase delay techniques, the '496 invention and system 200 shown in FIG. 3 determines distance z according to $z=\phi \cdot C/2\omega=\phi \cdot C/\{2\cdot(2\pi f)\}$.

System 200 includes a driver 215, preferably commanded by microprocessor 260 that drives optical light source or emitter 220. Emitter 220 may be for example a low peak power laser diode, or low peak power LED, that can output a periodic signal with 50 mW or so peak power when driven with a repetition rate of a few hundred MHz and, in the preferred embodiment, a duty cycle close to 100%, as duty cycle is defined herein. At present, useful optical emitters are made from materials such as AlGaAs, whose bandgap energies are quite different than that of silicon, from which CMOS IC 210 is preferably fabricated. Thus, while FIG. 3 depicts optical emitter 220 as being off-chip 210, an optical emitter 220 made of CMOS-compatible materials may be fabricated on IC 210.

Light source 220 is preferably a low peak power LED or a laser that emits energy with a wavelength of perhaps 800 nm, although other wavelengths could instead be used. Below 800 nm wavelength, emitted light starts to become visible and laser fabrication becomes more difficult. Above 900 nm CMOS/silicon photodiode efficiency drops off rapidly, and in any event, 1100 nm is the upper wavelength for a device fabricated on a silicon substrate, such as IC 210. By using emitted light having a specific wavelength, and by filtering out incoming light of different wavelength, system 200 can operate with or without ambient light. The ability of system 200 to function in the dark can be advantageous in certain security and military type imaging applications. Off-chip mounted lens 290 preferably focuses filtered incoming light energy onto sensor array 230' such that each pixel detector 240$x$ (or 240$x$''' for detector structures according to the present invention) receives light from only one particular point (e.g., an object surface point) in the field of view. The properties of light wave propagation allow an ordinary lens 290 to be used to focus the light onto the sensor array. If a lens (290') is required to focus the optical light energy transmitted from emitter 220, a single lens could be used for 290, 290' if a mirror-type arrangement were used. Typical LED or laser diode emitters 220 have a shunt capacitance of perhaps 100 pF. Thus in driving emitter 220, it would be advantageous to place a small inductance (perhaps a few nH) in parallel with this capacitance, where the combined inductance-capacitance resonate at the periodic frequency of the emitter, typically a few hundred MHz. Alternatively, inductance (again a few nH) can be series-coupled to the emitter and its parasitic capacitance. If desired, such inductance can be derived using a bonding wire to the emitter.

CMOS-compatible IC 210 will preferably have fabricated thereon oscillator 215 driver, array 230' (comprising perhaps 100×100 (or more) pixel detectors 240 (preferably 240''' with improved structure according to the present invention) and 100×100 (or more) associated electronic processing circuits 250"), microprocessor or microcontroller unit 260, memory 270 (which preferably includes random access memory or RAM and read-only memory or ROM), various computing and input/output (I/O) circuitry 290, including, for example an analog/digital (A/D) conversion unit providing perhaps 8-bit A/D conversions of phase information $\phi$ detected by the various pixel detectors in array 230, and clock circuitry 280. Depending upon implementation, a single on-chip A/D converter function could be provided, or a dedicated A/D converter could be provided as part of each electronic processing circuit 250. I/O circuit 290 preferably can also provide a signal to control frequency of the oscillator 215 and thus to control optical energy emitter 220.

The DATA output line shown in FIG. 3 represents any or all information calculated by system 200. Preferably microprocessor 260 can examine consecutive frames stored in RAM in memory 270 to identify objects in the field of view scene. Microprocessor 260 can then compute z-distance and can compute object velocity dz/dt, dx/dt, dy/dt. Further, microprocessor 260 and associated on-chip circuitry can be programmed to recognize desired image shapes, for example a user's fingers if an application using system 200 to detect user interface with a virtual input device. A portion of memory 270 may store software 275 executable by microprocessor 260 to carry out desired operational procedures, for example to aid in recognition of images acquired by system 200.

For example, microprocessor 260 may execute image processing software 275 to identify contour movements between frames of acquired detection data, and thus promote identification of target objects by their contours. The exported DATA stream from the system IC may now represent change in location of the entire object 20 whenever it has moved. Advantageously, rather than export an entire frame of pixels at the frame rate, a single vector representing change in location of the object of interest may instead be sent. So doing can reduce IC chip input/output and can reduce off-chip data processing requirements. Microprocessor 260 could also supervise sequencing of spatial and/or temporal topologies, and optimize spatial and/or temporal multiplexing. In many embodiments, system 200 (or 100) will be battery operated. Microprocessor 260 can help reduce power consumption when software 275 determines sufficient image resolution is being attained. As such, operating power could selectively be reduced or terminated to various portions of the pixel detector array. 230. Further if sufficient photon energy reaches array 230 to ensure adequate detection, the shape of signals output by emitter 220 could be changed. For example, the peak power and/or duty cycle of the emitter energy could be reduced, thus reducing overall power consumption by system 200. The design tradeoffs in changing the shape of the optical energy output signal involve considerations of z-resolution accuracy, user safety, and power handling capacity of emitter 220.

In some applications, system 200 might be used to recognize user interaction with a virtual input device, a virtual keyboard perhaps. The data provided by microprocessor 260 could be reduced to keystroke information in such an application. Any or all of this data (denoted DATA in FIG. 3) can be exported from the IC to an external computer for further processing, for example via a universal serial bus. If microprocessor 260 has sufficient computational power, additional on-chip processing may occur as well. Note too that output from the array of CMOS-compatible detectors 240 (or 240") may be accessed in a random manner if desired, which permits outputting TOF DATA in any order. U.S. Pat. No. 6,710,770 (2004) entitled Quasi-Three Dimensional Method and Apparatus to Detect and Localize Interaction of User-Object and Virtual Transfer Device, assigned to Canesta, Inc. describes use of imaging to implement virtual input devices.

Among its other functions, microprocessor 260 acting through interface circuit 280 causes driver 225 to oscillate periodically with a desired duty cycle at a desired frequency, for example $f_1=200$ MHz. In response to signals from oscillator driver 225, laser diode or LED 220 emits optical energy at the desired frequency, e.g., $f_1=200$ MHz and duty cycle. Again, while a sinusoid or cosine waveform is assumed for ease of mathematical representation, a periodic waveform with similar duty cycle, repetition rate and peak power may be used, e.g., perhaps squarewaves. As noted, average and peak power is advantageously quite modest in the '496 invention, for example 10 mW. As a result, the cost of an LED optical emitter 220 is perhaps 30¢ compared to a cost of many dollars for a high peak power laser diode in applicants' earlier invention, described in U.S. Pat. No. 6,323,942 (2001).

The optical energy whose periodic high frequency component is ideally represented as $S_1=\cos(\omega t)$ is focused by optional lens 290' upon target object 20, some distance z away. At least some of the optical energy falling upon target 20 will be reflected back towards system 200 and will be detected by one or more pixel detectors 240 in array 230. Due to the distance z separating system 200, more particularly a given pixel detector 240 (240''') in array 230, and the target point on object 20, the detected optical energy will be delayed in phase by some amount φ that is proportional to time-of-flight, or to the separation distance z. The incoming optical energy detected by different pixel detectors 240 can have different phase φ since different times-of-flight or distances z are involved. In various figures including FIG. 3, the incoming optical energy is denoted as $S_2=A\cdot\cos(\omega t+\phi)$, e.g., the AC component of a return signal that will in fact include a DC component. However the DC component is relatively unimportant and is not depicted in the figures.

As will be described, it is the function of electronics 250 (250") associated with each pixel detector 240 (240''') in array 230' to examine and determine the relative phase delay, in cooperation with microprocessor 260 and software stored in memory 270 executed by the microprocessor. In an application where system 200 images a data input mechanism, perhaps a virtual keyboard, microprocessor 260 may process detection data sufficient to identify which of several virtual keys or regions on a virtual device, e.g., a virtual keyboard, have been touched by a user's finger or stylus. Thus, the DATA output from system 200 can include a variety of information, including without limitation distance z, velocity dz/dt (and/or dx/dt, dy/dt) of object 20, and object identification, e.g., identification of a virtual key contacted by a user's hand or stylus.

The two-dimensional array 230 of pixel sensing detectors preferably is fabricated using standard commercial silicon technology. The ability to fabricate such circuits and components on the same IC with the array of pixel detectors can shorten processing and delay times, due to shorter signal paths.

Each pixel detector 240 is equivalent to a parallel combination of a current source, an ideal diode, shunt impedance, and noise current source, and will output a current proportional to the amount of incoming photon light energy falling upon it. Preferably CMOS fabrication is used to implement the array of CMOS pixel diodes or photogate detector devices. Exemplary photodiode fabrication techniques include diffusion-to-well, diffusion-to-substrate, a well-to-substrate junction, and photogate structures. Well-to-substrate photodiodes are more sensitive to infrared (IR) light, exhibit less capacitance, and are thus preferred over diffusion-to-substrate photodiodes.

Figure 4:
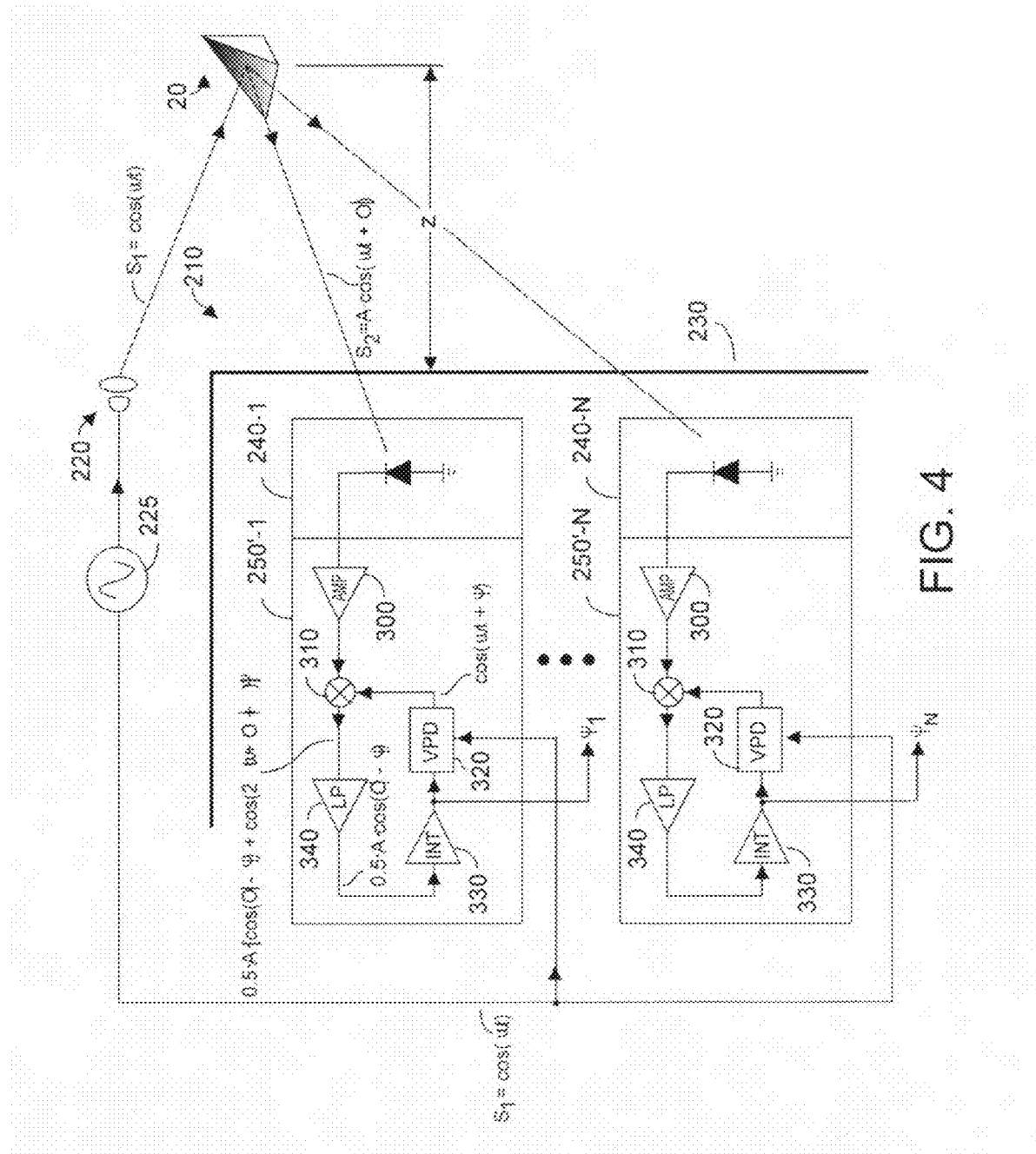
FIG. 4 is a block diagram showing two pixel detectors with their associated electronics, according to applicants' parent utility application and according to embodiments of the present invention.
Figure 9A:
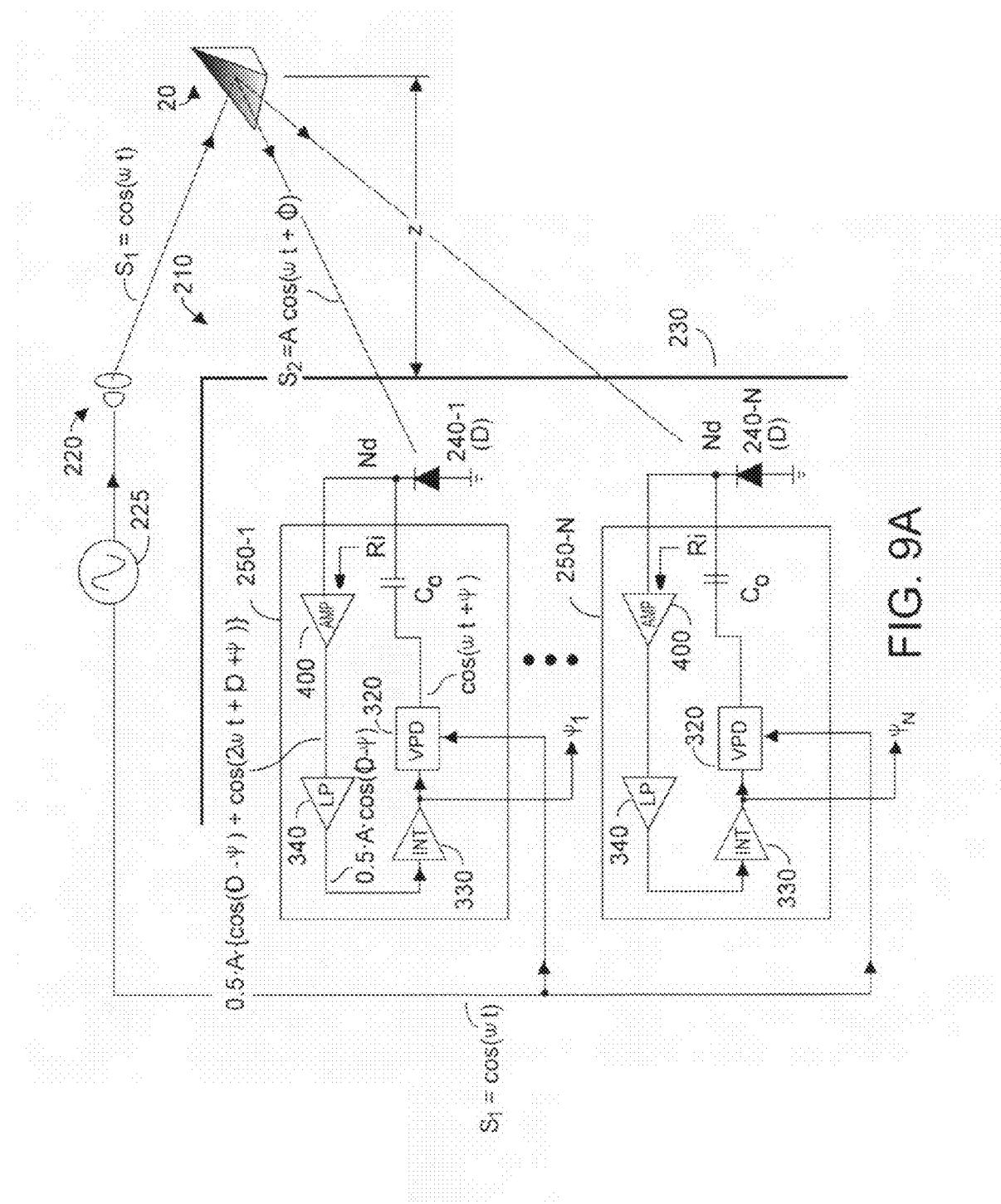
FIG. 9A is a block diagram showing two photodetectors and their associated electronics in a single-ended variable phase delay (VPD) QE modulated embodiment of the '496 invention.
Figure 9B:
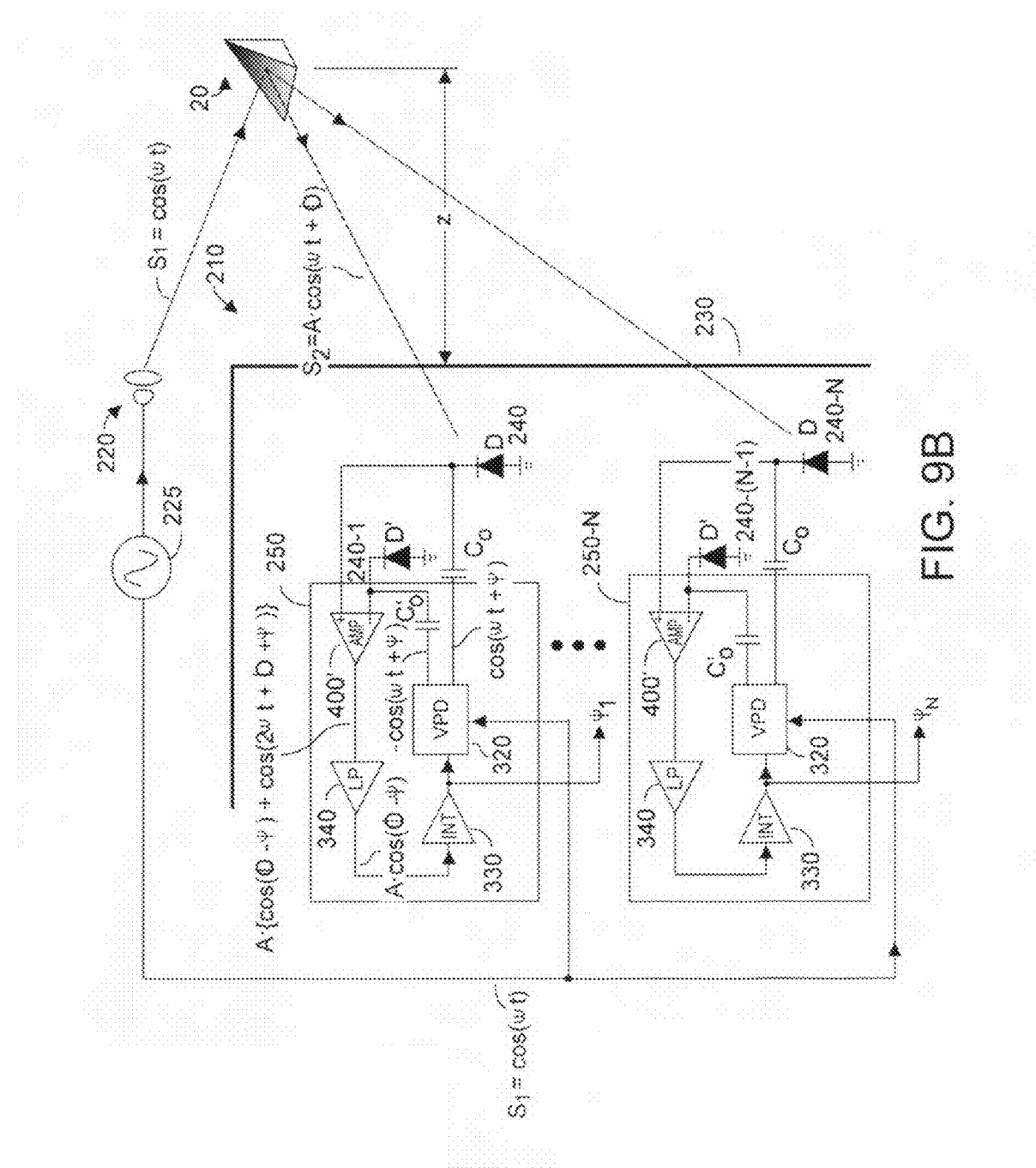
FIG. 9B is a block diagram of a VPD embodiment showing two photodetectors with their associated electronics in which photodiodes are QE differentially modulated, according to the '496 invention.
Figure 9C:
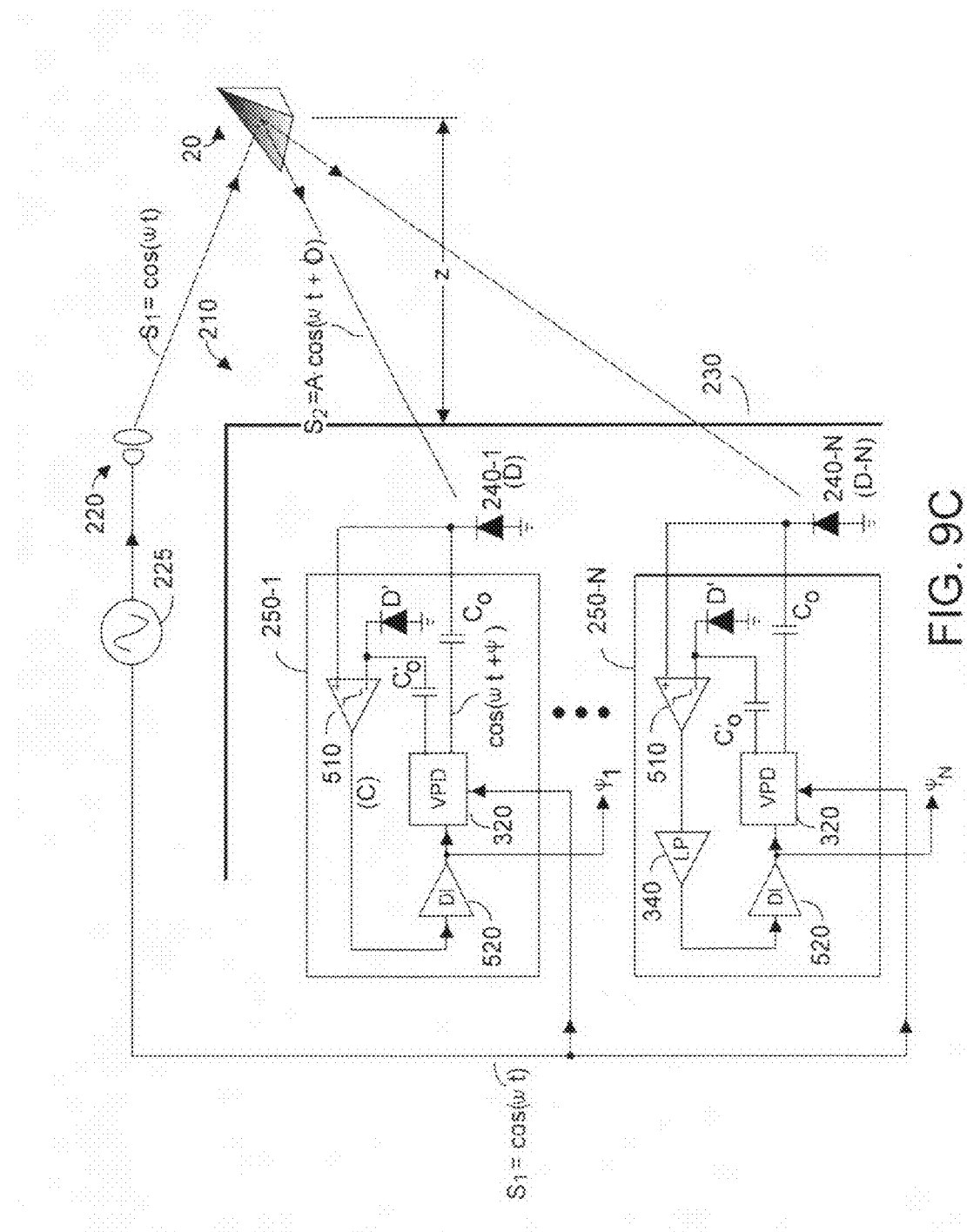
FIG. 9C is a block diagram of a VPD embodiment showing two photodetectors with their associated simplified electronics including a digital integrator, in which photodiodes are QE differentially modulated, according to the '496 invention.

As noted FIG. 4 represents an embodiment described in applicants' co-pending utility patent application. FIG. 4 represents a portion of IC 210 and of array 230, and depicts pixel detectors 240-1 through 240-x, and each diode's associated exemplary electronics 250'-1 through 250'-x. For ease of illustration in various figures including FIG. 4, lens 290 is not depicted. FIG. 4 does not relate directly to the '496 invention, but is included to provide a better understanding and appreciation for the benefits provided by the '496 invention. In the description that follows, FIGS. 9A-9C are directed to category one VPD QE modulation techniques and FIGS. 10A-10C are directed to category two fixed phase modulation techniques, with the remaining figures illustrating aspects of these various techniques.

In FIG. 4, only two pixel diodes 240 and two associated electronic circuits 250' are depicted, for ease of illustration however an actual array will include hundreds or thousands or more of such pixel detectors and associated electronic circuits. As noted, if desired a dedicated A/D converter could be provided as part of each electronics circuit 250'-1 through 250'-x, as opposed to implementing an omnibus A/D function on IC chip 210.

Consider now detection of incoming optical energy by pixel detector 240-1. Assuming that a low power LED or laser diode or the like 220 emits optical radiation having idealized high frequency component $S_1=\cos(\omega t)$, a fraction of such radiation reflected from a point on the surface of target 20 (distance z away) is given by $S_2=A\cos(\omega t+\phi)$. Upon receiving this incoming radiation, pixel detector 240-1 outputs a signal that is amplified by low noise amplifier 300. An exemplary amplifier 300 might have a closed-loop gain of perhaps 12 dB.

As noted, periodic emissions from optical source 220 preferably are sinusoidal or sinusoidal-like with a high frequency component of a few hundred MHz. Despite this high optical modulation frequency, it suffices for amplifier 300 to have a bandwidth of perhaps 100 KHz or so, perhaps as low as tens of KHz because all frequencies of interest are close to this modulation frequency. It will be appreciated that providing hundreds or thousands of low noise, relatively low bandwidth amplifiers 300 on IC 210 is an easier and more economical undertaking than providing high bandwidth amplifiers able to pass narrow pulses, for example as in the '942 invention. Thus, in FIG. 4, array 230 can function with relatively small bandwidth amplifiers 300, where each amplifier output is coupled directly to a first input of an associated mixer 310, whose second input is a signal of like frequency as that present at the first input. If each amplifier 300 and its associated mixer 310 were implemented as a single unit, it could suffice for the overall unit to have a bandwidth on the order of tens of KHz, and a high frequency response also on the order of tens of KHz.

As shown in FIG. 4, when comparing the detected signal to the transmitted signal, there will be a phase shift φ that is related to TOF and to distance z. Each circuit 250'-x couples the output of the associated low noise amplifier 300 to the first input of a mixer 310. In applicants' earlier invention for which FIG. 4 is descriptive, mixer 310 could be implemented as Gilbert cells, digital multipliers, etc.

In essence, each mixer 310 will homodyne the amplified detected output signal $S_2$ from an associated pixel detector 240 with a generator 225 signal $S_1$. Assuming that the optical energy emitted has an idealized high frequency component represented as a sine wave or cosine wave, the mixer output product $S_1 \cdot S_2$ will be $0.5 \cdot A\{\cos(2\omega t+\phi)+\cos(\phi)\}$ and will have an average value of $0.5 \cdot A \cos(\phi)$. If desired, the amplitude or brightness A of the detected return signal may be measured separately from each pixel detector output. In practice, an eight-bit analog-to-digital resolution of $A \cos(\phi)$ will result in about 1 cm resolution for z-measurements.

Each mixer 310 will have a second input coupled to the output of a variable phase delay (VPD) unit 320. VPD units 320 may be implemented in many ways, for example using a series-coupled string of inverters whose operating power supply voltage is varied to speed-up or slow-down the ability of each inverter to pass a signal. A first input to each VPD unit 320 will be derived from signal generator 225, and will be $S_1=\cos(\omega t)$, give or take a signal coefficient. Assume that VPD 320 adds a variable time delay $\psi$ to the $\cos(\omega t)$ signal derived from generator 225. Mixer 310 then mixes the amplified $\cos(\omega t+\phi)$ signal output by amplifier 300 with the $\cos(\omega t+\psi)$ signal output by VPD 320. Mixer 310 now outputs signals including $0.5 \cdot A\{\cos(\phi-\psi)+\cos(2\omega t+\phi+\psi)\}$. The output of mixer 310 is coupled to the input of a low pass filter 340 that preferably has a bandwidth of a 100 Hz or so to a few KHz or so, such that the output from filter 340 will be a low frequency signal proportional to $0.5 \cdot A \cos(\phi-\psi)$. This low frequency signal is now input to an integrator 330 whose output will be $\phi_x$ for pixel detector 240-$x$.

VPD 320 is driven by two signals that each have the same frequency as that emitted by optical emitter 220, albeit with a phase difference $(\phi-\psi)$. Note that if phase shift $\psi=\phi\pm90°$, the polarity of integrator 330 output will change. In the configuration shown in FIG. 4, phase shift $\psi_x=\phi_x\pm90°$ associated with the return signal detected by each pixel detector 240-$x$ is available from that pixel detector's integrator 330-$x$.

As noted, phase shift $\phi$ due to time-of-flight may be given by:

$$\phi=2\omega z/C=2\cdot(2\pi f)\cdot z/C$$

where C is speed of light 300,000 Km/sec. Thus, distance z from energy emitter 220 to a pixel detector 240-$x$ in array 230 is given by:

$$z=\phi C/2\pi\omega=\phi C/\{2\cdot(2\pi f)\}$$

Distance z is known modulo $2\pi C/(2\omega)=C/(2f)$. Using several different modulation frequencies such as $f_1, f_2, f_3$ permits determining distance z modulo $C/(2Af_1), C/(2Af_2), C/(2Af_3)$, etc., and further avoids, or at least reduces, aliasing. For example, microprocessor 260 can command generator 225 to output sinusoidal drive signals of chosen frequencies, e.g., $f_1$, $f_2, f_3$, etc. If $f_1, f_2, f_3$ are integers, e.g., I=integer, aliasing is reduced to the least common multiplier of $f_1, f_2, f_3$, denoted $LCM(f_1, f_2, f_3)$. If $f_1, f_2, f_3$ are not integers, they preferably are modeled as fractions expressible as $a_1/D, a_2/D, a_3/D$, where a; denotes integer I, and $D=GCD(a_1, a_2, a_3)$, where GCD denotes greatest common divisor. Distance z can then be determined modulo $LCM(a_1, a_2, a_3)/D$.

The closed-loop feedback circuit configuration of FIG. 4 reaches a stable point when the two input signals to each mixer 310 are 90° out of phase with respect to each other, e.g., at a chosen one of $\psi_x=\phi_x+90°$ or $\psi_x=\phi_x-90°$, depending upon circuit implementation. At the proper 90° out-of-phase steady-state, the output signal from each lowpass filter 340 will be, ideally, null. For example, should the output signal from a lowpass filter 340 signal go positive, then the output signal from the associated integrator 330 will add more phase shift to drive the lowpass filter output back towards a null state.

When the feedback system is at a stable state, the pixel detector electronics 250'-x in array 230 provide various phase angles $\psi_1, \psi_2, \ldots \psi_N$, where $\psi_x=\phi_x\pm90°$. The phase angles are preferably converted from analog format to digital format, for example using an analog/digital converter function associated with electronics 280. If desired, electronics 250'-x could mix signals having a constant phase value for all pixels. Advantageously microprocessor 260 can then execute software, e.g., stored or storable in memory 270 to calculate z-distances (and/or other information) using the above mathematical relationships. If desired, microprocessor 260 can also command generator 225 to output discrete frequencies, e.g., $f_1, f_2, f_3 \ldots$ to improve system performance by reducing or even eliminating aliasing errors.

Referring still to FIG. 4, various implementations may be used to generate phase angle $\psi=\pm90$. Assume that a given application requires acquisition of an image at a frame rate of 30 frames/second. In such application, it suffices to sample phase angle $\psi$ during A/D conversion with a sample rate of about 30 ms. This sample rate is commensurate with the relatively low bandwidth otherwise present within electronics 250'-x, as shown in FIG. 4. In practice, system 200 can provide z-distance resolution of about 1 cm and in practical applications, z-range will be within perhaps 100 m or less.

Although z-distance is determined from TOF information acquired from phase delay $\psi$, it is noted that the relative brightness of the signals returned from target object 20 can also provide useful information. The amplitude coefficient "A" on the return signal is a measure of relative brightness. While the feedback configuration of FIG. 4 seeks to achieve a minimum output signal from the lowpass filters 340, with slight alteration a maximum lowpass filter output signal could instead be used, the output signal then representing brightness coefficient A. Such a configuration could be implemented using a signal 90° out-of-phase with the output from VPD 320 to modulate another copy of the output of the low noise amplifier 300. The average amplitude of the thus-modulated signal would be proportional to coefficient A in the incoming detected return signal.

Various embodiments of the '496 invention will now be described, primarily with reference to FIGS. 9A-9C (category one), and FIG. 10 (category two). In the '496 invention, dedicated electronic mixers (such as were used in the earlier invention described herein in FIG. 4) are avoided, and instead quantum efficiency (QE) modulation techniques are used. These QE modulation techniques advantageously can accumulate detected signal charge, and are preferred over methods that attempt to directly measure high frequency, small magnitude detection photocurrent-generated signals.

Figure 5A:
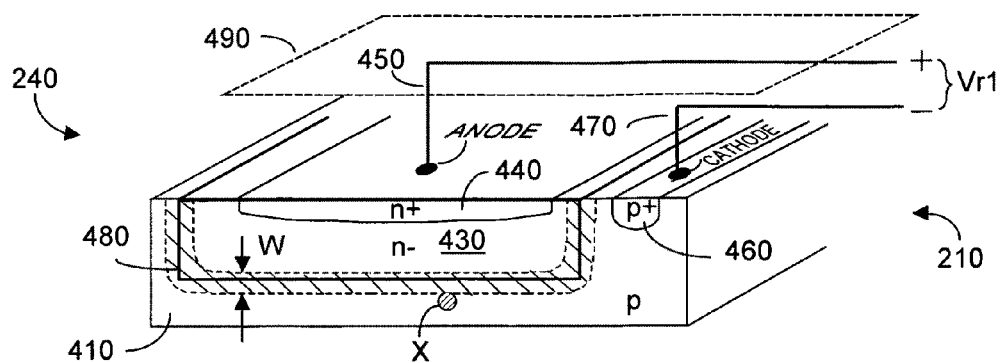
FIGS. 5A and 5B are cross-sectioned perspective views of a photodetector diode, showing reverse bias voltage modulation of depletion layer width to implement QE modulation, according to the '496 invention.
Figure 5B:
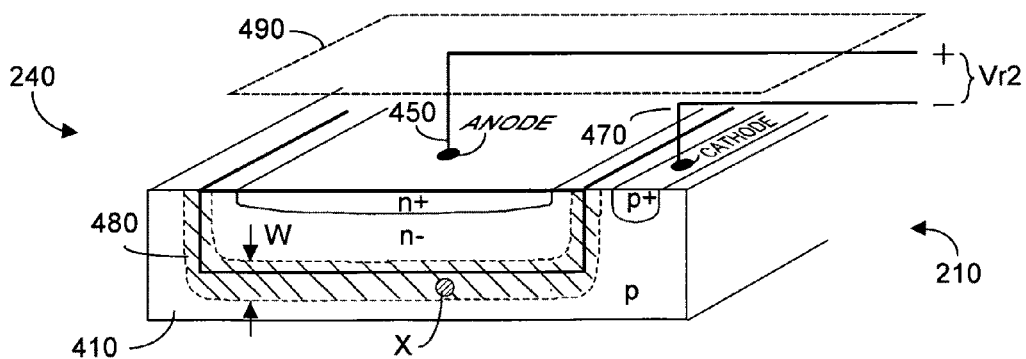

QE modulation using photodiodes and photogates will now be described, prior to categorizing QE modulation circuit topologies according to the '496 invention. Thus a brief description of MOS diode behavior and how MOS diode quantum efficiency can be varied by bias potential and/or photogate potential is now given. FIGS. 5A and 5B depict a portion of IC 210 and array 230, and depict a portion of a single photodiode detector 240, shown here fabricated on a p doped substrate 410. Photodiode 240 is shown with a depletion layer 420 having depth W, above which are found lightly doped and more heavily doped n regions 430 and 440. (The terms depletion layer and depletion region may be used interchangeably herein.) The n+ doped region 440 serves as the photodiode anode, the connection to which is shown as 450. A p+ doped region 460 formed at the upper region of substrate 420 serves as the photodiode cathode, connection to which is shown as 470. A depletion region 480 having depletion width W exists between n-well region 430 and p substrate region 410. (It is understood that doping polarities described herein may be inverted, and that structures may be fabricated on n substrate material rather than on the described p substrate material.)

The width W of depletion region 480 will vary or modulate with changes in reverse bias voltage coupled between the photodiode anode 450 and cathode 470. This bias potential is denoted Vr1 in FIG. 5A, and is denoted Vr2 in FIG. 5B. In FIGS. 5A and 5B, Vr2>Vr1, with the result that the width W of the depletion region increases.

Photons representing incoming optical energy, e.g., energy reflected from target object 20 perhaps, will fall upon photodiodes 240-x in array 230, e.g., see FIG. 3, among other figures. The photons can generate electron-hole pairs in the depletion region of these photodiodes and also in the quasi-neutral regions. These electron-hole pairs have a relatively long lifetime before recombining. Photons that generate electron-hole pairs in the depletion region advantageously have a much higher per photon photoelectric current contribution than photons that generate electron-hole pairs in the quasi-neutral regions of the substrate. This is because electron-hole pairs generated in the depletion region are quickly swept away by the electric field, and will strongly contribute to the resultant photocurrent. By contrast, electron-hole pairs generated in the quasi-neutral region remain there for some time and experience a greater probability of recombination without making substantial contribution to the photocurrent. It is seen that increasing the depletion region width W provides a larger region in which electron-hole pairs may be created and quickly swept away to contribute to the photocurrent, thus enhancing the quantum efficiency of the photodiode.

Those skilled in the relevant art will recognize that depletion width W may be expressed as:

$$W = [2\epsilon \cdot (\psi_0 + V_R - V_B)]^{0.5} \{[qN_A \cdot (1 + N_A/N_D)]^{-0.5} + [qN_D \cdot (1 + N_D/N_A)]^{-0.5}\}$$

where $(V_R - V_B)$ is the reverse bias of photodiode 240, $N_A$ and $N_d$ are respective doping concentrations for the diode n and p regions, and $\psi_0 = V_T \ln(N_A N_D / n_i^2)$, where $\epsilon$ is permittivity of the semiconductor material, e.g., about $1.05 \cdot 10^{-10}$ F/m for Si, $V_T = kT/q = 26$ mV, and $n_i = 1.5 \cdot 10^{10}$ cm$^{-3}$.

Quantum efficiency (QE) modulation according to embodiments of the present invention recognizes from the above equation that photodiode depletion width W can be modulated by varying the reverse bias coupled between the anode and cathode regions of the photodiode. This in turn permits varying the quantum efficiency (QE) of the photodiode, which can result in improved detection sensitivity. Table 1 depicts exemplary data for a discrete PIN photodiode exposed to a fixed level of illumination, and shows measured photodiode current as a function of reverse bias voltage coupled to the photodiode. Data for a CMOS-implemented photodiode may of course differ from what is shown in Table 1.

TABLE 1

| Reverse voltage (VDC) | Photodiode current (mA) |
| --- | --- |
| 0.2 | 0.09 |
| 0.5 | 0.38 |
| 1 | 0.83 |
| 2 | 1.4 |
| 3 | 1.51 |
| 4 | 1.62 |
| 5 | 1.7 |
| 6 | 1.66 |
| 7 | 1.76 |
| 8 | 1.8 |
| 10 | 1.8 |

Note in Table 1 that for the exemplary PIN photodiode, magnitude of the photodiode current (e.g., photocurrent) varies by a factor of four as the reverse bias is changed between 0.5 VDC and 2 VDC.

Modulating the photodiode reverse bias is a mechanism by which QE can be varied to improve detection sensitivity of photodiodes in an array. However, an even more efficient implementation of a QE modulation detector uses a photogate structure. In such embodiment, the photodiodes preferably are implemented as photogate MOS photodiodes whose QE is modulated by varying potential coupled to the gate of the photogate structure.

Figure 6A:
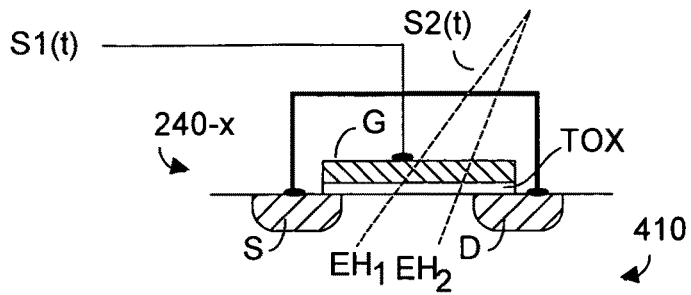
FIGS. 6A and 6B depict a photogate photodiode that may be QE modulated by varying gate voltage, according to the '496 invention.
Figure 6B:
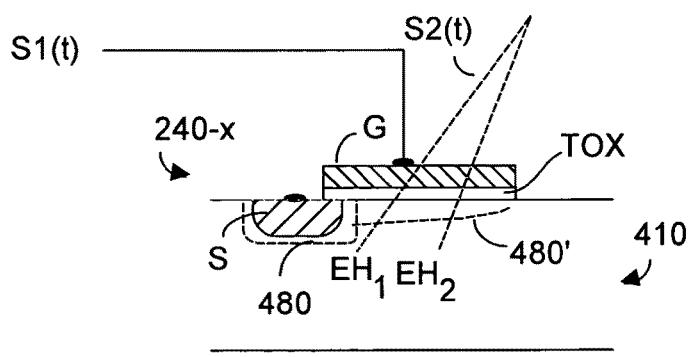

Referring now to FIGS. 6A and 6B, assume that substrate 410 is p-type material, and that MOS-type source and drain regions, respectively S and D, are formed with n-doped material, although as noted earlier doping polarity types could of course be reversed. Assume too that source S and drain D are connected together, as shown in FIG. 6A. When the voltage S1(t) coupled to gate G is high, device 240-x will deplete and then invert, again assuming an n-channel device. In this configuration, gate G and underlying thin oxide (TOX) are assumed substantially transparent to incoming photon energy S2(t). This condition may be met if the polysilicon material used to form gate G is not polycided.

Referring to FIGS. 6A and 6B, gate structure G is substantially transparent to incoming optical energy shown as S2(t). The structure shown in FIG. 6A includes both source and drain regions, denoted S and D. By contrast, the structure of FIG. 6B is formed without the drain structure, to improve quantum efficiency modulation. In FIG. 6A, since the source and drain regions are connected together, device 240x can operate without a drain region, as shown in FIG. 6B. Using MOS fabrication processes used to implement IC 70 (upon which the present invention may be implemented), the drain region may be omitted as shown in FIG. 6B. Omitting the drain region effectively increases relative variation in the device collection efficiency between the low sensitivity operating state and the high sensitivity operating state. As described below, changing bias of the optically transparent gate potential changes shape of the depletion layer: a layer 480 substantially confined about the source region is present when the gate bias is low, which depletion layer region 480' extends substantially under the gate region when the gate bias is high.

Photocharges, e.g., EH1, EH2, etc. are generated in the substrate under the gate region in response to photon energy S2(t). If no channel exists under the gate region, then most of the photocharges will be lost, and only the source and drain regions will collect photocharge. But if the region under the gate is inverted and/or depleted, then generated photocharges can be captured and swept into the source and drain regions. This effectively increases efficiency of the photon collecting structure 240-x. The increase in collection efficiency is roughly proportional to the ratio of area under gate G and the area of the source and drain regions, S and D. If photogate devices 240x are properly sized, this ratio can be 10:1 or greater. The increase in efficiency occurs abruptly, with the efficiency suddenly increasing when the voltage S1(t)

exceeds a threshold level. If the channel area is undoped and substrate doping is above $10^{17}$, the threshold will be about 0 V, such that the photogate photodetector 240x is in low sensitivity mode at a gate voltage of about −0.1 V and in a high sensitivity mode when the gate voltage is about +0.1 V. It will be appreciated that a relatively small change in gate voltage can bring about a substantial change in sensitivity of the device.

Figure 6C:
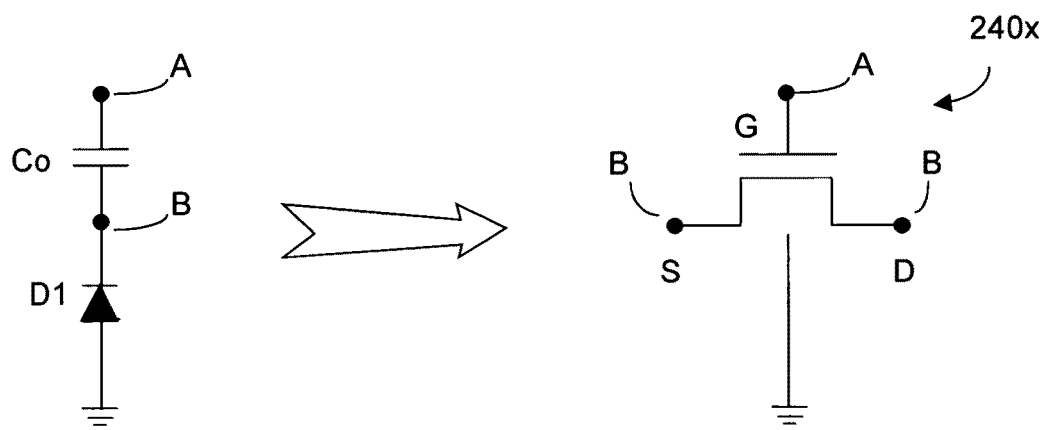
FIG. 6C depicts approximate equivalency between an MOS-type photodiode series-coupled to a capacitor, and a photogate photodiode such as shown in FIG. 6A, according to the '496 invention.

FIG. 6C depicts the approximate equivalency between a photogate photodiode 240X and a more conventional MOS photodiode D1 coupled to a capacitor $C_o$. Understandably, voltage levels for MOS photodiodes may differ from voltage levels for photogate photodiodes. Thus, it will be appreciated that the term photodiode or photodetector or pixel detector 240x may be understood to include a photogate photodiode such as described above with respect to FIGS. 6A-6C. Similarly, the various circuits and analyses for QE modulation described herein with respect to a more conventional MOS photodiode may also be understood to be practicable with a photogate photodiode 240x, such as described above. For ease of illustration, most of the embodiments herein are described with reference to a MOS-type photodiode detector rather than a photogate detector, however either type detector may be used.

Figure 7A:
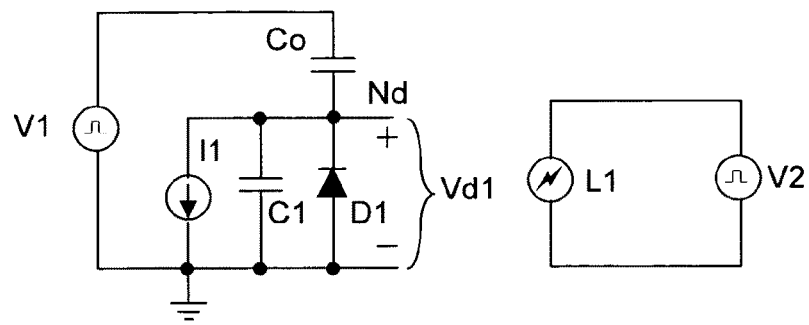
FIGS. 7A and 7B depict the equivalent circuit and voltage bias configurations for the exemplary photodiode of FIGS. 5A and 5B and show, respectively, high-side and low-side QE modulation, according to the '496 invention.
Figure 7B:
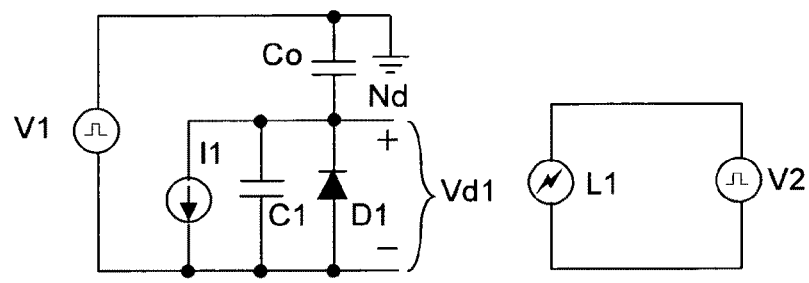

The concept of accumulation of charge will now be described. FIGS. 7A and 7B depict the equivalent circuit of a photodiode detector 240, which is denoted D1 and includes a parasitic shunt capacitor $C_1$. FIG. 7A may be referred to as depicting high-side QE modulation in that the modulation signal is coupled via capacitor $C_o$. In FIG. 7B, the modulation signal is coupled via capacitor C1 and the figure may be said to depict low side QE modulation. In FIG. 7B, capacitor Co is generally located within an amplifier (not shown) in the electronics associated with pixel detector D1.

In the right hand portion of FIG. 7A, an excitation source V2 is coupled to a light emitter L1, e.g., a laser diode or an LED, so as to cause L1 photoemission that is proportional to V2. In the left hand portion of FIG. 7A, photodiode D1 receives such photon energy from L1, and a photocurrent I1 is induced in response. It is understood that photodiode D1 (e.g., photodiodes 240-x in array 230) will be reverse biased, and bias source V1 will thus include a voltage offset. Alternatively, photodiode node $N_d$ can be pre-charged during initialization, before detection of an incoming signal. It will be appreciated that V2 in FIGS. 7A and 7B may be analogous to periodic waveform generator 225, and that L1 may be analogous to optical energy emitter 220 (see Fig. among other figures).

In FIGS. 7A and 7B, photodiode reverse bias voltage and hence the QE of the photodiode is modulated by bias source V1. In FIG. 7A, the reverse bias voltage is given by Vd1=V1·$(C_0)/(C_0+C_1)$, where $C_0$ is series-coupled between V1 and D1. From Table 1 and FIGS. 5A and 5B, a large magnitude V1 represents a larger reverse bias that can advantageously increase the width W of the photodiode depletion region. This in turn increases sensitivity of photodiode D1 (or 240), with the result that photodiode current I1 increases in response to incoming photon energy from L1 (or incoming photon energy reflected from a target object 20).

If excitation source $V_2$ and bias source $V_1$ operate at the same frequency ($\omega$), the total charge provided by current source $I_1$ per cycle is maximized when $V_1$ and $V_2$ are in phase, e.g., when magnitude of $V_1(\omega t)$ and $V_2(\omega t)$ are high simultaneously. This results because photodiode sensitivity will be maximum when incoming photon energy is at the highest magnitude, or brightest intensity. Conversely, if D1 sensitivity is minimal when the incoming photon energy is maximum, then the amount of charge sourced per cycle by is minimized.

The change in amount of charge $\Delta Q_N$ on photodiode node $N_d$ after a given number of cycles will be the amount of charge sourced by $I_1$ during those cycles. The change $\Delta Q_N$ can be determined by measuring the difference in voltage $\Delta V_D$ on node $N_d$ before and after capacitors $C_0$ and $C_1$ have been discharged by the photocurrent I1. Normally photocurrent $I_1$ is very small and difficult to measure directly. However its accumulated effect over a large number of cycles results in a measurable voltage change $\Delta V_D$.

If the photodiode anode and cathode terminals can each be set to an arbitrary voltage in FIG. 5B, then the upper lead of $C_0$ can be at ground potential, as shown in FIG. 7B. As described later with respect to several embodiments, typically node $N_d$ is coupled to an amplifier input that also has a shunt capacitor coupled to the same input node. An advantage of the configuration of FIG. 7B is that the parasitic shunt capacitance of the amplifier can be used as $C_1$ in lieu of an additional or dedicated shunt capacitor. So doing can reduce parts count and reduce the area required to implement the present invention on an IC chip. Furthermore, this configuration produces less noise and less susceptibility to variations in production technology.

The wavelength of optical energy falling upon a detector can influence the performance of the detector. When photon energy falls upon a photodiode, there is a time lag between arrival of the incoming photon energy and collection of freed electrons. This time lag increases substantially with optical energy wavelength, and can be on the order of a few ns for wavelengths of about 850 nm. According, optical energy emitter 225 may be selected to emit smaller wavelengths such that photodetectors 240-x in array 230 have more rapid response and may be QF modulated at higher frequency $\omega$.

Understandably, it is desired that photodetectors used in the various embodiments of the present invention detect not only efficiently, but rapidly as well. Use of a light emitter 220 to transmit optical energy of relatively shorter wavelength can promote detector efficiency, but such emitters are more expensive to fabricate than emitters that provide longer wavelength energy. For example a relatively inexpensive laser diode may be used as emitter 220 to transmit energy of perhaps 850 nm wavelength. While such an emitter is relatively inexpensive, the longer wavelength will penetrate more deeply into the structure of the pixel detectors, e.g., at least 7 µm, with resultant loss of quantum efficiency and slow response.

Figures 7C, 7D:
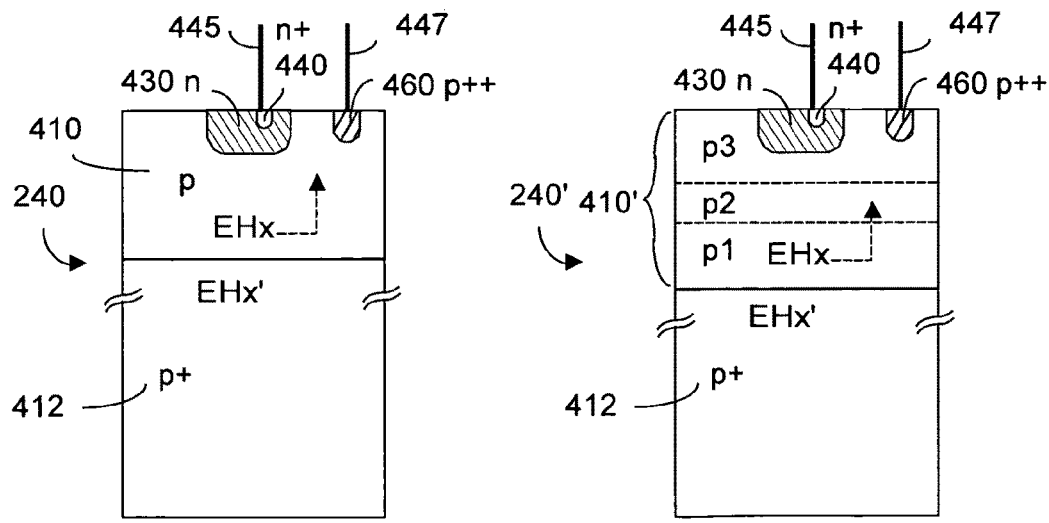
FIG. 7C is a cross-section of an exemplary photodetector structure illustrating how photon-energy created charges may be recovered using current, according to the '496 invention.
FIG. 7D is a cross-section of an exemplary photodetector structure showing smooth or discrete variation of epitaxial layer dopant concentration, illustrating how photon-energy created charges may be recovered using current, according to the '496 invention.

Referring now to the exemplary CMOS structure of FIG. 7C, quantum efficiency suffers because much of the incoming photon energy reflected by the target object 20 will create electron-hole pairs (EHx) deep within the epitaxial region 410 of the pixel photodetectors 240, and may also create electron-hole pairs EHx' more deeply in the structure, in region 412. Unfortunately, many of these deeply-freed electrons will be unable to reach the surface region of the photodiode detector where they can be collected and would thus contribute to the photodiode detection signal current. Further, use of longer wavelength energy also produces an undesired time delay before signal current is generated. The delay, typically a few ns, occurs because diffusion effects predominate over drift effects in collecting such deeply-freed electrons as may contribute to the detection photodiode current.

If somehow the electrons associated with EHx, EHx', were moved closer to surface region of the photodiode structure, then drift effects would predominate over diffusion effects, and the detection current would be seen sooner. Because doping of epitaxial layer 410 is very low, it is possible to move electrons created deep within the epitaxial layer using relatively small currents.

Referring to FIG. 7C, epitaxial layer 410 is typically on the order of 7 µm thick with a dopant concentration of about $N_A=10^{15}/cm^3$, and underlying heavily doped substrate region 412 is on the order of several hundred µm thick, and has a dopant concentration of about $N_A=10^{18}/cm^3$. Structures such as shown in FIG. 7C are readily available from many commercial vendors.

In FIG. 7C, an n-well region 430 and a p++ region 460 are defined in the epitaxial layer 410. N+ region 440 is formed with the n-well region 430. As described below, collection leads 445, 447 are provided to facilitate moving the deeply-free charges around and preferably in an upward direction for collection by n-well 430. (It is understood that the dopant polarities described could be reversed, e.g., an n-type substrate might instead be used, and that dopant levels and structure thicknesses may also be modified.)

What will now be described is a method by which charges associated with EHx may be moved upward to enable their eventual collection by n-well 430 due to diffusion current, once the charges are in sufficiently close proximity to the n-well. The goal is to urge deeply-freed electrons upward sufficiently slowly to be collected by lead 445 associated with the n-well, but not by lead 447 associated with the p++ region. While the method to be described can successfully collect electrons associated with electron-hole pairs EHx, the method cannot reach more deeply into the structure to also collect electrons associated with EHx'. Such movement is shown by the phantom right-angle line in FIG. 7C. To attempt to also recover the EHx' electrons would require an unacceptably large current due to the high dopant level associated with layer 412.

Consider now magnitude of electrical current required to move electrons according to the present invention. Assume that, when viewed from the top, the structure shown in FIG. 7C is a square of dimension 1 µm×1 µm, whose area is denoted $A_s$. For a 7 µm region 410 thickness, the resultant volume is $7 \cdot 10^{-12}/cm^3$. The requisite charge that must be removed from such a volume is $10^{15} \cdot 10^{-8} \cdot 7 \cdot 10^{-4} \cdot 1.6 \cdot 10^{-19} As = 1.12 \cdot 10^{-15} A_s$, where $1.6 \times 10^{-19}$ is the charge associated per electron. If the goal is remove this much charge within, say, 1 ns, then the required current is about 1.12 µA. While this current is not negligible, it is indeed feasible to provide this current for each square micron associated with photodetector array 230. For an array sized 1 mm×1 mm, modulated at 200 MHz, total current would be on the order of a 200 mA to move electrons upward 7 µm. It will be appreciated that the high dopant level associated with substrate region 412 precluded attempting to recover electrons from EHx' using this method.

Thus, one approach to somehow moving deeply-freed electrons from layer 410 upward for collection is to sweep substantially all holes downward by about 7 µm. Since electron and hole mobility are reasonably close, such freed electrons will be moved upward at least 7 µm and can come in sufficiently close proximity to n-well region 430 to be favorably influenced by the depletion region therein. The depletion region influence will promote collection of such deep-freed electrons higher in the structure.

By establishing a preferably pulsed current below n-well region 430, holes can be made to move downward by about 7 µm, while electrons will be made to move upward by at least the same distance due to their higher mobility. As noted, once the electrons come sufficiently close to be influenced by the electric field setup by the depletion region within the n-well region, the likelihood of collecting the electrons can be substantially enhanced.

In one embodiment, ohmic contact 460 is formed on the substrate outside n-well region 430 and is used to help bring electrons close to the depletion layer. This approach can work well in that the epitaxial layer 410 has a relatively low dopant concentration, and the magnitude of charge required to sweep electrons upward by about 7 µm is acceptable. Understandably there is no incentive to encourage upward movement of electrons by more than about 7 µm as there would be too many holes in the more heavily doped regions encountered at the upper levels of structure 210. Understandably, in lieu of forming an ohmic contact, an AC-coupled approach using a capacitor structure could instead be used.

A detector structure employed various types of epitaxial region doping gradients will now be described. FIG. 7D depicts a structure that may be similar to that of FIG. 7C, although the depth of structure 240' in FIG. 7D may be deeper than about 7 µm. In FIG. 7D, the epitaxial layer 410' preferably defines different dopant concentrations that range from a relatively high concentration (p1) to a lower concentration (p3). The dopant concentration transition may be a continuum, or may be more discrete, e.g., by forming separate epitaxial layers, each having an associated dopant concentration.

Those skilled in the art will recognize that there exists an electric field that is associated with each doping region boundary. For structure 240' in which dopant concentration is weaker nearer the upper surface of the structure, the direction of the electric field may be defined as being downward. Electrons in EHx' near the upper surface of region 412 will move upward through the interface existing between regions 412 and p1 due to the electric field at that interface. Since these electrons will not move downward through that interface, there is an excellent probability that they can be induced to quickly move upward (by diffusion effects) close to the next epitaxial doping interface (p1, p2), from whence they can again be induced to move into the next dopant region, here p2, due to the electric field existing at p1, p2. Once in that (less highly doped) epitaxial region (here, p2) the electrons again will no longer move downward through the p1,p2 interface, and have an excellent chance of moving upward to be influenced by the next epitaxial region (p3), from whence they can be induced to move into that region, and so forth.

Understandably the same above-described phenomenon works for electrons initially from pairs EHx that were initially freed somewhere in the epitaxial region. It is also understood that fewer or more than three dopant concentrations or regions may be defined within the epitaxial region.

Thus, a drift current phenomenon associated with the electric fields in the various p1, p2, p3, . . . interface or boundary regions comprising the epitaxial layer induces the electrons to move quickly upwards through each of the p1, p2, . . . interface regions.

As above-described, discretely doped epitaxial regions serve somewhat as "staging" or "holding" regions for electrons that have come sufficiently close to be moved into the region. However if a continuum of dopant gradient can be defined throughout the epitaxial region 410', there would be no "holding time" within a region (since separate epitaxial regions would not per se exist). The effect would be to more quickly capture and sweep upward freed electrons for collection by n-well 430.

The following section will now describe differential QE modulation, and the advantages that it can provide. Again, QE modulation including differential QE modulation may be practiced using convention MOS-type photodiode detectors and/or photogate detectors.

Referring again to FIGS. 5A and 5B, assume that incoming photon energy generates electron-hole pairs within the substrate of the photodiode shown, including an electron-hole pair $EH_1$ generated at an arbitrary location "X". In FIG. 5A, location X is in the quasi-neutral region and not in the depletion region (shown cross-hatched). In embodiments of the present invention, it is desired that modulation reduce QE at this point in time and discard as many electron-hole pairs as possible, including $EH_1$. If the photodiode QE is then immediately increased, e.g. by increasing photodiode reverse bias, the depletion region width W can increase to encompass location X (see FIG. 5B).

In FIG. 5B, $EH_1$ is still lingering at location X, which is now in the depletion region, and $EH_1$ will now contribute strongly to the photocurrent. On one hand, the increased depletion region in FIG. 5B can enhance photon detection sensitivity. But electron-hole pairs generated when photons arrive when QE should be low (FIG. 5A) can contribute to the total photodiode current when QE should be high (FIG. 5B), e.g., the contribution is at a different point in time. The undesired result is an inability to change the effective QE at high modulation rates. But what is desired is that only photons arriving at a high QE time should contribute to the photocurrent at any time.

It is desirable to achieve faster photodiode QE modulation by removing the above-described time lag effect. It is further desirable to remove common mode effects in the photodiode output signal resulting from ambient light and from so-called photodiode dark current. Overall, it will now be appreciated that QE modulation essentially modulates the size of the collection target for electrons within the photodiode structure. Absent another collection target, most electrons would eventually be collected by even a small target due to their relatively long lifetime. Thus, QE modulation in terms of change in numbers of electrons will be substantially smaller than the change in target area.

Various aspects of embodiments of the present invention will now be described that use differential QE modulation techniques in which the collection target size is increased and decreased, while the alternative adjacent target size is decreased and increased. The effect is to provide a larger alternate target to electrons or holes, while reducing the target area of the given photodiode. This enhances QE as the electrons will be collected by the alternative target and taken out of circulation for the reduced target, well before the end of their lifetime.

Figure 8A:
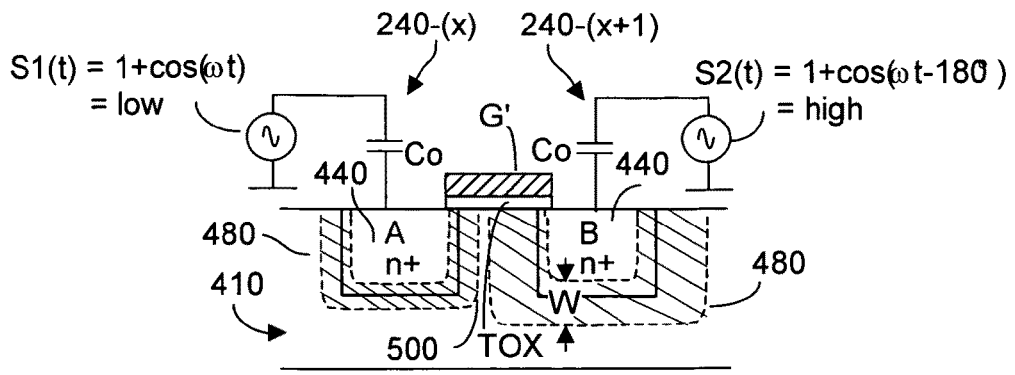
FIGS. 8A and 8B are side cross-sectional views of two adjacent photodiodes with a leakage-reducing gate QE modulated 180° out of phase, according to the '496 invention.
Figure 8B:
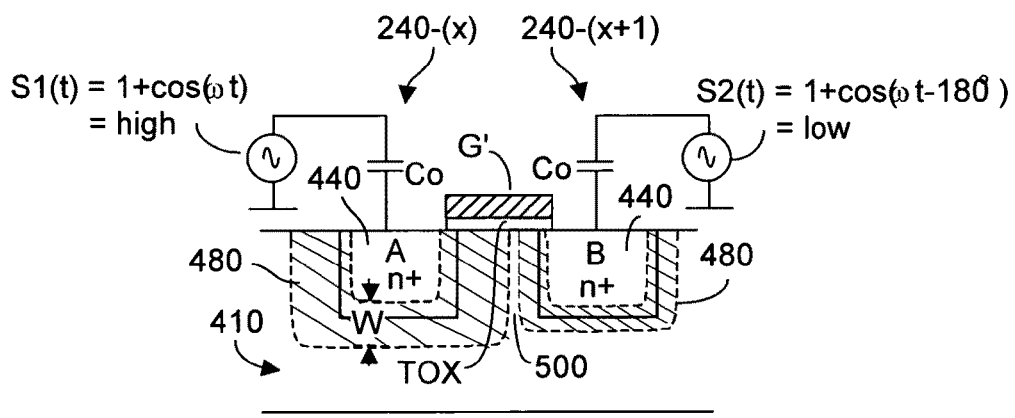

During QE modulation, the present invention recognizes that some regions within a photodiode, typically within the more lightly doped region of the junction, alternate between quasi-neutral and depletion regions. If these regions can be kept to a minimum, the photodiode can be more sharply QE modulated. Such enhanced QE modulation is promoted using a differential modulation approach, as will be described later herein with respect to FIGS. 8A and 8B. FIGS. 8A and 8B represent "snapshots" in time of two adjacent photodiodes, denoted A and B, 180° apart. Preferably within array 230, adjacent photodiodes A and B are sufficiently close together and small in surface area such that each receives substantially the same amount of incoming photon energy at any given time. Photodiodes groups or banks A and B are bias-modulated such that their respective QE are 180° out of phase, i.e., QE of photodiode A reaches a maximum when the QE of photodiode B is at a minimum, and vice versa.

Note in FIGS. 8A and 8B that the quasi-neutral region 500 between adjacent photodiodes A and B is always quite small, and hence the number of electron-hole pairs created therein will be quite small. This is advantageous since it is the quasi-neutral region near the depletion region that reduces QE modulation. In FIG. 8B, electron-hole pairs in quasi-neutral region 500 between diodes photodiodes A and B may be swept into the photocurrent for adjacent photodiode B when QE for photodiode B is increased. Because quasi-neutral region 500 is small, degradation of QE modulation due to region 500 will advantageously be small.

Assume in FIGS. 8A and 8B that at a given time photodiodes A and B are reverse biased at 0 VDC and 2 VDC, respectively. As an example, if A and B are fabricated with reasonable CMOS 0.25 µm processes, photodiode B typically will measurably convert up to 30% more photon energy than photodiode A. The QE of photodiode A goes up rapidly from 0 VDC with small increases in reverse bias, whereas the QE of photodiode B reverse biased at say 1 VDC will be almost unaffected by a small change in reverse bias. Thus, it is advantageous for maximum QE modulation that reverse bias of photodiode A be as low as possible. This bias regime corresponds to a MOS transistor whose channel is formed in the quasi-neutral region 500 between photodiodes A and B. The MOS transistor gate structure is non-existent but may be assumed to be present at some voltage in sub-threshold regions with a high source-drain voltage.

During the time frame shown in FIG. 8A, photodiode A is weakly reverse biased. As a result, substantial leakage current can exist between photodiodes A and B, which would correspond to sub-threshold leakage of a MOS transistor whose source is photodiode A and whose drain is photodiode B in FIGS. 8A and 8B. Such leakage current may be reduced by forming a polysilicon gate G', assumed transparent to optical energy of interest, at least over the region between photodiodes A and B, with an insulating layer of thin oxide (TOX) beneath gate G'. If such a gate is fabricated, sub-threshold leakage current can be controlled by controlling the gate voltage. For example, each 0.1 mV of gate voltage corresponds to a ten-fold change in leakage current. For an undoped channel, a gate voltage of about −0.4 VDC is typically sufficient to substantially reduce leakage current.

Figure 8C:
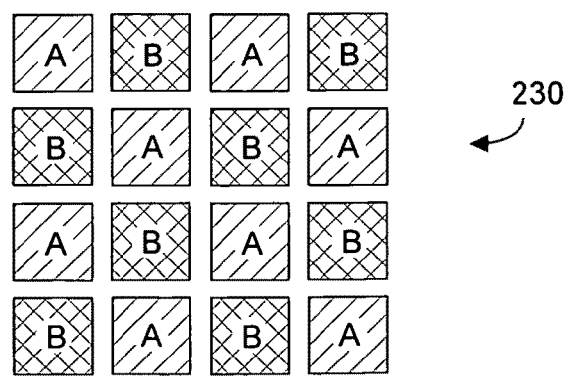
FIG. 8C is a top view of an array of photodiodes wherein alternating photodiodes are coupled in parallel are QE modulated complementary to the remaining parallel-coupled photodiodes, according to the '496 invention.

FIG. 8C is a top view of a portion of array 230 depicting rows and columns of photodiodes, here labeled as either photodiodes A or photodiodes B. As suggested by the different cross-hatching, all photodiodes A are coupled together in parallel, and all photodiodes B are coupled together in parallel. Essentially, FIG. 8C may be seen as a top view of one large photodiode A and one large photodiode B. In a differential QE mode of the present invention, all photodiodes A can be modulated with a phase 180° from the signal that modulates all photodiodes B. Both classes of photodiodes, e.g. A and B, will have their respective QE sharply modulated because only a very small quasi-neutral region will exist between them. It is substantially only the quasi-neutral region at the bottom region of each photodiode that causes significant smearing of the QE modulation at high modulation frequencies.

Having presented an overview of concepts underlying QE modulation, various configurations of systems employing such techniques will now be described. In a first category of embodiments, the present invention uses variable phase delay (VPD) techniques in which dedicated electronic mixers (e.g., Gilbert cells) mixers are replaced by QE modulation. System topography depicting the first category is found primarily in FIGS. 9A-9C. A second category provides embodiments that mix with fixed phase delays using QE modulation, and implements a variety of spatial and temporal multiplexing approaches. System topography depicting the second category is found primarily in FIGS. 10A-10C.

Advantageously, either category of embodiments can modulate QE of MOS-implemented photodiodes by changing photodiode reverse bias, or by providing MOS-implemented photodiodes with a photogate, and then changing the gate voltage. Single-ended or double-ended differential signal processing may be employed with both methods. Differential QE modulation advantageously allows faster QE modulation, and provides a differential output that substantially removes common mode effects due to ambient light and photodiode dark current. Both categories can advantageously accumulate photodetector signal charge on a photodiode capacitor. In the category two approach, the charge is examined periodically when QE modulation is stopped. Such signal accumulation approaches are preferred over methods that seek to directly measure a high frequency small magnitude photocurrent.

FIGS. 9A-9C will now be described with respect to various variable phase delay (VPD) QE modulation embodiments of the present invention, so-called category one embodiments. Using VPD techniques, photocurrent from each QE-modulated pixel photodiode (or photogate photodiode) is coupled as input to an associated relatively high input impedance amplifier that need not exhibit high bandwidth, high frequency response, or high closed-loop gain. The amplifier output feeds directly to a low pass filter (LPF) whose output drives an integrator. The integrator output is coupled as to control phase of the variable phase delay (VPD) that controls QE modulation signals that drive the photodetector diodes. The VPD is also driven by a signal from the periodic signal generator that controls the optical energy emitter. There may or may not be a DC offset associated with the output signal from the pixel photodiode detectors and with the homodyne drive signal. Assuming no offsets, at steady-state the LPF output will be zero. Assuming appropriate DC offsets, at steady-state the LPF output will be minima or maxima. This method may be implemented single-ended, or preferably double-ended using a complementary approach in which positive and negative signals are derived from photodiodes that are QE modulated out of phase.

For ease of illustration, explicit biasing of photodiode (or photogate) detectors is not shown. Those skilled in the art will recognize that providing biasing may be as simple as coupling a resistor from a reference source to a node on the various photodetectors for single-ended and for differential mode QE modulation. More preferably, in the case of differential QE modulation, feedback would be provided to a common mode biasing reference to ensure that the sum of the two signals being compared remains within a desired dynamic range.

Referring now to FIG. 9A, a category one variable phase delay (VPD) embodiment will be described. FIG. 9A depicts a portion of IC 210, array 230, pixel detectors 240-1 through 240-x, and each diode's associated exemplary electronics 250'-1 through 250'-x. Elements in FIG. 9A that bear like reference numerals to elements in earlier figures herein may, but need not be, identical. For example, or variable phase delay unit 329 or filter 340 in FIG. 9A may be identical to the same components in FIG. 4. Each pixel diode 250-x in FIG. 9A has an associated electronic circuit, denoted 250-x (as contrasted with the notation 250'-x for FIG. 4). Again for ease of illustration, only two out of perhaps many thousands of pixel diodes 240 and associated electronic circuits 250 are depicted. Again, if desired a dedicated A/D converter can be provided as part of each electronics circuit 250-1 through 250-x, as opposed to implementing an omnibus A/D function on IC chip 210.

Comparing the configuration of FIG. 4 with that shown in FIG. 9A, it is seen that whereas FIG. 4 provided each pixel diode with a dedicated electronic mixer 310, no such separate or explicit mixers are included in electronics 250-x in FIG. 9A. Instead, according to embodiments of the present invention, the configuration of FIG. 9A uses QE modulation to derive phase difference between transmitted and received signals, and to derive TOF, among other data. FIG. 9A and other QE modulation embodiments described herein advantageously avoid mixers and their need for a sufficiently amplified signal to be input for mixing.

In FIG. 9A, the detected waveform signal photodiodes 240-x in array 230 will include a DC-offset of the form $1+A\cdot\cos(\omega t+\phi)$, such as shown in FIG. 3B. The $1+A\cdot\cos(\omega t+\phi)$ signal will preferably have a minimum value of 0 VDC and a maximum value of perhaps +3 VDC.

In FIG. 9A the output signal from variable phase delay (VPD) 320 is coupled via capacitor $C_o$ to node $N_d$ of the associated photodiode 240-x, for each electronics system 250-x in array 230. When $C_0$-coupled modulation signal is in phase with the detected light energy, e.g., $S_2=A\cdot\cos(\omega t+\phi)$ the signal developed across amplifier 400's input impedance $R_i$ will be maximum. $R_i$ is large, e.g., >1 GΩ, and the signal voltage across $R_i$ will build-up in magnitude slowly over a large number of cycles of the periodic signal $\cos(\omega t)$. The feedback path within each electronics 250-x includes low pass filter 340 and integrator 330, and the resultant feedback seeks to minimize magnitude of amplifier 400 input, e.g., the voltage across $R_i$. Minimal amplitude across $R_i$ occurs when signal $S_2=A\cdot\cos(\omega t+\phi)$ received by the photodiode 240-x is 180° degrees out of phase with the modulating signal $\cos(\omega t+\psi)$. As shown in FIG. 5, for each electronics 250-x, a resultant phase value $\psi_x$ can be read-out as a voltage signal at the output of each integrator 330.

Thus electronics 250-x in FIG. 9A functions somewhat similarly to electronics 250'-x in FIG. 4 to examine incoming periodic photon energy signals, and to produce a phase output signal from which distance z from the system to a target object 20 may be measured. In FIG. 9A, each amplifier output is passed directly to the input of low pass filter 340, and thus a high frequency response for amplifiers 400 is unnecessary. Moreover, the voltage signal across each amplifier input impedance $R_i$ is allowed to build-up over a large number of periodic cycles. Thus, the final signal to be detected will be relatively large, e.g., preferably many mV or tens of mV. As a result, unlike amplifiers 300 in FIG. 4, in the embodiment of FIG. 9A, amplifiers 400 need not be very high gain, very low noise, high frequency devices. As a result, amplifiers 400 can be implemented in less IC chip area and will consume less current, yet can help provide better z-distance resolution than the more complicated configuration of FIG. 4.

Turning now to FIG. 9B, an additional category one VPD embodiment is depicted. In FIG. 9B, complementary, 180° out of phase, outputs from VPD 320 are employed, in which one VPD output is coupled via a capacitor $C_o$ to an associated photodiode D or 240-x. The complementary VPD output is coupled via a similar capacitor $C_{1o}$ to a similar photodiode, here denoted. Thus, photodiode 240-x is QE modulated by one VPD output, whereas diode D' is QE modulated 180° out of phase by the other VPD output. Since photodiodes 240-x and D' each discharge, there will be a common mode signal requiring that reverse bias voltages to each photodiode be refreshed periodically to a predetermined level. Further, the configuration of FIG. 9B uses differential inputs to amplifiers 400', the effects of ambient light falling upon photodiodes 240-x in array 230 are minimal. An additional advantage provided by the configuration of FIG. 9B is that photodiodes 240-x and associated photodiodes D' can be implemented with a differential structure that enables rapidly modulating QE for the diodes sets without significant lag. Thus, for each photodiode 240-x in array 230, a photodiode D' having substantially identically characteristics will be coupled to the inverting input (in the configuration of FIG. 9B) of each amplifier 400'.

Turning now to FIG. 9C, a VPD QE modulation embodiment employing differential comparators and digital integrators is shown. Thus, amplifiers 400' and typically analog integrators 330 of FIG. 7B are replaced with differential comparators 510, and with digital integrators 520. At regular intervals, microcontroller 260 (see FIG. 3) will command energy emitter 220 to halt emission, or to shut down, and both outputs of VPD 320 will be set to a constant voltage. Each differential comparator 510 then compares the differential signals presented to its input nodes. Each digital integrator 520 then reads the result (C) of this comparison, and increments its digital output by a small amount if C=1 and reduces its output by a small amount if C=0. If desired, low pass filters 340 may be eliminated (or their design specifications greatly reduced), and comparators 510 can be shut down when the photodiodes are being modulated, during which times voltage comparisons are not required.

So-called category two embodiments employing fixed phase delay (FPD) QE modulation will now be described primarily with reference to FIG. 10. In category two embodiments, fixed phase signals are used to QE modulate each photodetector. Different groups or banks of photodiode detectors may be defined in a non-localized manner within the array. For example, a first bank of photodiode detectors may be QE modulated with fixed 0° phase shift, a second bank may be QE modulated with fixed 90° phase, shift, a third bank with fixed 180° phase shift, and a fourth bank with fixed 270° phase shift. Within each pixel, there are photodiode detectors that correspond to every one of the four banks. Phase information and target object brightness information can be determined by examining output values for each bank within a pixel. This fixed delay approach simplifies the electronic circuitry associated with each pixel, reduces power consumption, can reduce IC chip area requirement, and enables a range of techniques for temporal and spatial multiplexing including so-called tessellation.

Various aspects of category two QE modulation will be described including spatial and temporal multiplexing, which multiplexing may be single-ended or differential, as well as none one-to-one mapping between physical photodetectors and pixels. Further, category two embodiments can employ an inductor to reduce power consumption by tuning-out or compensating for capacitive losses.

Category two FPD QE modulation will now be described with reference to FIG. 10. An advantage of this configuration is that electronics 250-x can be somewhat simplified and, as in other QE modulation embodiments, a brightness measurement can be output. In FIG. 10, photodiodes 240-x in array 230 are modulated with a fixed phase modulator 530 whose output is selectable, e.g., by microcontroller 260 (see FIG. 3) to be 0° phase or 90° phase. Software that may be included within memory 270 preferably corrects for the (fixed) modulation phase differences between photodiode pixels. The modulating signal and its complement may be provided to pixel array 230, or the complement may be regenerated within each pixel electronics 250-x by including a 180° delay unit 540 coupled to the single output of a fixed phase delay unit 530.

Figure 10:
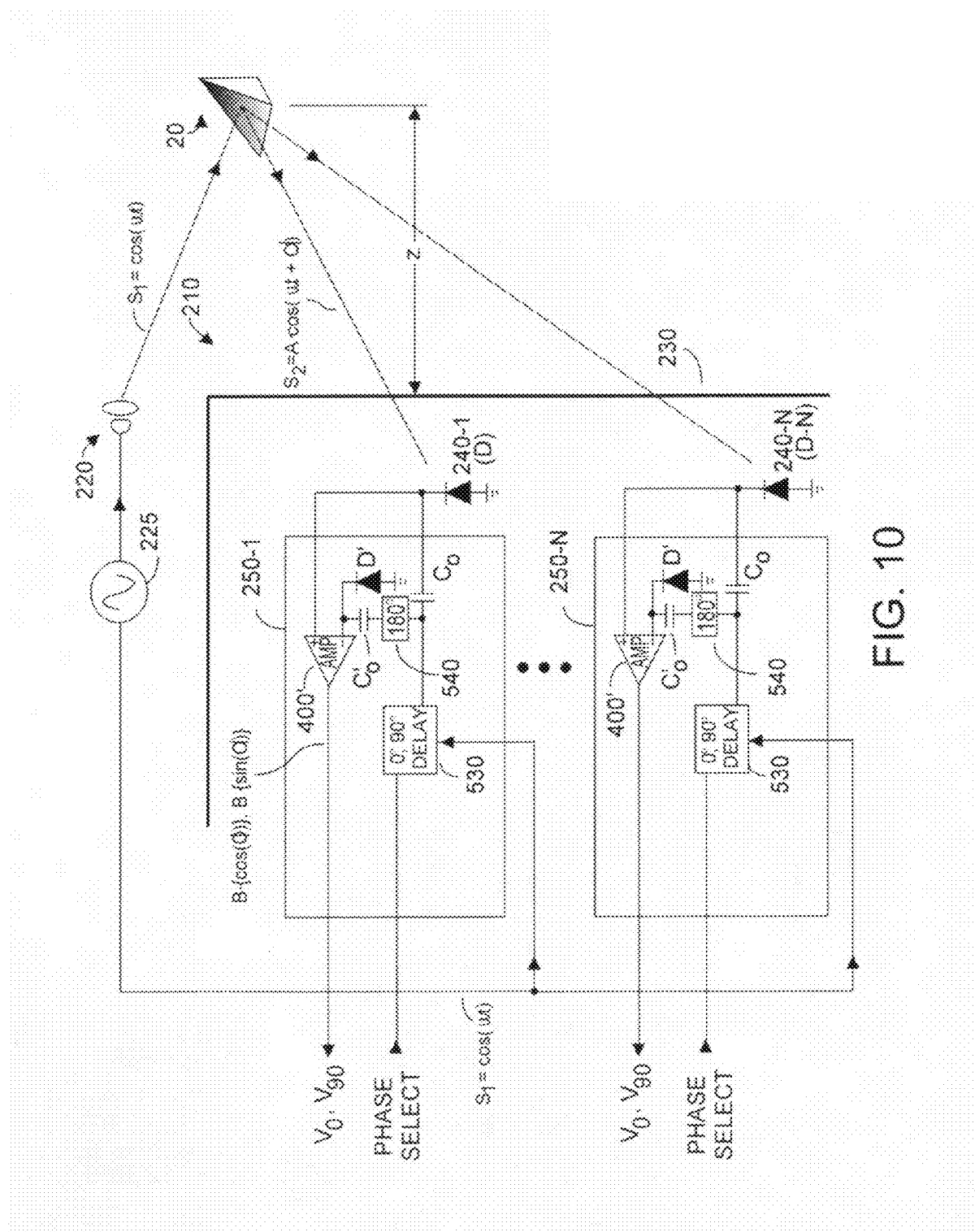
FIG. 10 is a block diagram showing two individual pixel detectors with their associated electronics in which selectable FPD QE modulation of the photodiodes is used, according to the '496 invention.

In FIG. 10, system 200 (see FIG. 3) is permitted to operate for a large number of cycles (where core frequency is ω/2p), after which the laser or other photon energy emitter 220 is shut down. When emitter 220 is shut down, the diode modulating voltage signal and its complementary signal are set to a fixed magnitude. Assuming that QE modulation is somewhat linear, the result of multiplying the photodiode (D) signal (B{cos(ωt+φ)+1}) with the modulating signal (cos(ωt)+1)) and then integrating is B(0.5{cos(φ)}+1). The result of multiplying the photodiode (D') signal (B{cos(ωt+φ)+1}) with the modulating signal) (cos(ωt+180°)+1)) is B(−0.5{cos(φ)}+1). Subtracting the two expressions will then yield at the output of differential amplifier 400' the signal $V_0$=B·cos(φ), where B is a brightness coefficient. A new measurement is then carried out with the modulation phase 90° apart from the original modulating signal. The result at the output of amplifier 400' will then be $V_{90}$=B·sin(ω). From the 0° and 90° measurements, angle ω can be obtained from:

$$\tan(\omega) = V_{90}/V_0.$$

The brightness B can be obtained from $$B = \sqrt{V_0^2 + V_{90}^2}$$

Advantageously, and in contrast to the embodiments described earlier herein, the configuration of FIG. 10 does not require an integrator within each electronics 240-x, thereby simplifying the system design.

A further advantage of the configuration of FIG. 10 is that impedance-matching inductors may be employed to reduce system operating power. For example, assume each photodiode 240-x is about 15 μm square and has capacitance (C) of about 10 FF. Assume too that the modulating frequency f, where f=ω/(2π), is about 1 GHz, and that system 200 is operated from a 3 VDC power source (V), for example a battery supply. Power consumption per photodiode pixel will be proportional to C·V²φf and will be about 8 μW. For an array 230 comprising 200 pixels×200 pixels, power consumption will be about 0.32 W.

Figure 11A:
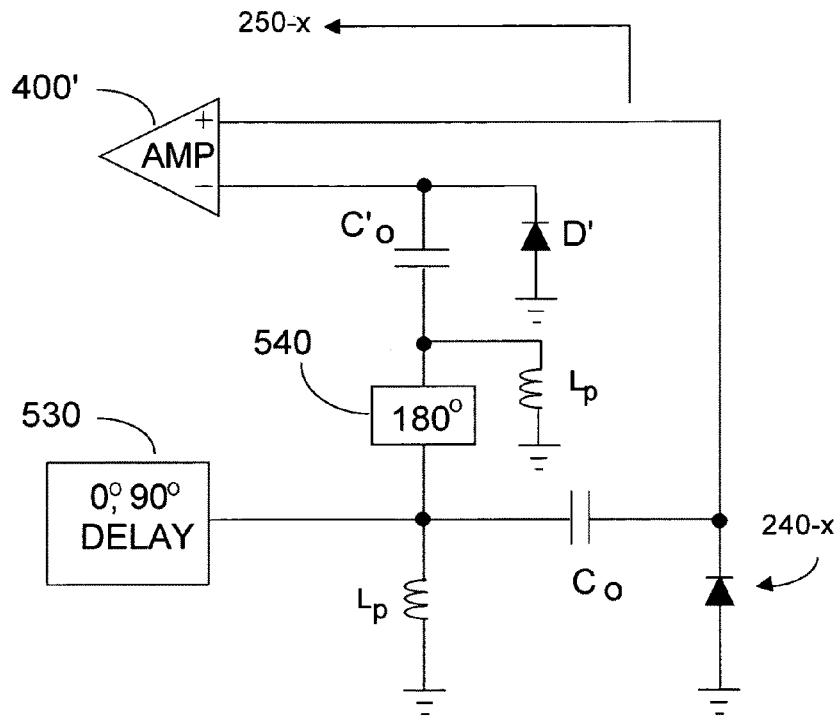
FIGS. 11A and 11B depict use of tuned inductors with photodiodes in the configuration of FIG. 10, to reduce power consumption, according to the '496 invention.

Since power consumption is directly proportional to capacitance C, power consumption can be reduced by decreasing the effective capacitance. This desired result is achieved by coupling a tuned inductor ($L_p$) in parallel with the capacitance of the photodiodes. However if tuned inductors $L_p$ were placed inside each pixel as shown in FIG. 11A, to resonate at 1 GHz, each inductor $L_p$ would be on the order of 100 μH, far too large a value to implement within each pixel photodiode.

Figure 11B:
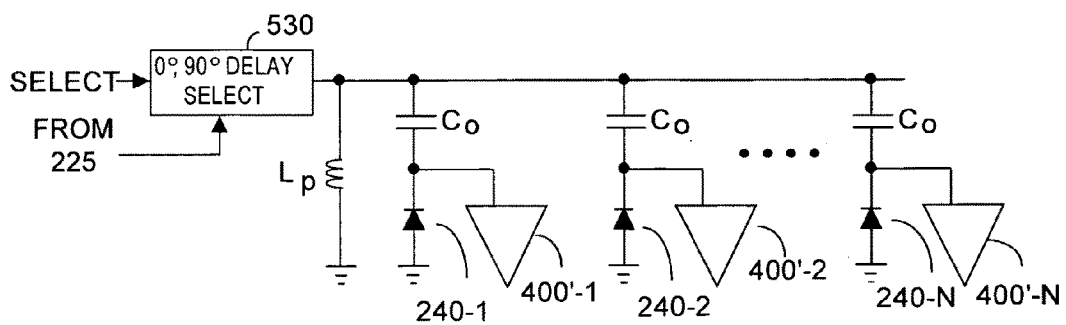

In contrast to the VPD QE modulation embodiment of FIG. 9C, in the embodiment of FIG. 10, all pixels are modulated using a common modulation signal for each parallel-coupled bank of photodiodes, akin to photodiodes A and B in FIG. 8C. An advantage of this configuration is that all photodiodes in a bank of parallel-coupled photodiodes be driven in parallel. The various parasitic shunt capacitances for each parallel-coupled photodiode are themselves coupled in parallel. The result is that one (or relatively few) inductors need be parallel-coupled to all photodiodes in a parallel-bank to achieve resonance at the desired frequency. In the above example of a 200×200 array, 100 μH would be required for each pixel photodiode. Use of parallel-coupling, say 200×200 photodiodes, lowers the value of $L_p$ to 100 μH/(200×200) or 0.25 nH, a very realistic magnitude of inductance to fabricate. Further, array sizes may indeed be larger than 200×200, in which case the overall capacitance of a greater number of photodiodes increases, which further reduces the magnitude of the single inductor $L_p$ required to resonate at the desired QE modulation frequency. Such inductance may be fabricated on IC chip 210 or even mounted off-chip. For the above example, a single inductor $L_p$ in FIG. 11B on the order of 0.25 nH would tune-out the effective capacitance of the 200×200 photodiodes that are parallel-coupled, whereas in FIG. 11A, each photodiode would require a separate inductor of substantially greater inductance.

The FPD (category two) configuration of FIG. 10 is intended to be exemplary. In practice, various so-called spatial multiplexing and temporal multiplexing techniques may be employed. Spatial topology can be used to refer to different groups or banks of photodetectors within the array that can be modulated group-wise with a fixed phase. Spatial topology, of which QE differential modulation is one example, can enhance collection of photon-energy released charges within the photodetectors, and thus can enhance signal detection. Temporal topology refers to modulating the same bank of photodetectors with different fixed modulation phases at different times. Some spatial topologies permit spatial multiplexing, which can include the sharing of photodetectors across multiple pixels, e.g., the re-using of a same photodetector in different pixels. Temporal topology can give rise to multiplexing in time, which can promote pipelining. Various embodiments of the present invention can implement any or all of the aspects, with various pixel bank topologies, and with various time-phase topologies.

The spatial multiplexing technique embodied in FIG. 8D is what is shown in the exemplary of configuration of FIG. 10, in which the photodetector topology was that of FIG. 8C, and in which a 0°-180°, 90°-270° time scheme was used. Further, the exemplary configuration of FIG. 10 may also be used to support spatial-multiplexing of the photodiodes, as well as time-multiplexing or pipelining.

Figure 12A:
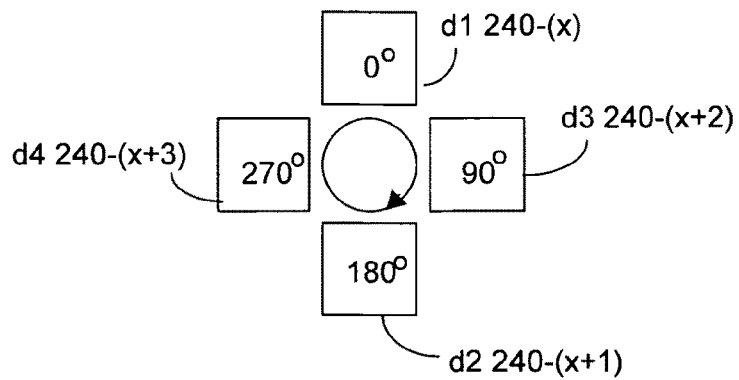
FIG. 12A is a plan view of a 0°-90°-180°-270° spatial-multiplexing QE modulation embodiment, showing four adjacent photodetectors according to the '496 invention.

A different spatial topology embodiment of embodiments of the present invention will now be described with reference to FIG. 12A. The spatial-multiplexing embodiment of FIG. 12A operates in principle similarly to the time-division multiplexing embodiment of FIG. 10. The difference, however, is that measurements are now obtained simultaneously at time $\tau_1$, for example using four photodetectors $d_1$ or 240-($x$), $d_2$ or 240-($x$+1), $d_3$ or 240-($x$+2), and $d_4$ or 240-($x$+3), shown in plan view in FIG. 12A.

As before, $\Delta V_d = [\Delta V_{d1}(\tau_1) - )V_{d2}(\tau_1)]/[\Delta V_{d3}(\tau_1) - \Delta V_{d4}(\tau_1)] = \tan(\phi)$.

Figure 12B:
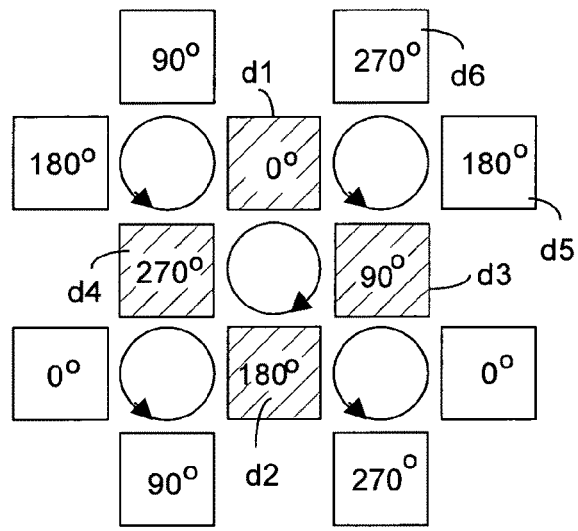
FIG. 12B depicts sharing of photodetectors across different pixels for the spatial-multiplexing QE modulation embodiment of FIG. 12A, according to the '496 invention.

Turning now to FIG. 12B, it will be appreciated that photodetectors may be shared across the detector array. In FIG. 12B, the four detectors shown in FIG. 12A are depicted with cross-hatching so that their dual-role can be seen. For example, d1-d2-d3-d4 may be said to form a cluster of four pixel or photodetectors, e.g., in array 230. However, pixels d1 and d3 are also members of a cluster comprising pixels d1, d5, d3, d6, and so on. Note that while individual photodetectors can play multiple roles in different clusters, no additional IC chip area is required to implement the spatially-multiplexed embodiment shown, thus promoting efficient use of IC chip area. If desired, additional data measurements are obtained by reusing partial measurements in space.

If desired, a 0°-120°-240° time-division QE modulation embodiment may be carried out, although this may not be the most efficient embodiment. In such embodiment two measurements taken from the array of pixels shown in FIG. 8C at time frames $\tau_1$ and $\tau_2$ are used. For the first measurement at time $\tau_1$, a photodetector bank (bank A) comprising photodetectors A is enabled with an S1($t$) sinusoidal waveform at 0° phase, while adjacent photodetector bank (bank B) comprising photodetectors B is de-phased 120° by S2($t$). For the second measurement at time $\tau_2$, bank B is de-phased 120° and bank A is de-phased 240°. The total phase difference is derived as follows:

$\Delta V_d = [\Delta V_{d2}(\tau_2) - \Delta V_{d1}(\tau_2)]/)V_{d1}(\tau_1)$, where at time $\tau_1$ $\Delta V_{d1} = A[1 + \cos(\omega t)]\cos(\omega t + \phi)$ $\Delta V_{d1} = A\cos(\omega t + \phi) + 0.5A\{\cos(\phi) + \cos(2\omega t + \phi)\}$ and at time $\tau_2$ $\Delta V_{d1} = A[1\cos(\omega t - 120°)]\cos(\omega t\phi)$ $\Delta V_{d1} = A\cos(\omega t + \phi) + 0.5A[\cos(\phi + 120°) + \cos(2\omega t + \phi - 120°)]$ $\Delta V_{d2} = A[1 + \cos(\omega t - 240°)]\cos(\omega t + \phi)$ $\Delta V_{d2} = A\cos(\omega t + \phi) + 0.5A[\cos(\phi - 120°) + \cos(2\omega t + \phi + 120°)]$ hence, after filtering $\Delta V_d = [\cos(\phi - 120°) - \cos(\phi + 120°)]\cos(\phi)$ $\Delta V_d = 2\sin(\phi)\sin(120°)/\cos(\phi)$ $\Delta V_d = K_1 \sin(\phi)/\cos(\phi)$ $\Delta V_d = K_1 \tan(\phi)$, where $K^1 = 3^{0.5}$.

Figure 12C:
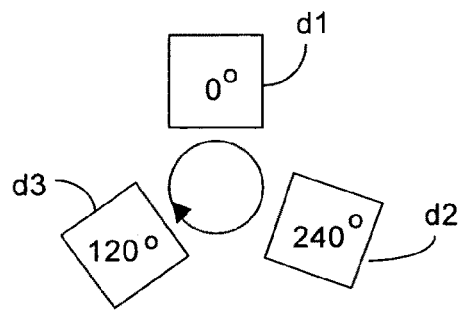
FIG. 12C depicts a 0°-120°-240° spatial-division multiplexing QE modulation embodiment showing three photodetectors, according to the '496 invention.

Referring now to FIG. 12C, a 0°-120°-240° modulation (spatial-multiplexing) embodiment is shown. This spatial-multiplex embodiment is similar to the above-described 0°-120°-240° time-division multiplex embodiment except that measurements are obtained simultaneously at time $\tau_1$ using three detectors $d_1$, $d_2$, and $d_3$.

As above, $\Delta V_2 = [\Delta V_{d3}(\tau_1) - \Delta V_{d2}(\tau_1)]/\Delta V_{d1}(\tau_1) = K_1 \tan(\phi)$, where $K_1 = 3^{0.5}$.

It will be appreciated from what has been described with respect to FIG. 12B, that photodetectors in FIG. 12C may be shared across the detector array.

Referring back to FIG. 8C, it will be appreciate that each photodetector in a bank A can be shared across four pixels, e.g., top and bottom, left and right. For example, in the second row of photodetectors, the first detector A may be associated with each of the four adjacent detectors B.

Figure 13A:
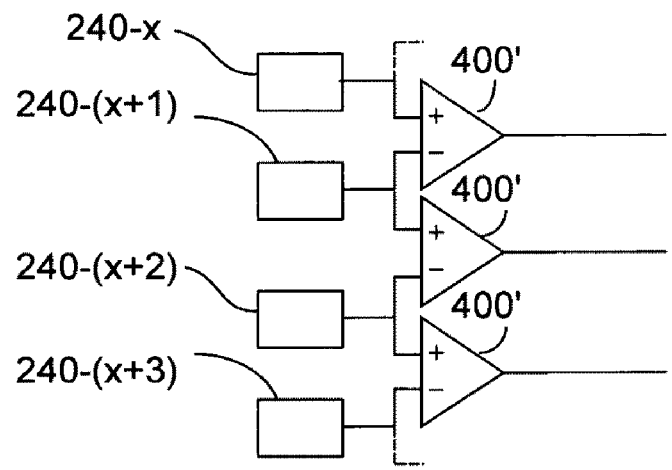
FIGS. 13A and 13B depict differential and single-ended signal processing of photodetector output, according to the '496 invention.
Figure 13B:
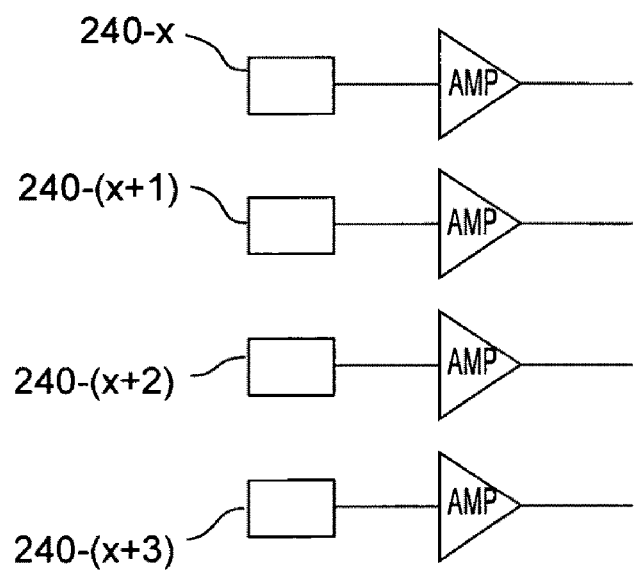

It will be appreciated that to facilitate spatial multiplexing according to embodiments of the present invention, it can be advantageous to obtain raw data single-endedly from each photodetector, rather than obtain differential data. QE modulation is preferably still carried out differentially, i.e., with multiple banks of detectors modulated with different phases. Such single-ended raw data can be preferable in that greater flexibility can exist in signal processing the data, e.g., adding or subtracting data from adjacent photodetectors, than if only differential data were available. FIG. 13A shows typically differential signal processing of photodetector output whereas FIG. 13B shows single-ended signal processing.

The concept of pipelining with respect to embodiments such as shown in FIG. 10 will now be described. As used herein pipelining refers to reduction of latency in obtaining pixel measurements in successive frames of acquired data.

One can interlace measurements within frames of acquired data to increase measurement throughput as follows:

0°-180° measurement: $\Delta V_d(\tau_1)$

90°-270° measurement: $\Delta V_d(\tau_2) \to \Delta V_d(\tau_2)/\Delta V_d(\tau_1) = \tan(\phi)$ 0°-180° measurement: $\Delta V_d(\tau_3) \to \Delta V_d(\tau_2)/\Delta V_d(\tau_3) = \tan(\phi)$ 90°-270° measurement: $\Delta V_d(\tau_4) \to \Delta_d(\tau_4)/\Delta V_d(\tau_3) = \tan(\phi)$, etc.

In this fashion, a continuous pipeline of measurement information can be computed with an effective doubling of computational speed, yet with a latency of one measurement. Indeed, one advantage of the above-described time-division multiplexing QE modulation embodiment is that frame rate of data acquisition is substantially increased. As noted, on-chip CPU system 260 may be used to perform the information processing steps described herein, and on-chip electronics 250-$x$ can implement that various forms of QE modulation and signal processing that have been described.

Referring once again to FIG. 8A, assume that each of the two side-by-side photodetectors 240-($x$) (or detector "A") and 240-($x$+1) (or detector "B") have substantially identical area when seen in a planar view. What will now be described are techniques for reducing mal-effects of non-uniform illumination falling upon these photodetectors, including effects associated with differences in actual photodetector effective areas, and also reducing 1/f noise associated with gain of the amplifiers used with these photodetectors.

Referring to FIG. 3 and to FIG. 8A, assume that photon energy returned from target object 20 falls upon photodetectors A and B, and that these two photodetectors output different signals. The detected output signal may be different for several reasons. Perhaps the illumination falling upon photodetector A differed from the illumination falling upon photodetector B. Perhaps the effective detection area of photodetector A differed from photodetector B due to component mismatching, or perhaps photodetector A was simply better fabricated and exhibits better detection characteristics.

Referring again to the embodiment of FIG. 10, and using a "1+cos" analysis for simplicity of explanation, let the incoming photon energy signal seen by photodetector A is A'{cos($\omega t+\phi$)+1} and let the incoming photon energy signal seen by detector B be B'{cos($\omega t+\phi$)+1}. If A'=B', there is uniform illumination, but not otherwise. The more general case, however, results where A' and B' are not identical.

In FIG. 10, the energy signal seen by detector A, A'{cos($\omega t+\phi$)+1}, is multiplied by {cos($\omega t$)+1} to yield after accumulation A'(0.5 cos($\phi$)+1), hereafter denoted expression {1}. Similarly, the energy signal seen by detector B, B'{cos($\omega t+\phi$)+1}, is multiplied by){cos($\omega t+180°$)+1} to yield, after accumulation, B'(-0.5 cos($\phi$)+1), hereafter denoted expression {2}. If A'=B', then it would be a simple matter to obtain A'cos($\phi$), as described earlier herein. The problem is that A' and B' are not equal.

In the earlier description of FIG. 10, a goal was to arrive at Kb{cos($\phi$)} and Kb{sin($\phi$)}, where Kb is a brightness coefficient. For the case of non-uniform illumination, embodiments of the present invention now multiplies A'(cos($\omega t+\phi$)+1) by){cos($\omega t+180°$)+1}, which after integration yields A'(-0.5 cos($\omega$)+1), hereafter expression {3}. Further, embodiments of the present invention also multiply B'{cos($\omega t+\phi$)+1} by {cos($\omega t$)+1} to yield B'(0.5 cos($\phi$)+1), hereafter expression {4}.

At this juncture, embodiments of the present invention perform the mathematics to carry out (expression {1}—expression {2})—(expression {3}—expression {4}), to arrive at (A'+B'){cos($\phi$)}. Similarly the same operation can be carried out to arrive at the equivalent (A'+B')·{sin($\phi$)}, as noted earlier with respect to FIG. 10.

Thus, one calculation may be carried out upon (expression {1}-expression {2}) and a similar calculation carried out upon (expression {3}-expression {4}). Schematically, the procedure may be carried out as follows, referring now to FIG. 8A, FIG. 10, and FIGS. 14A and 14B:

(1) at time 0≦t≦t1, detector D or 240-($x$) is biased with signal S1=1+cos($\phi$t) and detector 240-($x$+1) is biased with signal S2=1+cos($\omega t$)+180°, e.g., 0° and 180° modulation;

(2) signals output from the two detectors are accumulated during time 0≦t≦t1 and at time t=t1, the differential signal is stored or sampled in digital or analog form;

(3) during time t1≦t≦t2, detector 240-($x$) is biased with signal S1=1+cos($\omega t$)+180° and detector 240-($x$+1) is biased with signal S2=1+cos($\omega t$);

(4) output signals from the two detectors are accumulated, and at the end of accumulation at time t=t2, the differential signal is stored or sampled, in digital or analog form; and (5) a difference signal is computed for the analog and/or digital signals that have been sampled or stored.

Figure 14A:
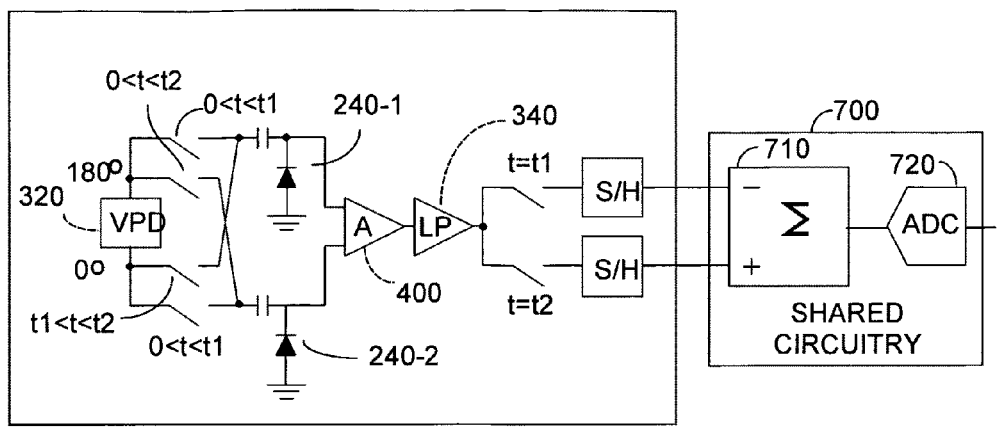
FIGS. 14A and 14B depict circuit configurations to reduce effects of non-uniform illumination and 1/f noise effects upon photodetectors, according to the '496 invention.
Figure 14B:
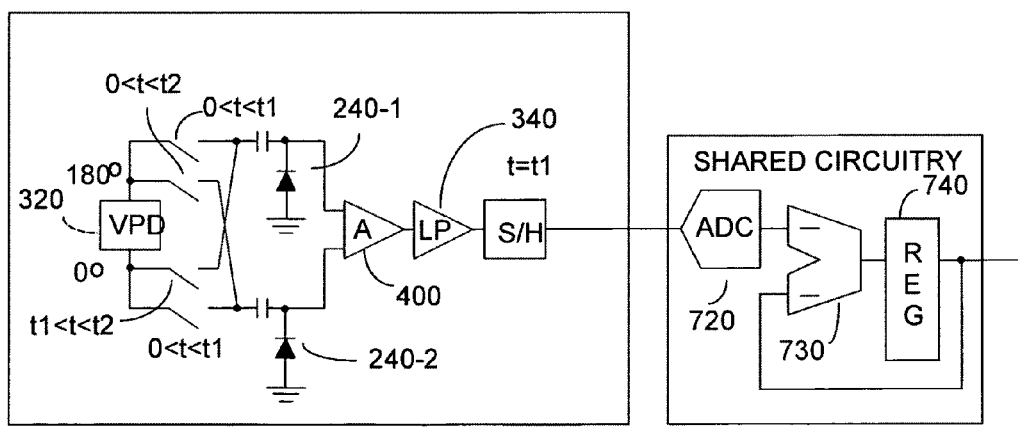

FIGS. 14A and 14B depict exemplary techniques for signal subtraction in the analog domain and in the digital domain, respectively. The analog or digital "shared" components 700 may be placed outside the photodiode pixel detector, perhaps using one shared component per each column in the row-column array of pixel detectors. Sample and hold (S/H) units within the pixel will hold both measurements for the entire duration of a read-out operation, which operation is repeated independently for each row of pixels. Alternatively, one might perform averaging and even the analog-t0-digital (ADC) conversion within the pixel block.

In FIG. 14A, the shared circuitry 700 includes an analog summer 710 whose analog output is digitized by an analog-to-digital converter 720. In FIG. 14B, the shared circuitry is essentially a digital adder 730 whose inputs are negated. The output from adder 730 is input to a register 740 whose output is fedback to an input of the adder. An A/D converter 720 presents digital input to the adder. In FIG. 14B, averaging is carried out in the digital domain, and analog-digital conversion can be shared across all rows of pixels, which means a S/H will be required per pixel to hold the accumulated voltage signal before the signal is delivered to the ADC for conversation. Thus in the digital domain embodiment of FIG. 14B, signal averaging requires twice as many A/D conversions than in the analog domain embodiment of FIG. 14A. It will be appreciated that similar approaches can be used in the various other modulation schemes that have been described, including time-division multiplexing, and spatial multiplexing.

Having described various earlier embodiments, and principals of operation, embodiments of the present invention will now be described in detail, commencing with the subject patent of provisional utility patent application Ser. No. 60/393,408, which was directed to three-dimensional sensing using differential charge transfer methods. As was described with respect to FIG. 3 and FIGS. 8A, 8B, 8C, in one embodiment, the '496 invention acquired three-dimensional information as to a target object 20 using CMOS-compatible image sensors 240 and associated electronics 250. More specifically, light source 220 was driven by a modulator 225 so as to emit light that traveled from system 200 to the target object, which reflected back at least some of the light to be detected by an image sensor that comprised an array 230 of pixels 240, each pixel comprising a photodetector and associated functional circuitry 250. Optical energy returned to system 200 impinged upon a photodetector and was converted into photoelectrons within the photodetector silicon substrate. Collection of the detection-generated electrons could be controlled by pixel circuitry 250. Charges collected during each clock cycle time could be accumulated during a frame (or integration) time, such that the final integrated photocharge represented distance information from the sensor within system 200 to the target object 20. In that embodiment, the controlled electron collection within the detector functioned as a mixer, and the integration functioned as a low pass filter.

In those embodiments, a differential modulation method was used, as depicted, inter alia, in FIGS. 8A-8C. A photodetector 240 could be defined as having two photoelectron collection sites, each site controlled by a clock signal preferably generated by the accompany electronics 250. As described, one signal was in phase with the signal from generator 225 modulating light emitter 220, and the other signal was 180° out-of-phase. In that embodiment, the energy source 220 and the photodetectors 240 were both modulated at a very high frequency, typically several hundred MHz. The differential QE modulation provided by such embodiments advantageously increased signal/noise ratio (SNR) for system 200, and also reduced system power consumption.

Figure 15A:
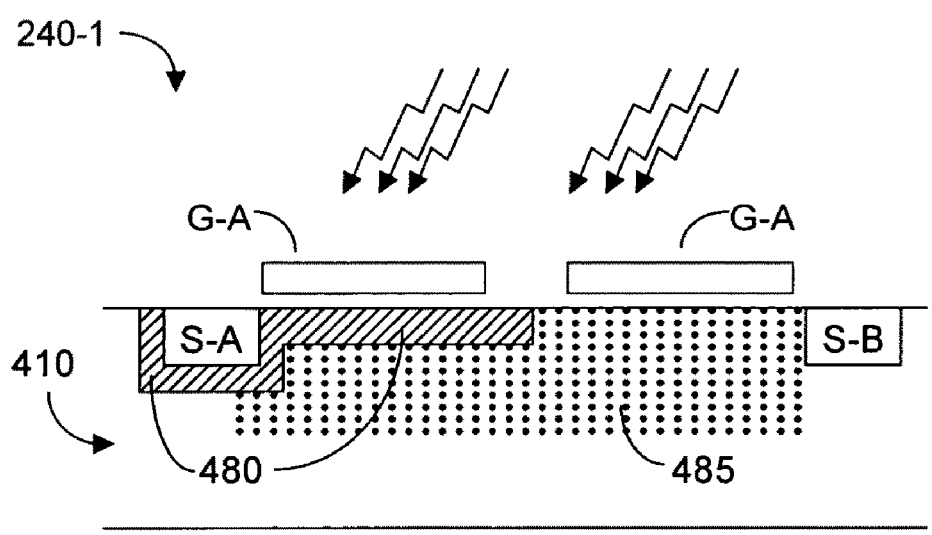
FIG. 15A is a side view of a CMOS differential QE pixel structure, according to the '496 invention.

FIG. 15A is a side view of a differential QE detector 240-1, similar to what is shown in FIGS. 8A-8B. Detector 240-1 is fabricated on a preferably p-type substrate 410, and each includes a source (n+ type material) and a gate. Note for ease of illustration a gate oxide layer separating the upper surface of substrate 410 and the overlying gate structures is not explicitly depicted. Thus detector 240-1 includes sources A and B (S-A, S-B), charge gates A and B (G-A, G-B) and a depletion gate (DG). Sources A and B function as differential photocharge collection sites, responsive to complementary clock signals coupled to charge gates A and B. It is understood that the flow of detection-generated photocharge beneath charge gates A and B will depend upon the associated gate potential.

For the p-substrate configuration of FIG. 15A, if the clock signal coupled to charge gate A is high, and that to charge gate B is low, then most of the detection-generated charge will flow to source A (and vice versa when the gate clock potentials change). Depletion region 480 shows the condition when charge gate A is high, with detection-generated photoelectrons being created in region 485. Movement of photoelectrons within depletion region 480 is induced by the drift force resulting from the strong electric field associated with potential at charge gate A. As a result, collection of detection-generated charge within the depletion region by source A is very efficient, close to 100%. Unfortunately detection-generated charge created outside depletion region 480 must travel by a diffusion process to the depletion region before collection by source A. But diffusion process is substantially slower than drift and photoelectrons generated outside depletion region 480 have a lower probability of being collected and thus contributing to the detection signal. In practice, detection-generated electrons that are not collected when charge gate A is at high potential may end up being collected by source A or by source B (e.g., by either photodetector diode 240-a or 240-2), and hence can contribute to common mode voltage (CM). Unfortunately detector structures such as shown in FIG. 15A can suffer high common mode voltage due to inefficient charge collection.

Figure 1:
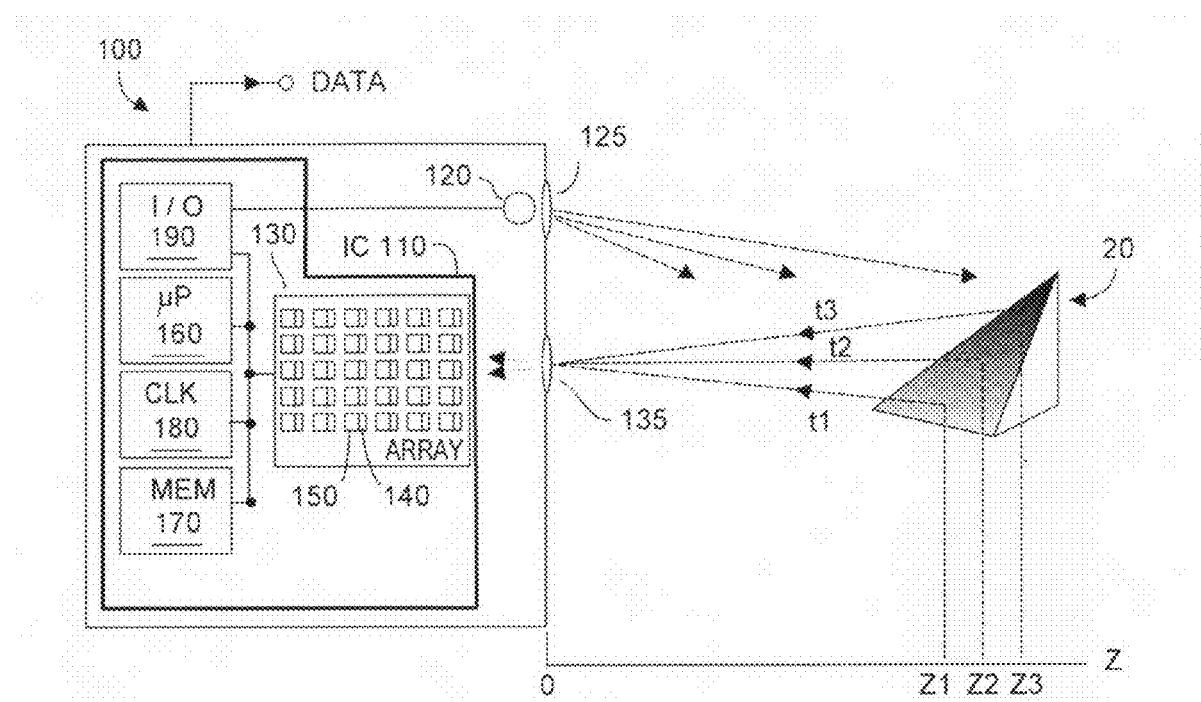
FIG. 1 is a diagram showing a generic luminosity-based range finding system, according to the prior art.
Figure 2C:
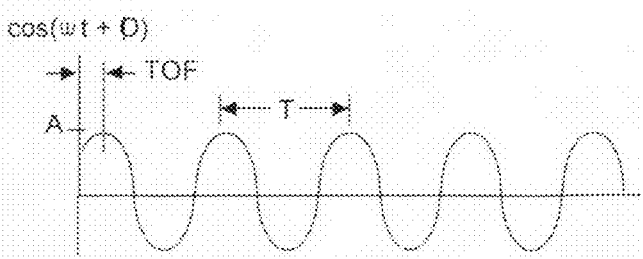
FIG. 2C depicts the return waveform with phase-delay for the transmitted signal of FIG. 2B, according to the prior art.
Figures 1, 4, 15B:
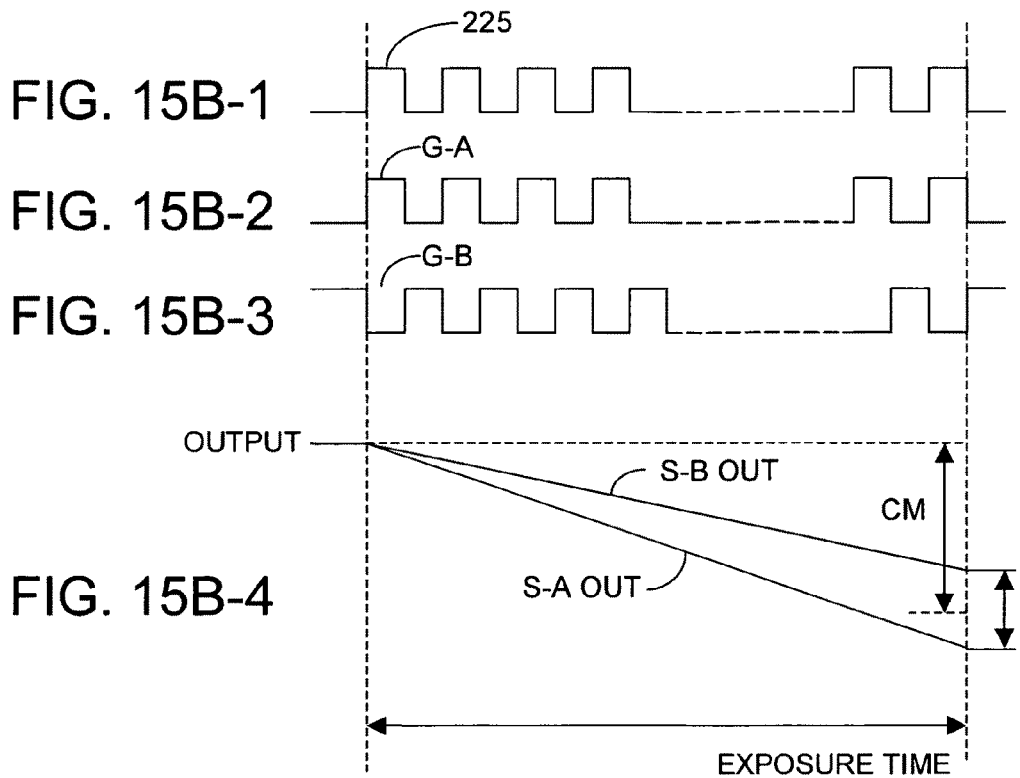

FIGS. 15B-1 shows the timing associated with generator 225, which drives optical energy source 220 (see FIG. 3). FIGS. 15B-2 shows the clock signal coupled to gate A, a signal in-phase with the clock signal driving light source 220. By contrast FIGS. 15B-3 shows the clock signal driving gate B, a signal 180° out-of-phase with the clock signal driving gate A. Exemplary voltage magnitudes for the waveforms shown are 1V to 3.3 V for a logical "high" clock value, and −0.7 V to 0 V for a logical "low" value. Other implementations could of course use clock signals having different "high" and "low" voltage magnitudes. Referring to FIGS. 15B-4, integrated detector-generated charge in source A and source B will gradually discharge the associated parasitic capacitors.

At the end of an integration time, one can calculate distance information (e.g., distance Z from system 200 to target object 20) from the final voltage differential ("DM") between source A and source B. The common mode voltage ("CM") is the average between the two source potentials and in an ideal case contributes nothing to the desired signal detection. However common mode voltage introduces noise and degrades SNR and should be minimized. Referring to FIG. 3, preferably detectors 240 in system 200 respond to incoming optical energy of the same wavelength at that transmitted by emitter 220, for example IR wavelength. Generator or oscillator 225 preferably turns emitter 220 on and off, responsive to signals from electronics 260 or 280. As such, the integration (or exposure) time is the time that emitter 220 is transmitting optical energy. For example if system 200 is operating at say 30 frames/second, the corresponding frame rate of 33 ms represents an integration (or exposure) time during which emitter 220 is on, and then a read-out time during which emitter 220 is off. It is desirable to have a long integration time as this permits more time for detectors 240 (or 240" or 240"-1, etc,) to collect detection-generated photons. Using a frame rate of 33 ms as an example, the integration or exposure time might be about 25 ms, and the read-out time would be about 8 ms. During readout, electronics within system 200 turns off emitter 225 such that a detection signal proportional to collected integrated charge remains unchanged. During readout, every pixel 240 (240", 240"-1, etc.) will have had the same integration time.

Figure 16A:
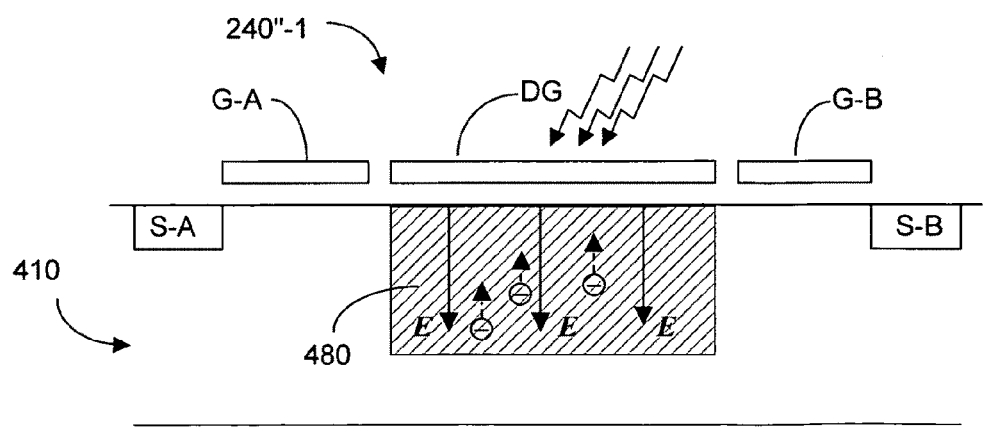
FIG. 16A is a side view of a CMOS differential charge transfer pixel structure embodiment of the present invention, according to the '408 invention.

FIG. 16A depicts an improved differential charge transfer detector structure 240"-1 according to the '408 application. It is understood that in FIG. 3, detectors 240 in array 230 can of course include detectors 240". Detector 240"-1 is CMOS implementable and preferably is fabricated upon a p-type substrate 410. Detector 240" in FIG. 16A differs from detector 240 in FIG. 15A in that a depletion gate (DG) is formed intermediate charge transfer gate A (G-A) and charge transfer gate B (G-B). Source A (S-A) and source B (S-B) again act as two charge collection regions, these regions being n-type for a p-type substrate detector. Not shown for ease of illustration is the gate oxide layer separating the upper surface of substrate 410 and the various gates G-A, DG, G-B. Also not shown are reset transistors such as M1, M2 depicted and described with respect to FIG. 17A. As will now be described, the differential charge transfer structure of FIG. 16A can substantially improve the SNR of system 200 (see FIG. 3).

Incoming optical energy (indicated by zig-zag arrows), e.g., reflected from target object 20, falls upon depletion gate DG, which collects detection-generated photocharges during an integration time. (FIG. 16A does not depict an optical mask that prevents incoming optical energy from falling other than on depletion gate DG, and does not depict a thin oxide layer between the upper substrate surface and the various gate structures.) Charge transfer gates G-A and G-B preferably are turned-on at each half-cycle of the clock signal (e.g., the signal from generator 225 in FIG. 3), and photocharge is transferred from the depletion gate to each source A or source B.

Figure 16B:
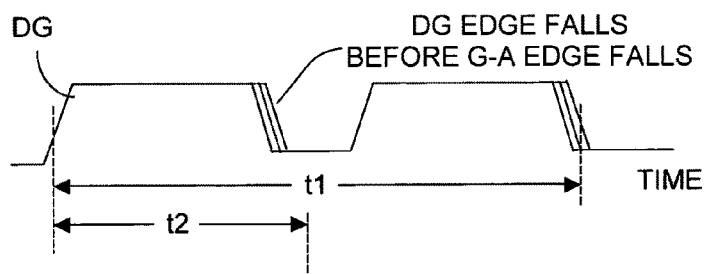
FIGS. 16B-16D are clock signals associated with the structure of FIG. 16A, according to embodiments of the present invention.
Figure 16C:
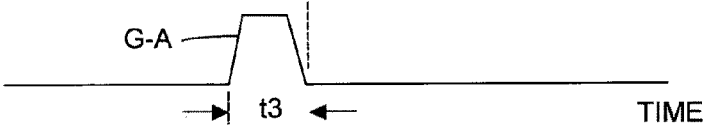
Figure 16D:

FIG. 16B depicts the clock signal coupled to depletion gate D-G. Exemplary values of time t1 are about 10 ns to 40 ns, and exemplary values of time t2 are about 5 ns to about 20 ns. FIGS. 16C and 16D depict clock signals coupled, respectively, to charge transfer gates G-A and G-B. Exemplary values of time t3 might be about 4 ns to about 20 ns, and an exemplary value of time t4 might be about 5 ns to about 20 ns.

Exemplary values of "high" and "low" clock voltages may be the same as described with respect to FIGS. 15B-1 to 15B-3 above.

During the time that depletion gate clock signal coupled to the center D-G is high (e.g., during a portion of time t2), depletion region 480 formed beneath this gate. Within depletion region 480, voltage gradually decreases from the silicon and gate dioxide interface to the neutral region of the substrate (assumed biased at ground). As such the electrical field points downward, as indicated by the vector arrows denoted "E". Detection-generated free electrons (shown as circled "–" signs) are moved upward in FIG. 16A due to the drift induced by electrical field E. As such, these electrons are collected beneath the center depletion gate DG and move upward, which collection is highly efficient due to the strong drift force resulting from the electrical field E.

Figure 16E:
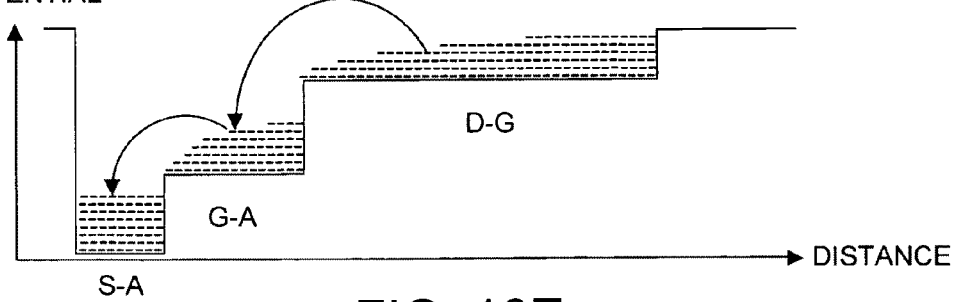
FIG. 16E depicts surface potential and movement of detection-generated electrons during charge transfer after DG potential first goes to zero, for the structure of FIG. 16A, according to embodiments of the present invention.

Source S-A (or source S-B) is reset to a high voltage at the beginning of the integration time. Referring to FIGS. 16B and 16C, during a charge transfer phase, gate A (or gate B) is raised high first, and the center gate voltage is dropped to zero. FIG. 16E depicts surface potential during charge transfer, as electrons move from the center depletion gate D-G to the source S-A due to the difference in surface potential. Time commences in FIG. 16E just after the potential at diffusion gate DG goes low. In FIG. 16E, the vertical height of the surface potential is opposite the voltage value, e.g., higher the voltage, the lower the surface potential. Electrons move from a high potential region, e.g., associated with the center depletion gate (CG) to a lower potential region, e.g., gate A (G-A), to a still lower potential region, e.g., source A (S-A), analogous to water flowing downhill due to the effects of gravity.

It is desired that potential at gate A (G-A) remain fully high before dropping to zero the potential coupled to the center depletion gate (DG) to achieve high charge transfer efficiency. This timing relationship is indicated in FIG. 16B by the several permissible falling edges of the DG signal, where these edges transition high-to-low while the G-A signal remains high, and has not yet begun its own high-to-low transition. The rising and falling edges and the relative positions of the three clock signals as exemplified by FIGS. 16B-16D thus require care in generating the clock signals. It will be appreciated that parameters such as width of center depletion gate (DG), side gates (G-A, G-B), and space gaps between the gates also can directly contribute to charge transfer efficiency. Applicants simulated the structure of FIG. 16A to optimize the three clock signals and the dimensions of the proposed structure. Each free parameter was evaluated and incremented or decremented by a small amount in the direction of maximum benefit in terms of charge transfer efficiency. If desired, a search algorithm may be used to help optimize the clock and dimensional parameters.

In addition to simulation as above-described, applicants fabricated a sensor 240"-1 on an IC chip in such a fashion that each relevant potential could be digitally controlled, to confirm optimum operation. Further, transition edge timing of the various relevant control signals could also be controlled.

A challenge presented by the structure of FIG. 16A is that charge stored within parasitic capacitors associated with source A and source B may too readily be disturbed by the rapid switching of depletion gate (D-G) and the side charge gates (G-A, G-B). Computer simulations demonstrate that source voltages include transients, mainly due to capacitive coupling of the various gate clock signals. Understandably as accumulated charge within source A (S-A) and source B (S-B) represents important range information, such charge loss is undesirable.

Applicants have discovered that the above-noted source voltage swing can be somewhat reduced and de-coupled by increasing the width of the side gates G-A, G-B to increase the distance between center depletion gate (DG) and source A (S-A) and source B (S-B). In simulations, if the length of center depletion gate (DG) is about 4 μm, the length of each side gate (G-A, G-B) should be at least about 2 μm in length for good protection. But extending the dimensions of side gates G-A, G-B is at the expense of reduced fill factor, the ratio between the photodetection area to total pixel area. While the effects of capacitive coupling between side gates and source are reduced, some residual effect will remain.

One solution to this problem is adding a DC bias gate between each source (S-A, S-B) and associated charge transfer gates G-A, G-B in the above described structure. Such a resultant detector structure 240"-1 is shown in FIG. 17A (which also shows reset transistors M1, M2), wherein the DC bias gates are denoted BG-A and BG-B, which gates are coupled to a bias potential VDC. Bias gates BG-A, BG-B are normally biased at about 0.5 VDD, e.g., about half of the power supply voltage. Maintaining a fixed DC voltage on the bias gates reduces coupling between the sources and the charge transfer gates, which helps preserve charge present within the source regions. For a detector 240"-1 manufactured using a 0.25 μm process, exemplary voltages were Vdd=2.5 V="high" value for clock pulses coupled to gates G-A and G-B in FIGS. 17D and 17E, where "low" clock pulses are about 0 V. The magnitude of VC coupled to depletion gate VG will have a "high" value of about 0.5 V less than the "high" volume of gates G-A and G-B, and a "low" value of about 0 V. The constant bias potential VDF shown in FIG. 17F will be about 0.5 Vdd or about 1.25 V. Vref may be set to Vdd. Performance of sensor 240"-1 is sensitive to magnitudes of these voltage values, and the stated exemplary values were obtained by computer simulation and experimentation.

The reset signal is used to initialize the voltages at sources S-A, S-B before charge collection begins. FIGS. 17B-17F show clock signals and VDC potential coupled to detector 240"-1. The high and low voltage values and pulse width or timing values for the various clock signals are preferably as described earlier with respect to FIGS. 16B-16D. Various times T1, T2, T3, T4, T5 are shown in FIGS. 17B-17F. FIGS. 17G-17K depict surface potential changes (vertical axis) as a function of horizontal location in detector 240"-1 (horizontal axis) at times T1-T5 for the structure of FIG. 17A. It is noted that by time T5, essentially all of the detection-generated charge (present at time T1) has been collected and transferred to source S-A. It is understood that charge collection and transfer will also occur at source S-B. Once the charge has been collected from the sources, determination of distance Z, e.g., in a TOF application, may be determined using techniques such as disclosed in U.S. Pat. No. 6,580,496.

The above-described photodetector structures were exemplary and provided one depletion gate and two charge transfer gates, where clock potential coupled to the two transfer gates had 180° phase different. It is understood that more than two charge transfer gates could be used, for example gates G-A, G-B, G-C, G-D, disposed to surround the center depletion gate (DG). In such embodiment, four clock signals would have 90° incremental phase shift from one another. The four transfer gates would be disposed at the four sides of the center depletion gate, somewhat similar to what was depicted in FIG. 12A.

Applicants have discovered that structures such as depicted in FIGS. 16A and 17A may be produced at a generic fabrication site by using what may be termed "rich" instructions to command the fabrication process. CMOS fabrication technology is frequently driven by the requirements to produce DRAM and digital circuits. As such, standard CMOS processes are optimized to the speed and power requirements of digital circuits. Relevant process parameters that tend to be optimized for such devices include substrate doping level, doping profile, transistor threshold adjustment doping, polysilicide (used to reduce poly resistance), and shallow trench isolation (STI) that enables smaller transistor separation and denser ICs. But such CMOS optimizations are not optimum (and in fact can be detrimental) for production of imaging devices such as shown in FIGS. 16A and 17A. Nonetheless, to be cost effective, CMOS image sensors such as 240"-1 should use existing CMOS process technology. Procedures developed by applicants to enhance CMOS fabrication of QE modulation devices such as the charge transfer devices depicted in FIGS. 16A and 17A will now be described.

Under normal circumstances, the layers expressed in a typical CMOS design are combined in a standard way to produce marks to drive the fabrication process. While it might be possible to build a mask set to produce sensor structures for QE modulation, in general it is not possible to express these mask sets using the layers and the translation rules commonly available in a typical CMOS design. Accordingly, applicants have developed methods to augment the layer set used in the design of CMOS structures, and to augment the rule set that translates layers into masks, to be able to express mask sets that are more suitable for imaging QE modulation detector or sensor structures. As a result, standard CMOS fabrication facilities, which tend to be optimized to produce digital ICs, can now be used to produce reasonably optimized imaging sensors 240"-1.

More specifically, applicants introduce several intermediate mask-blocking layers that allow special fabrication mask patterns in or near the region of substrate 410 whereas photodetectors (or sensors) 240"-1 will be fabricated. Use of such masking patterns advantageously yields imaging detectors with enhanced optical and electrical characteristics. Such special patterns are used only on or adjacent photodetection regions of the sensor structure, and thus the remainder of the IC chip can maintain required electrical and optical properties for correct CMOS operation. Although the following description of applicants' method is directed to use of such blocking masks in an existing unmodified or generic CMOS process technology, the method may also be applied to a more general set of mask patterns for use with a modified CMOS process.

Figure 18A:
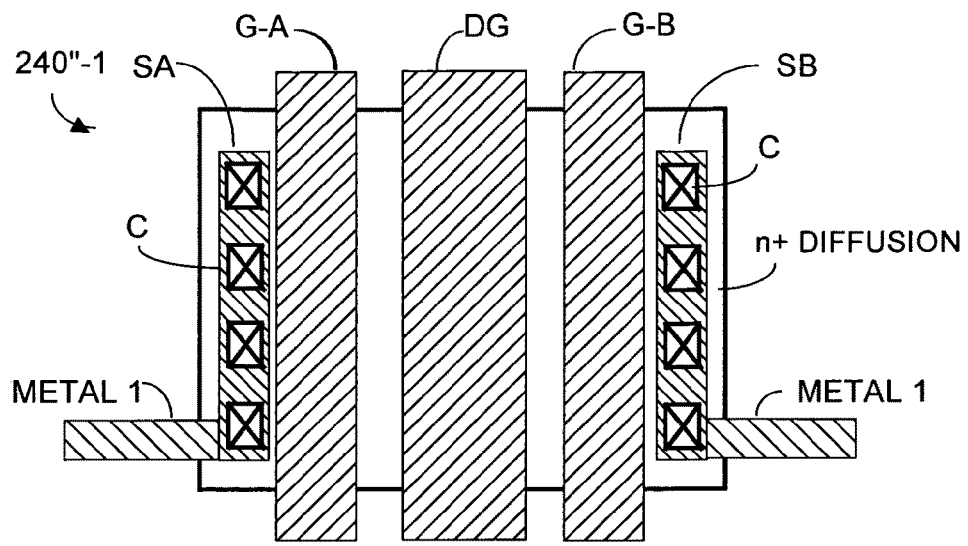
FIG. 18A is a plan view of an exemplary mask layout that might be used with a generic CMOS fabrication facility in an attempt to produce an imaging sensor detector structure such as shown in FIG. 16A, according to the prior art.

FIG. 18A is a plan view of a mask layout that might be used with a generic CMOS process in an attempt to product charge transfer sensor structure 240"-1, as depicted in FIG. 16A. If the mask layout of FIG. 18A is used with a standard CMOS process, detector sensitivity and performance will be degraded. Process related problems include the presence of salicide deposited atop poly material will significantly absorb incoming optical energy, thus substantially reducing the number of detection-generated photoelectrons available for collection. Typically the separation gap between the poly material gates will be implanted using n+ diffusion, which unfortunately will tend to block charge transfer from the depletion gate to the sources due to contamination effects. A heavily doped p well associated with the structure tends to reduce the depth of the desired depletion region, which undesirably reduces the number of detection-generated electrons that can be collected. Transistor threshold doping adjustment also tends to reduce depletion region depth, thus reducing the number of detection-generated electrons that can be collected. Further, n type lightly doped drain regions (NLDD) formed under the inner edge of the poly gates will tend to block charge transfer. In FIG. 18A (and in FIG. 18C), contacts are denoted as "C".

Figure 18B:
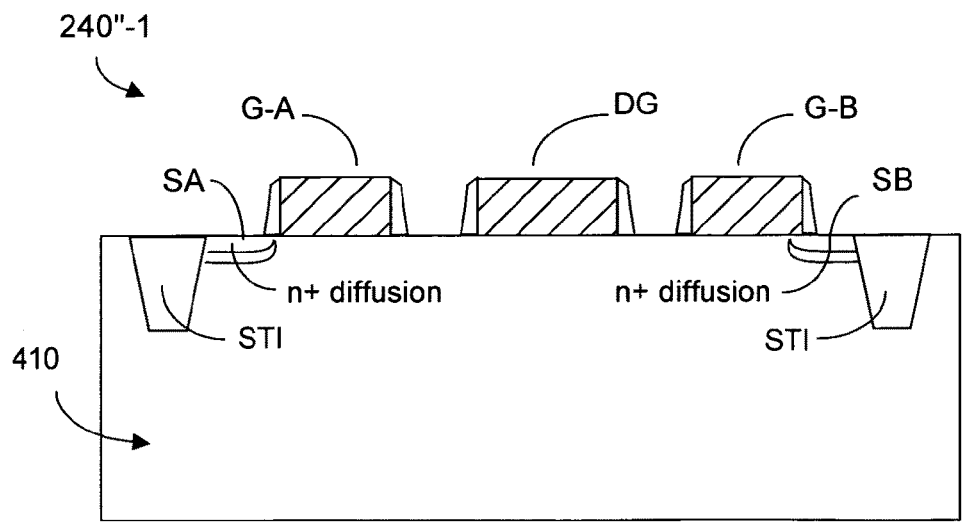
FIG. 18B is a cross-sectional view of an ideal charge transfer structure such as shown in FIG. 16A, according to embodiments of the present invention.
Figure 18C:
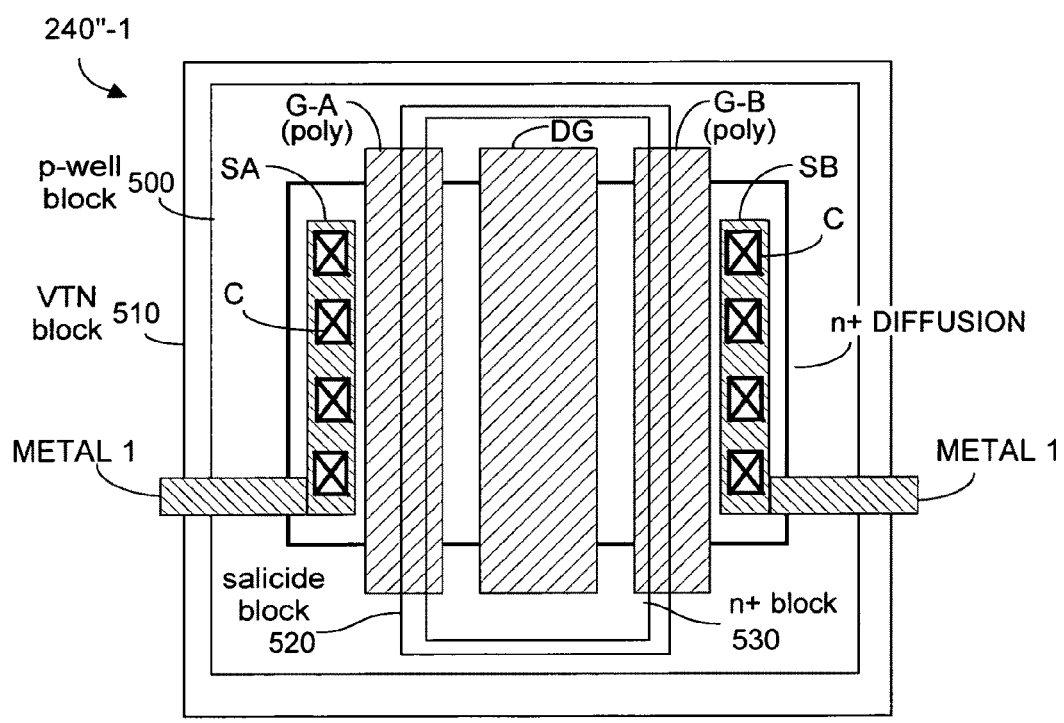
FIG. 18C is a plan view of an exemplary mask layout with added blocking layers used to produce the ideal structure shown in FIG. 18B, according to embodiments of the present invention.

FIG. 18B is a side view of a more usefully implemented and somewhat more idealized sensor structure 240"-1, produced using the methods developed by applicants to overcome the problems noted immediately above. During fabrication of structure 240"-1 (and indeed the method described has other application as well), several blocking layers are introduced and are selectively applied to the mask layout in a generic, unmodified, CMOS fabrication process. For example in FIG. 18B, diffusion gate DG is formed of polysilicon (poly) without CoSi, this outcome achieved using a salicide block. Shallow trench isolation (STI) bounds the n+ diffusion regions defining sources S-A, and S-B. Advantageously there is neither n+ diffusion nor STI between adjacent poly gate structures (e.g., G-A and DG, DG and G-B) thanks to use of putting an n+ block atop the diffusion areas. Substrate 410 is lightly doped p-type material, achieved by use of Pwell blocks. The substrate region below the diffusion gate GD has neither surface doping nor NLDD, thanks to the use of a NMOS threshold VTN block. Applicants also modify the standard logic operation of the mask layers to overcome the above described performance problems that would otherwise occur. FIG. 18C depicts a modified layout for sensor structure 240"-1 that includes additional new blocking layers on top of the layout of FIG. 18A, according to applicants' method. In FIG. 18C, the newly introduced blocking layers are shown in bold and include Pwell block 500, VTN block 510, salicide block 520, and n+ block 530.

Table 2 below lists the modified mask layers and new logic operation rule, according to applicants' method. Table 2' also shows the digitized patterns for the modified masks, conventional logic operation and modified logic operation. The logic operators expressed in Table 2 use common masking expressions that are well known in the relevant art as used with 0.25 μm mixed mode process.

TABLE 2

| Mask Layer | Digitized Pattern | Conventional logic operation | Modified logic operation |
|---|---|---|---|
| PWELL | D | (NWELL) | (NWELL or PWELL-Block) |
| VTN | D | [(TG or NWell) or HR] or P+ | {[(TG or NWell) or HR] or VTN-Block} or P+ |
| N+ | D | (P+ or HR) | (P+ or HR) or N+ Block |

The descriptions and structures re FIGS. 17A and 18A-18C were supported by simulations made using a commercial device simulation package. Simulation helped provide insight into the underlying physics and helped optimize the design. Optimization parameters included determining proper geometrical size for each gate, correct controlling voltage and transient timing, correct doping levels, etc. The core of the simulator was a 2-D Poisson solver, and the overall structure was divided into hundreds to thousands of vertex grid points, with the simulator attempting to solve Poisson equations at each grid point.

Understandably successfully simulating the above-described complex sensor structures within a finite time period is a challenging computational undertaking. Applicants undertook simulation using sensor integration for 10 ms to 30 ms (frame time), using a clock frequency for modulation generator 225 (see FIG. 3) of several hundred MHz, which is to say several million switching cycles per frame. It is simply impractical to attempt simulation of a single frame time to verify the proposed structures.

A more feasible solution is to simulate one or several clock cycles, scaling up the input optical detection energy intensity proportionally. The sensor detection output voltage signals at the end of these several cycles is used to estimate final results for one real frame time. This approach permits reducing the time length simulated to a rather manageable tens of ns. It is important for a realistic simulation to account for common mode effects resulting from carriers that are generated during the few simulation cycles but go uncollected.

Applicants' device simulation may be broken into three portions. In a first portion, the various voltages in the circuit are initialized, e.g., using a DC operating point type initialization. Next, one or more cycles are accurately simulated in transient simulation lasting typically about 10 ns to 30 ns with a time step of about 10 ps to 100 ps. In the last portion of the simulation, modulation and light source are stopped and charges in the substrate that were not captured during the previous short transient simulation are now allowed to be captured or die, for example by an operating point or transient simulation lasting at least about 10:s. However since there are no rapid transients, simulation can take much larger time steps on the order of several ns or tens of ns without significant loss of accuracy, thus keeping simulation time within reasonable bounds.

Care is taken to verify that the net effect of electrons captured in the third simulation portion is the same as if those electrons had been exposed to continued modulation as in the second simulation portion. By trifurcating simulation, accuracy is preserved and run time is kept within reasonable bounds.

Alternatively a plot of the electric field and carriers present in the silicon substrate at a particular time can be examined. Regions of high electric field sweep the carriers rapidly into their collection points and good signal capture results. Regions of low electric field result in carriers wandering under a slow diffusion transport mechanism. Carriers generated in these regions are generally not collected quickly enough and contribute to common mode, which is undesirable. By observing the electrical field for different parameter values these values can be optimized so that electrons are rapidly transported from their generation point to their intended collection point, thus resulting in improved performance. A method combining the results from the trifurcated simulation and electric field observations can be used to capitalize on the best characteristics of both optimization strategies.

A detailed description of the embodiments of the present invention set forth in applicants' reference application Ser. No. 60/396,422 will now be given. The embodiments of the present invention described in the '422 application are directed to a sensor detector structure, useable as detector 240 in FIG. 3, that is based upon a local charge collection mode of operation. Integration of detection-induced photoelectrons is accomplished in two steps: local charge collection, and charge transport to the final integration site. Structures using this two step collection mode can operate at higher modulation frequencies, e.g., frequencies of generator 225 in FIG. 3, with increased differential mode signal, lower common mode signal, and therefore improved SNR and depth (Z-distance) resolution. Further, quantum efficiency (QE) of this structure is enhances in that a smaller poly gate area is required, which means smaller magnitudes of optical energy can be used in system 200, shown in FIG. 3.

Figure 19A:
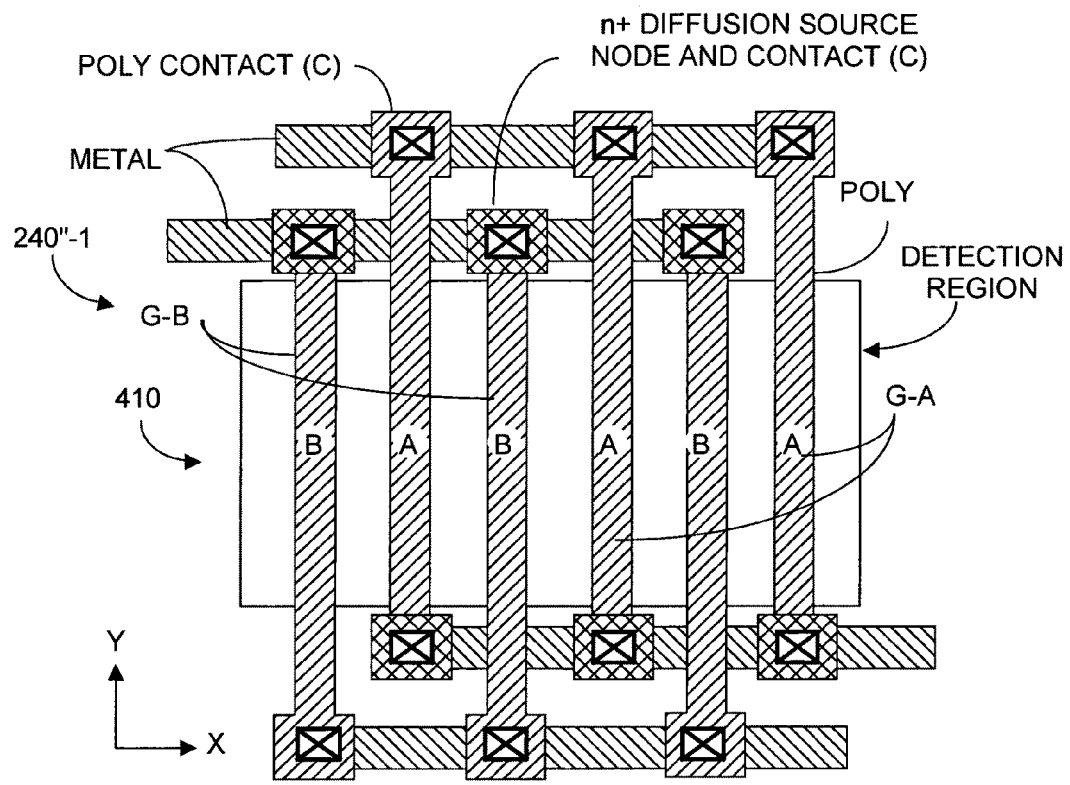
FIG. 19A is a plan view of a differential multiple finger detector sensor per an embodiment of the '422 and /299 applications, according to embodiments of the present invention.

Referring to the plan view of FIG. 19A, a preferred structure for an optical energy sensor detector 240"-1 includes multiple long poly material fingers (denoted "A" and "B") that preferably are parallel to each other. These fingers overlie an area that is the effective detection area for the sensor. The length and number of such fingers will depend upon the desired pixel size. Exemplary dimensions are a relatively narrow finger width of about 0.25 µm, with a spaced-apart separation between adjacent fingers of perhaps five times this value, e.g., about 1.2 µm. In implementing a differential sensor, fingers A and B are grouped into either an interleaven A gate or B gate. Each gate has two ends, and is driven at one end through a poly contact (C), and has an N+ diffusion source at the other end. Each group of gates (A or B) share the same clock signal and has associated sources shorted together with a strip of metal. In FIG. 19A, the underlying substrate 410 is preferably very lightly doped ($10^{15}$) p type material, and the diffusion areas are n+ material, although complementary doping could be used.

Figure 19B:
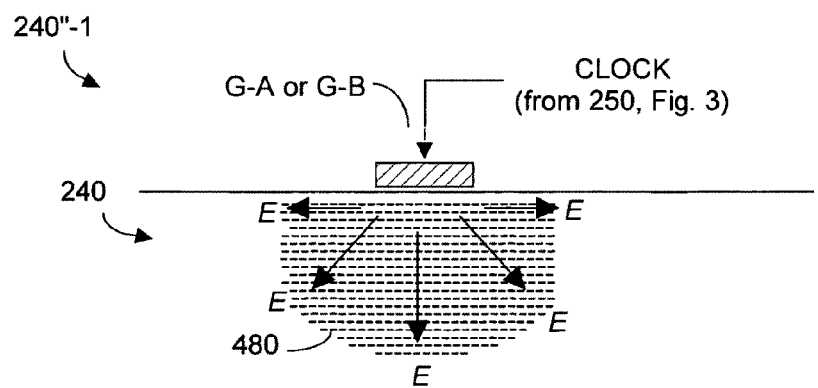
FIG. 19B is a cross-sectional view of a portion of the structure of FIG. 19A, showing lateral extension of the depletion region underlying an on-gate, according to embodiments of the present invention.

When the narrow gates A or B are biased to a high voltage, a depletion region 480 forms within the underlying substrate 240. FIG. 19B is a cross-section of an exemplary depletion region, showing electrical field (E) distribution within the p type substrate. Note that depletion region 480 and the electrical field are not restricted solely to area directly beneath gate structure A or B, but extend laterally outward from each side of the gate. Electric field E will cause detection-generated electrons within the depletion region to move toward and accumulate beneath the gate. Using the above-noted dimensions, simulations demonstrate that the depletion region and the electrical field extend laterally left and right about 1 µm to about 2 µm from the poly edge, which justifies the spacing between the fingers.

In the differential sensor 240"-1 structure of FIG. 19A, gates A and B are driven by two complementary (e.g., 180° phase shift) clock signals. At any time, potential at either A gates or B gates is high. Incoming optical energy is modulated light emitted by source 220 responsive to generator 225 and at least partially reflected by target object 20 a distance Z-away (see FIG. 3). This incoming optical energy (shown in FIGS. 19C and 19D as zig-zag lines) passes through the relatively wide gaps between adjacent poly gates (A and B), and also though the poly (if it is not polycided), and generates electrons within substrate 410. These detection-generated electrons, in turn, move laterally left or right and accumulate underneath the nearest poly gate A or B that is presently at a high clock potential.

Figure 19C:
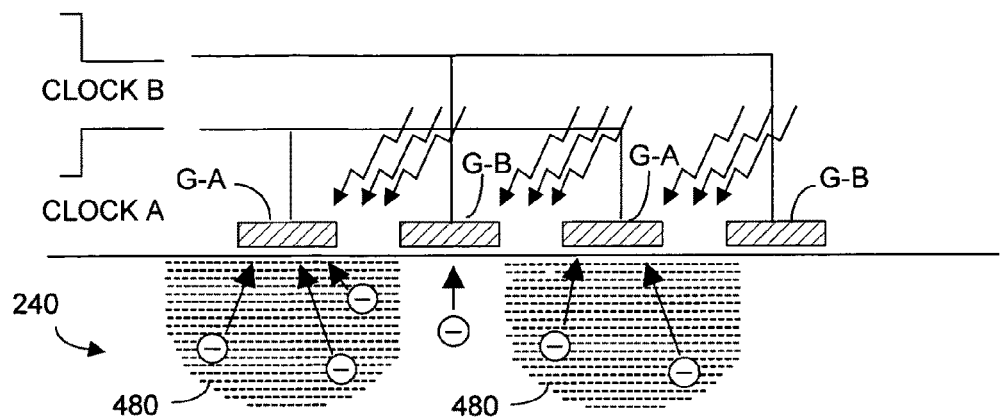
FIGS. 19C and 19D are cross-sectional views of a multiple-gate portion of the structure of FIG. 19A, showing effect of complementary gate clock signals upon distribution of depletion region and upon accumulation of detection—generated electrons, according to embodiments of the present invention.
Figure 19D:
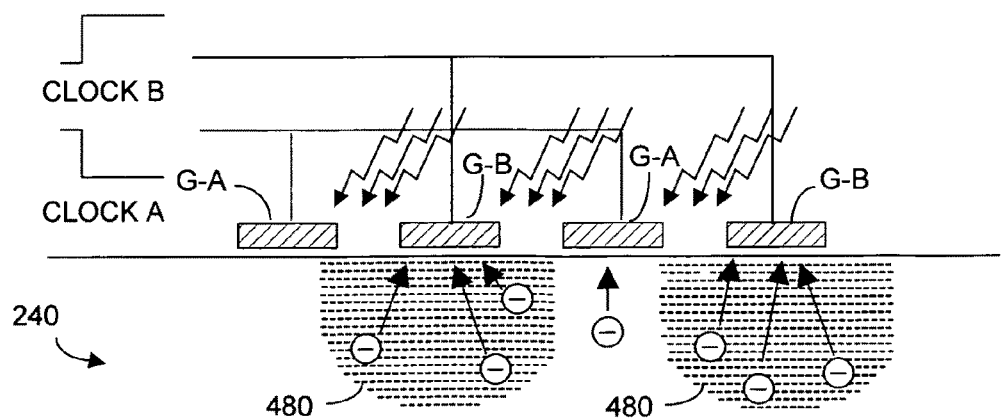

FIGS. 19C and 19D are a cross-section of the sensor structure 240"-1 of FIG. 19A, taken in the X-axis direction. As noted earlier, incoming optical energy generates electrons, whose movement at a given time is determined by the differential gate clock signal voltages coupled to gates A and B, respectively G-A, G-B. Photoelectron generation area between any two adjacent gates G-A, G-B is shared by the gates, and is temporarily associated with one of the gates, depending on the gate voltages. By interleaving gates A and B, and driving the gates with differential clock signals, the electrical field of the on-gate (the high potential gate) extends to the boundary of the adjacent off-gate. Advantageously, substantially all of the photoelectrons can be collected by the on-gate across the entire photodetection region during that clock cycle.

In FIG. 19C, gates G-A are at high potential due to the high (perhaps 2.5 V) state of Clock A, and gates G-B are at a complementary low (perhaps 0 V) state due to Clock B. As noted the complementary clock signals are generated on IC 210 (see FIG. 3). In FIG. 19C, the various gates G-A are at high potential and depletion regions 480 form beneath and laterally to the left and to the right of these on-gates as drawn in the figure. At the same time, gates G-B are at low potential. A substantial amount of electrons generated in substrate 240 between the differential gates move towards the G-A gates, where they tend to accumulate. A few electrons may be generated relatively close to one or more G-B gates and these electrons can still be collected by the G-B gate, and will contribute to the common mode signal.

In FIG. 19D, polarity of the clock A and clock B signals has changed, and now gates G-B are at high potential and depletion regions 480 form beneath and laterally relative to the on-gates. Now most of the electrons generated in substrate 240 between the differential gates will move towards the G-B gates, although electrons that are generated close to a G-A gate (which is now at low potential with no substantial underlying depletion region 480) may still be collected and will contribute to the common mode signal.

Thus far the description of structure 240"-1 in FIGS. 19A-19D has been concerned with movement of detection-generated electrons in the X-direction. These photo-generated electrons eventually need to be collected by the N+ diffusion source nodes at the end of the poly gates shown in FIG. 19A. The collected charge is then converted into a voltage signal by the total capacitance associated with that node. The resultant voltage signal is read-out with circuitry, e.g., circuitry within 250 associated with that detector sensor 240 (or 240"-1). Preferably the charge integration process is carried out in two phases. First, the detection-generated electrons are accumulated in substrate regions generally beneath the gates in the sensor structure, as depicted in FIGS. 19B-19D. In a second phase, the electrons, which have been accumulated largely in the X-direction (see FIG. 19A), are transported along the long narrow gate structures to the associated source regions in the Y-direction (see FIG. 19A).

Movement of accumulated electrons along the gate structure Y-direction toward the source is again due to electrical static potential differences. Preferably the source is reset to a high voltage at the beginning of integration, and thus electrons will be collected as along as they can reach the boundary of the source. As noted, each narrow elongated gate structure is driven by a clock signal (Clock A or Clock B, depending upon the gate) from one end, with the source region located at the other end of the gate. When the gate is switched from clock high to low, a finite time is required for the signal to propagate along the gate, which causes a potential difference within the substrate 240 along the gate. This potential difference introduces a horizontal electrical field, advantageously causing the accumulated electrons to move in the Y-direction toward the source.

Figure 19E:
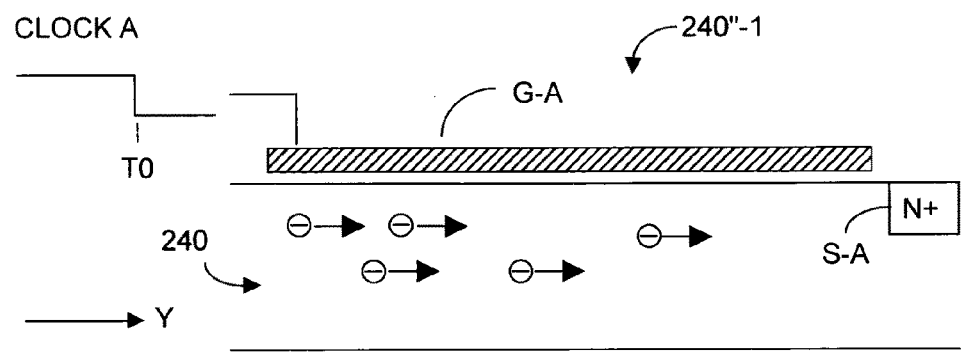
FIG. 19E depicts Y-direction movement of accumulated electrons toward the source under the gate, for the structure of FIG. 19A, according to embodiments of the present invention.
Figure 19F:
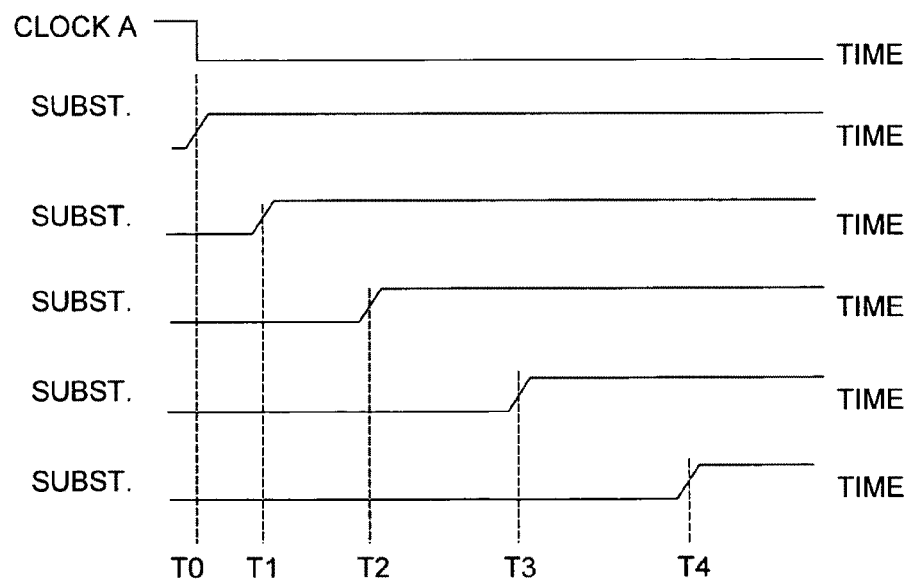
FIG. 19F depicts electrical static potential under the gate of the structure of FIG. 19A at different times, according to embodiments of the present invention.

FIG. 19E depicts Y-direction movement of accumulated electrons toward the source under the gate, while FIG. 19F depicts electrical static potential under the gate at different times after the gate clock is switched from high to low at time t=0. Detection-generated electrons are shown in FIG. 19E moving in the Y-direction, parallel to the geometry of gate G-A, towards the n=source S-A. As noted complementary Clock A, Clock B signals are employed to differentially drive the gate groups G-A, G-B.

One might think that electrons accumulated by a low potential gate during a previous high potential gate cycle would be attracted by the opposite gates before the charges can be collected at the source. This outcome does not occur, however, because of the built-in potential of the MOS gate structure. There is a difference between work function potentials of the polysilicon and the silicon in the MOS gate structure, which built-in potential causes a depletion region to exist beneath the gate, even when the gate potential is 0 V. A flat band (no depletion region) is achieved only if the gate is negatively biased, e.g., perhaps about −0.7 V. Applicants' study of the relationship between the built-in potential and the poly gate doping level helped the design of sensor 240"-1, to achieve good charge local collection. Applicants achieved an optimized poly gate doping level by using an n+ block layer and salicide block layer, as described earlier herein.

Figure 19G:
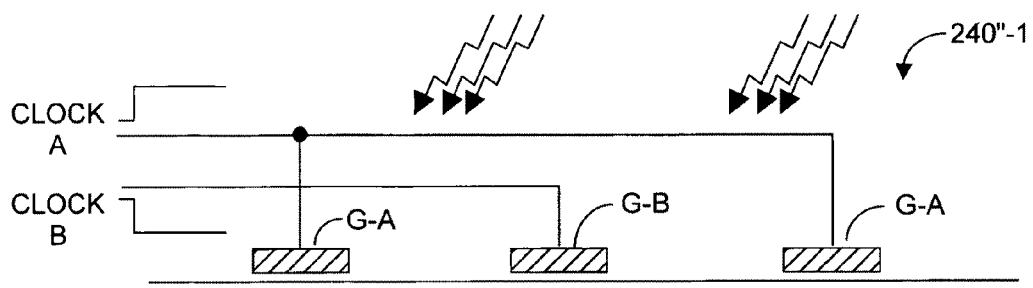
FIG. 19G is a plot of surface potential at the silicon-gate oxide interface versus position along the X-direction for a sensor structure as depicted in FIG. 19A, according to embodiments of the present invention.

FIG. 19G is a plot of surface potential at the silicon-gate oxide interface versus position along the X-direction for structure 240"-1, as depicted in FIG. 19A. Note that surface potential beneath an off-gate (e.g., gate G-B, whose clock is low, e.g., 0 V) is lower than the potential at the edges of the gate, even though this potential is higher than potential of an on-gate (e.g., gates G-A, whose clock is high, e.g., perhaps 2.5 V). This potential well confines accumulated electrons, preventing them from being attracted by a neighboring high gates, providing a sufficiently wide distance separates adjacent gates. Stated differently, providing that the photoelectrons have been captured by a gate during the gate's high cycle, these electrons will stay underneath the gate, and tend to move only along the gate direction until they are finally collected by the source at the other end or tip of the gate. It may take several clock cycles for the electrons to reach the source due to the relative weak horizontal electrical field and the long traveling distance involved.

Figure 19H:
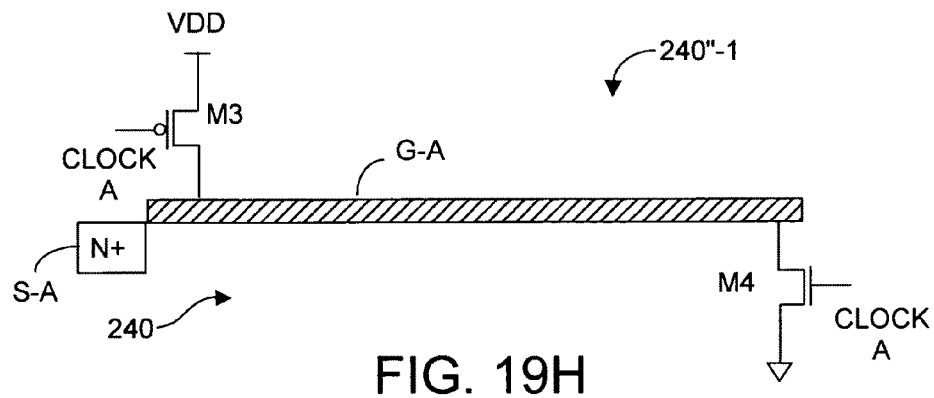
FIG. 19H depicts complementary driving of both ends of an elongated gate for the sensor structure depicted in FIG. 19A, according to embodiments of the present invention.

As noted earlier, detection-generated electrons captured by the gate structure will move horizontally toward the source and eventually be collected at the source. It is advantageous to provide proper voltage propagation within the gate poly structure to promote the horizontal movement of the electrons. FIG. 19H shows a preferred embodiment for providing such voltages so as to encourage the horizontal movement of the electrons towards the source region. Referring to FIG. 19H, one elongated gate (G-A) is depicted, and it is understood that electrons are to be moved horizontally, right-to-left in FIG. 19H to be collected at the n+ source S-A. Preferably gate G-A is always pulled high from one end and pulled down from the other end, such that a constant potential slope exists along the relatively long gate structure, end-to-end. The potential slope introduces a constant electrical field in the horizontal direction, which advantageously substantially improves electron collection.

The resistance and the parasitic capacitance associated with the gate must not be neglected, and applicants investigated the resistance difference for a doped and un-doped poly gate structure so as to optimize the design with an effective poly doping level. The poly doping level can be controlled using n+ block layers and salicide block layers described earlier herein.

Figure 19I:
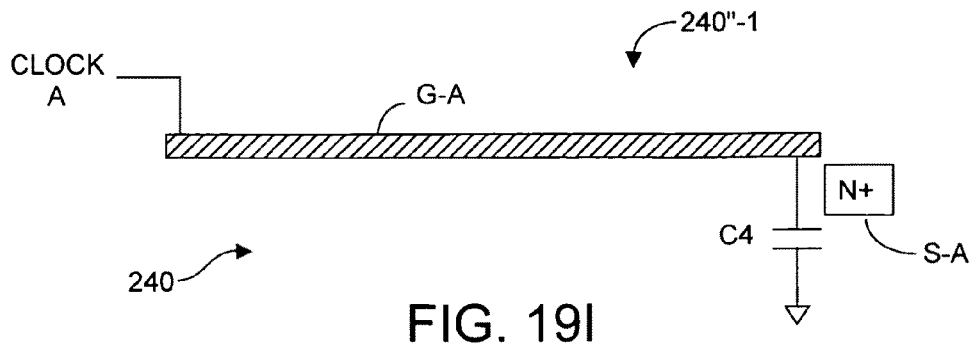
FIG. 19I depicts a preferred mode of charge sweeping the elongated gate of a sensor structure such as depicted in FIG. 19A, according to embodiments of the present invention.

Referring now to FIG. 19I, one can couple an extra capacitor (C4) to the poly such that the parasitic resistance, C4 RC time constant slows gate voltage transient time, which in turn improves the electron movement and collection. The resultant charge sweeping embodiment is as shown in FIG. 19I.

Figure 19J:
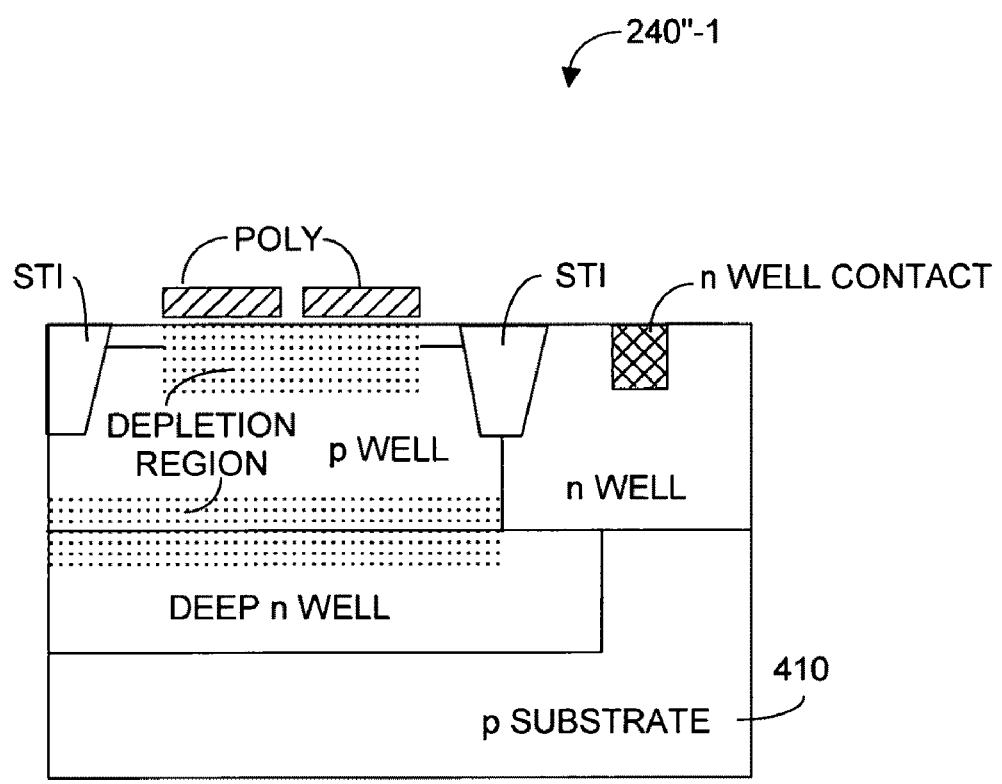
FIG. 19J depicts a preferred triple well structure with enhanced common mode performance for a sensor structure such as depicted in FIG. 19A, according to embodiments of the present invention.

FIG. 19J shows a deep n well/triple well structure used to implement an embodiment of sensor 240"-1, as shown for example in FIG. 19A. The resultant implementation advantageously reduces common mode electrons, and enhances detection performance. As noted, detection-generated photons are absorbed by the silicon substrate 410 and are converted into electron-hole pairs. This conversion can occur deep into the substrate even though the conversion probability decreases as the distance from the silicon surface increases. If electron hole pairs are generated inside a depletion region, they will be separated by the electrical field and electrons (or holes in some cases) will be collected efficiently. This collection process is relatively fast and has rather high efficiency due to the existence of the electrical field. But the electronhole pairs are generated outside the depletion region; collection efficiency is low because the carriers' movement is based on thermal diffusion with random direction. In practice, electrons and holes can recombine before they are collected, and thus do not contribute to the desired detection signal.

In FIG. 19J, structure 240"-1 preferably has a depletion region created directly under a MOS gate structure when the gate (here shown as two adjacent poly gates) is biased at a voltage higher than the MOS threshold voltage. The depletion region starts from the silicon-gate oxide interface (not depicted explicitly) and extends downward into the substrate. The depth of the depletion region depends on the gate voltage and the substrate doping level and profile, and using current technology is normally less than about 1 μm.

Electron-hole pair generation resulting from photons depends upon the wavelength of the incoming optical energy, and typically more electrons are generated deeper into the substrate with longer wavelength optical energy. Since emitter 220 in FIG. 3 preferably emits infrared (IR) or near IR, it typically requires a longer time for electrons generated outside the depletion region to reach the depletion boundary and be collected, due to the slow diffusion process. If this is allowed to occur, such electrons are more likely to contribute to the common mode signal than to the differential mode signal, thus degrading performance of sensor 240"-1.

The structure of FIG. 19J should reduce the common mode electrons, by providing a deep N well/triple well structure. In this embodiment of sensor 240"-1, a second depletion region is formed around the junction of p well and deep n well. The resultant structure will absorb common mode electrons generated deep within the silicon substrate, and will prevent these electrons from reaching the first depletion region. The deep n well preferably is biased through the n well at the side of the p well.

Additional optimization to the structure of FIG. 19J can be made as follows. P well doping level is normally around $10^{17}/cm^3$ but be reduced to about $10^{15}/cm^3$ by using a p well block layer as described earlier herein with respect to the differential charge transfer embodiments of the '408 application. Decreasing the p well doping increases the depth of the first depletion region, which increases the differential signal and also reduces power consumption of system 200 (see FIG. 3). The doping profile of the p well can also be controlled such that a gradual doping concentration decreases from the top, to help electrons move upward due to diffusion. Such doping profile therefore helps the first depletion region attract more electrons.

To recapitulate, the various embodiments disclosed in the '422 application provide a two-stage charge collecting sensor structure. Detection-generated charge is first moved in the X-direction (see FIG. 19A), toward a gate that is at a high clock potential at the time. The time needed for the electrons to be collected should be less than a half cycle of the modulation frequency of generator 225 (see FIG. 3), otherwise the electrons will contribute undesirably to the common mode signal instead. Since the electrons only need travel locally in the structure of FIG. 19A, and since the distance between adjacent elongated (or finger-like) gates is small and the electric field is intense, the number of common mode electrons is therefore substantially reduced. The advantages of structure 240"-1 become even more pronounced as the modulation frequency increases. A calculation based on electron saturation velocity shows that modulation frequency can be as high as $10^9$ Hertz, which is far above present implementation capabilities.

As noted, in the second stage, the locally collected electrons are transported to the N+ diffusion source in the Y-direction. The associated time requirement is much slower, perhaps 10 μs. Advantageously the structure utilizes the built-in surface potential to hold the collected electrons and uses a small potential slope to move the electrons in the Y-direction. Even though the electrons travel a much longer distance in the second phase Y-direction, modulation frequency requirements are not limited by the second stage collection process. The use of a two-stage collection detector structure advantageously relieves stringent time requirements associated with a high-speed modulation environment by only requiring a fast local collection, and therefore enables higher modulation frequency. The configuration of FIG. 19A could be modified to produce other structures that provide the advantages of two-stage charge collection.

The various embodiments disclosed in application Ser. No. 60/400,002 will now be described. Such embodiments can result in the generation of color images using a CMOS sensor, without the use of color filters. Instead, the photoelectrical properties of silicon are used to separate detection signals that are generated by different wavelengths of light, collectively impinging upon a photodetector sensor, useable as sensor 240 in FIG. 3. As will be described, such sensors can be dynamically electrically programmed using control signals to govern which incoming wavelengths of optical energy are assigned to each signal. Successive application of a series of control voltages enables an estimate of the power spectrum of the object being observed, for example target object 20 in FIG. 3. This in turn allows the camera or sensor to obtain data from a scene in ways not possible for prior art RGB cameras, and advantageously gives rise to new applications, described later herein.

Referring now to FIG. 20A, the coefficient of absorption of silicon K(λ) is a function of the wavelength λ. The generation of photo charges by a ray of normal light impinging upon a silicon substrate varies as a function of depth x inside the silicon. In the vicinity of the visible spectrum K(λ) decreases rapidly with increasing wavelength λ. FIG. 20A depicts the absorption coefficient K(λ) for wavelength λ between 400 nm and 900 nm.

The number of photo charges P per unit volume of silicon generated as a function of depth x is given by $$P = P_0 e^{-xK(\lambda)} \tag{1}$$

where $P_0$ is the number of photons at the silicon surface.

Since K(λ) decreases with wavelength λ, the depth x in the silicon at which most of the photocharges are generated increases with wavelength. FIG. 20B shows a typical generation profile for a comparatively short wavelength of 400 nm, while and FIG. 20C shows the generation profile for a longer wavelength of 650 nm. The light beam is assumed to be from top to bottom in the center part of each silicon block. The shaded areas show where photoelectrons are generated, where a darker shade indicates a greater number of generated photoelectrons. If light with both 400 nm and 650 nm wavelengths with same intensity is present, the photoelectrons generated near the surface will be predominantly from the 400 nm light component whereas the photoelectrons generated deeper in the silicon will be predominantly from the 650 nm component. The spectral composition of the incoming light can be determined if one can distinguish electrons generated close to the surface of the silicon detector, from those generated deeper within the silicon substrate.

Figure 20D:
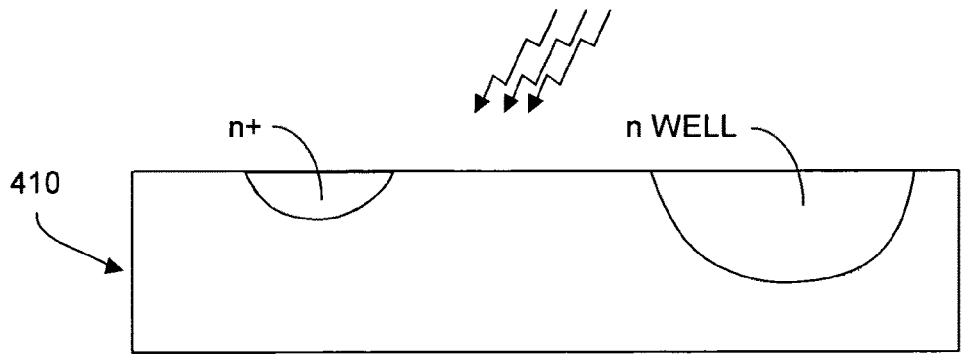
FIG. 20D depicts static depth sensitivity charge collection in a semiconductor sensor, according to the prior art.

One way that electrons generated close to the surface of a silicon structure can be distinguished from electrons generated deeper in the silicon is to provide electron collection points at different collection depths within the silicon. This can be accomplished by using different kind of photodiodes that favor collection at different depths. For example a shallow diffusion-substrate photodiode will have its depletion region near the surface and thus preferably collect electrons from the silicon surface, whereas a deep well-substrate photodiode will have a deeper depletion region and thus also collect electrons from deeper in the silicon. FIG. 20D shows a silicon p type substrate with an n+ diffusion region and an n well diffusion region. Note that the depletion region for the n well extends considerably more deeply into the silicon material, and hence the proportion of photoelectrons collected from longer wavelengths will be greater in this region.

Figure 20E:
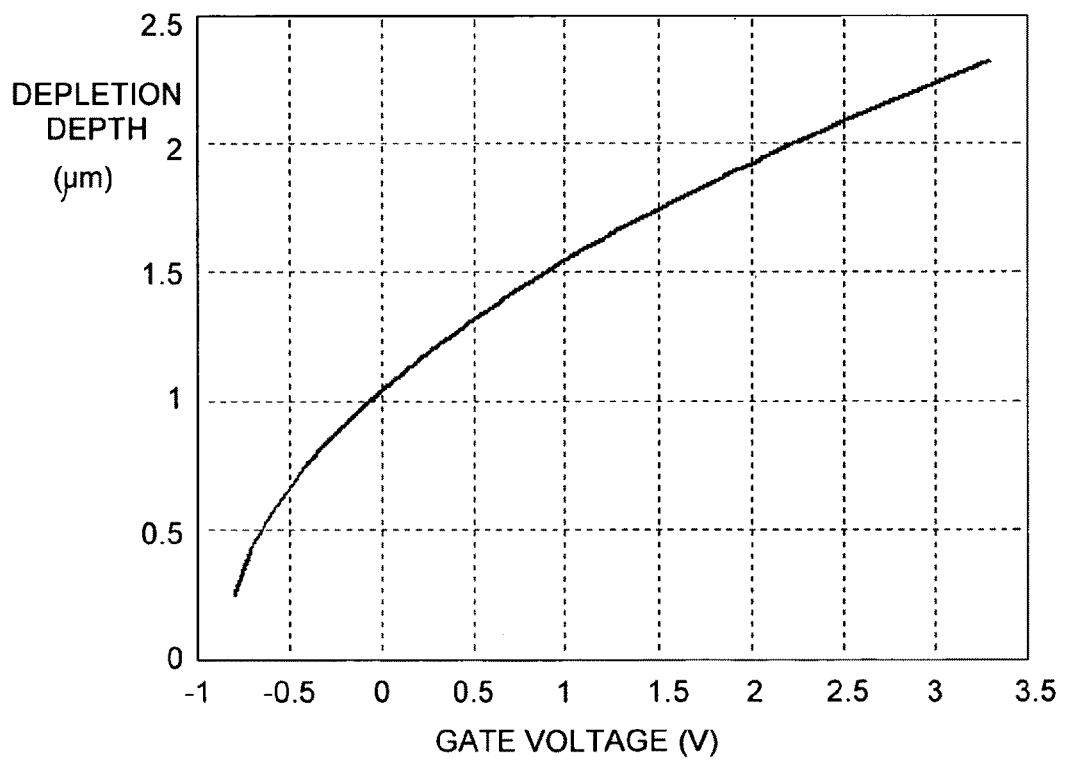
FIG. 20E depicts photogate depletion depth as a function of gate bias potential for a semiconductor sensor, according to the prior art.

Another way to distinguish between electrons generated close to the surface of a silicon structure from electrons generated more deeply within is to use a photogate structure. As shown by FIG. 20E, a depletion region is generated beneath the photogate, which is biased at a positive voltage, where depletion depth is a function of photogate bias voltage. In embodiments of the '002 application, applicants use such a photogate structure to dynamically electrically program the charge collection depth for a sensor including such photogate.

Photoelectrons generated inside the depletion region are accumulated beneath the photogate due to the existence of an electrical field. The amount of integrated charge that can be readout later represents the light or optical power. Assume that all electrons generated inside the depletion region are collected, where gate voltage is v, and thus depletion depth will be d(v). The total charge will then be:

$$N(\hat{v}) = \int_{\lambda_{min}}^{\lambda_{max}} \int_0^{d(v)} P_0(\lambda) e^{-xK(\lambda)} dx d\lambda \quad (2)$$

where $P_0(\lambda)$ represents the input light spectrum from $\lambda_{min}$ to $\lambda_{max}$. From equation (2) above, it is seen that by changing the gate voltage v, one can electrically control the depletion depth d(v), and thus one can distinguish between electrons generated close to the surface of the silicon structure from electrons generated deeper within the silicon. As a result, the spectral composition of the incoming light $P_0(\lambda)$ can be determined.

Assume that the input image being detector or sensed has a spectrum distribution of $P_0(\lambda)$. The challenge is to estimate the spectral composition from multiple measurements $N(v_i)$, and to present, for example, the estimate using three primary color components (RGB) for most digital color imaging applications. The RGB color components are the integration of the image spectrum within three bands:

$$B = \int_{\lambda_0}^{\lambda_1} P_0(\lambda) d\lambda \quad (3)$$

$$G = \int_{\lambda_1}^{\lambda_2} P_0(\lambda) d\lambda$$

$$R = \int_{\lambda_2}^{\lambda_3} P_0(\lambda) d\lambda$$

The ith measurement, $N(v_i)$, which is the total charge collected with gate voltage $v_i$ can be represented as:

$$N(v_i) = \int_{\lambda_0}^{\lambda_3} \int_0^{d(v_i)} P_0(\lambda) e^{-xK(\lambda)} dx d\lambda \quad (4)$$

$$= \int_{\lambda_0}^{\lambda_1} \int_0^{d(v_i)} P_0(\lambda) e^{-xK(\lambda)} dx d\lambda +$$

-continued $$\int_{\lambda_1}^{\lambda_2} \int_0^{d(v_i)} P_0(\lambda) e^{-xK(\lambda)} dx d\lambda +$$

$$\int_{\lambda_2}^{\lambda_3} \int_0^{d(v_i)} P_0(\lambda) e^{-xK(\lambda)} dx d\lambda$$

$$\approx \int_{\lambda_0}^{\lambda_1} P_0(\lambda) \left[1 - e^{-d(v_i)\overline{K}_1}\right] d\lambda +$$

$$\int_{\lambda_1}^{\lambda_2} P_0(\lambda) \left[1 - e^{-d(v_i)\overline{K}_2}\right] d\lambda +$$

$$\int_{\lambda_2}^{\lambda_3} P_0(\lambda) \left[1 - e^{-d(v_i)\overline{K}_3}\right] d\lambda$$

$$= \left[1 - e^{-d(v_i)\overline{K}_1}\right] B + \left[1 - e^{-d(v_i)\overline{K}_2}\right] G + \left[1 - e^{-d(v_i)\overline{K}_3}\right] R$$

where $\overline{K}_1, \overline{K}_2, \overline{K}_3$ are the average absorption coefficients inside each band. Therefore, with total n measurements, the RGB components of the image can be estimated as follows:

$$\begin{pmatrix} N(v_1) \\ N(v_2) \\ \vdots \\ N(v_n) \end{pmatrix} = \begin{pmatrix} 1-e^{-d(v_1)\overline{K}_1} & 1-e^{-d(v_1)\overline{K}_2} & 1-e^{-d(v_1)\overline{K}_3} \\ 1-e^{-d(v_2)\overline{K}_1} & 1-e^{-d(v_2)\overline{K}_2} & 1-e^{-d(v_2)\overline{K}_3} \\ \cdot & \cdot & \cdot \\ 1-e^{-d(v_n)\overline{K}_1} & 1-e^{-d(v_n)\overline{K}_2} & 1-e^{-d(v_n)\overline{K}_3} \end{pmatrix} \begin{pmatrix} B \\ G \\ R \end{pmatrix} \quad (5)$$

From equation (5) above, the right hand RGB vector can be solved. If n=3, the coefficient matrix in front of the RGB vector is a square matrix that can be inverted. If n>3, a least square method can be used to generate the RGB vector with minimum mean square error (MSE). For n=3, the solution is given by equation (6) as follows:

$$\begin{pmatrix} B \\ G \\ R \end{pmatrix} = \begin{pmatrix} 1-e^{-d(v_1)\overline{K}_1} & 1-e^{-d(v_1)\overline{K}_2} & 1-e^{-d(v_1)\overline{K}_3} \\ 1-e^{-d(v_2)\overline{K}_1} & 1-e^{-d(v_2)\overline{K}_2} & 1-e^{-d(v_2)\overline{K}_3} \\ 1-e^{-d(v_3)\overline{K}_1} & 1-e^{-d(v_3)\overline{K}_2} & 1-e^{-d(v_3)\overline{K}_3} \end{pmatrix}^{-1} \begin{pmatrix} N(v_1) \\ N(v_2) \\ N(v_3) \end{pmatrix} \quad (6)$$

In practice, the 3×3 matrix in equation (6) is obtained empirically through sensor calibration process. From the foregoing analysis, a sensor provided with a photogate structure can provide flexibility in designing color pixels. For example, using a time sequential approach, each pixel would have but one photogate structure and generation of a single color image would involve changing gate voltage several times, and performing multiple measurements sequentially. Such measurements are processed according to the above analysis to obtain estimates of RGB color components in the object or target object being sensed.

Referring to equation (6), the extreme right hand column vector represents detection values read-out (during a readout interval) from source regions 630 in detectors 240'''. The vector at the far left of equation (6) represents parameters computed, e.g., by processor 160, that represent one or more spectral characteristics. If there is only one computer parameter, then at best only brightness (intensity) of the incoming optical energy is known. If additional parameters are computed, each additional parameters contributes at least one spectral characteristic of the detected optical energy, e.g., the ratio of two colors, e.g., red:blue, in the detected signal. If there is a third computed psrameter, then two characteristics of the spectral response are known, e.g., the relation between red, green, and blue spectral components in the detected signal.

In a spatial sequential approach, each pixel has more than one photogate, with each gate having a different magnitude of gate voltage. Multiple such measurements are captured at the same time for processing to generate the color image.

Figure 21A:
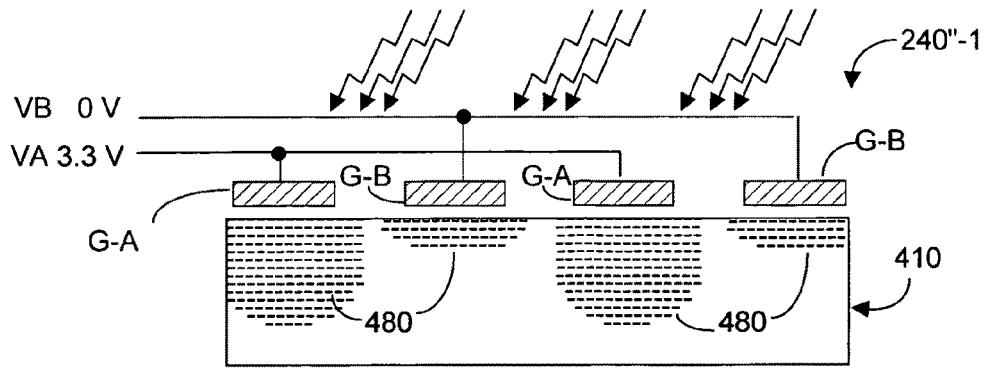
FIGS. 21A and 21B are cross-sections of a sensor detector structure showing an embodiment of the '002 application with variable-depth depletion regions and variable wavelength detection characteristics, according to embodiments of the present invention.

FIG. 21A is a cross-section of a sensor structure 240"-1, which may be used as sensor-detectors 240 in FIG. 3, for collection of non-polycided gates at a high potential of 3.3 V. Within silicon substrate 410, field lines terminate on a gate G-A or on a gate G-B. Since gates G-A and gates G-B are at the same voltage, 3.3 V on all gates in this example, the set of points whose field lines that terminate on G-A (respectively B) is the set of points in the silicon that are closer to G-A (respectively B). It is understood that the field lines will relatively weaker far from the upper surface of silicon substrate 410.

Associated with set of points in the silicon substrate whose field lines terminate on G-A will be a fairly deep depletion region 480, while field lines on all other points in the substrate terminate on G-B. Note that even when gates G-B are at 0 V bias, a depletion region 480 exists, albeit a shallow region. Under the bias conditions shown in FIG. 21A, the relatively deep depletion region below and extending laterally about gates G-A are useful in collecting photocharges generated relatively deep within substrate 410, and thus sensitivity to incoming optical energy of longer wavelength is enhanced. As before, incoming optical energy to be detected or sensed is shown as zig-zag lines.

Figure 21B:
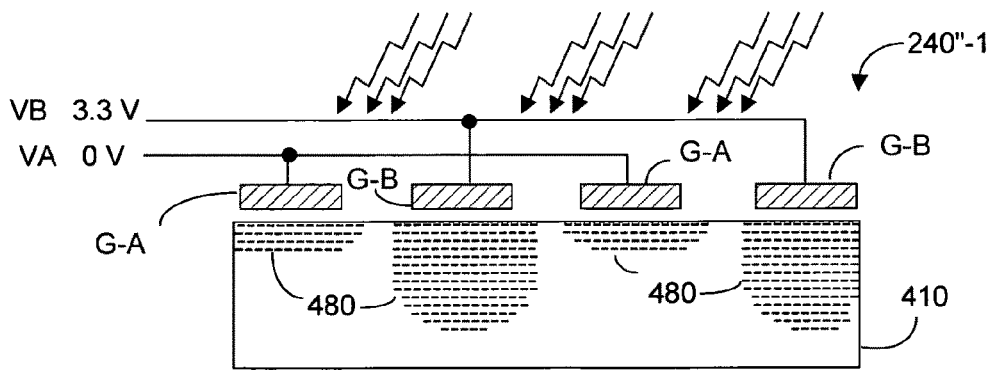

Compare now FIG. 21B in which the potential on gates G-A is reduced to a relatively low magnitude, 0 V, but potential on gates G-B remains at a relatively high magnitude, 3.3 V. The depth of the depletion regions associated with gates G-A shrinks (but remains' as a shallow region), and thus gates G-A no longer serve to collect photocharge generated from relatively deep within silicon substrate 410. Thus gates G-A will now collect charge only from relatively shallow depths within the substrate, and will be more sensitive to incoming optical energy of shorter wavelength, and substantially less sensitive to optical energy of longer wavelength. But gates G-B are now biased at high potential, e.g., 3.3 V in this example, and the associated depletion regions 480 extend deeply into substrate 410, and serve to collect even longer wavelength optical energy.

Figure 21C:
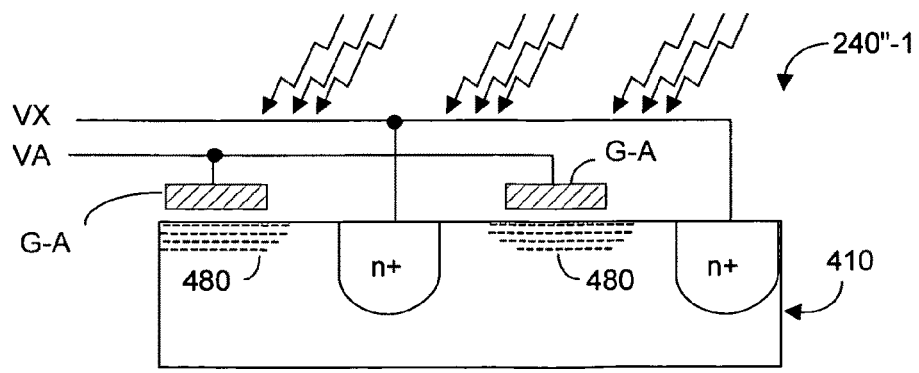
FIG. 21C is a cross-section of a sensor detector structure showing an alternative embodiment of the '002 application with variable-depth depletion regions and variable wavelength detection characteristics, according to embodiments of the present invention.

Consider now sensor structure 240"-1 shown in cross-section in FIG. 21C. Rather than electrically control every collection signal, one or more of the signals may be collected by regular fixed-voltage photodiodes structures. In this embodiment, the potential coupled to gates G-A is made voltage programmable, whereas the voltage coupled to gates G-B while signal B is a fixed potential, here denoted VX. Thus, the collection depth associated with gates G-A can be varied by varying magnitude of the gate bias, which means sensitivity to optical energy of different wavelength can be varied by controlling the bias coupled to gates G-A. By contrast, the collection depth associated with gates G-B is fixed by the non-varying amplitude of bias VX, and thus the sensitivity to incoming optical energy will be static for incoming optical energy whose wavelengths create charge that is favorably collectable within that region.

Figure 21D:
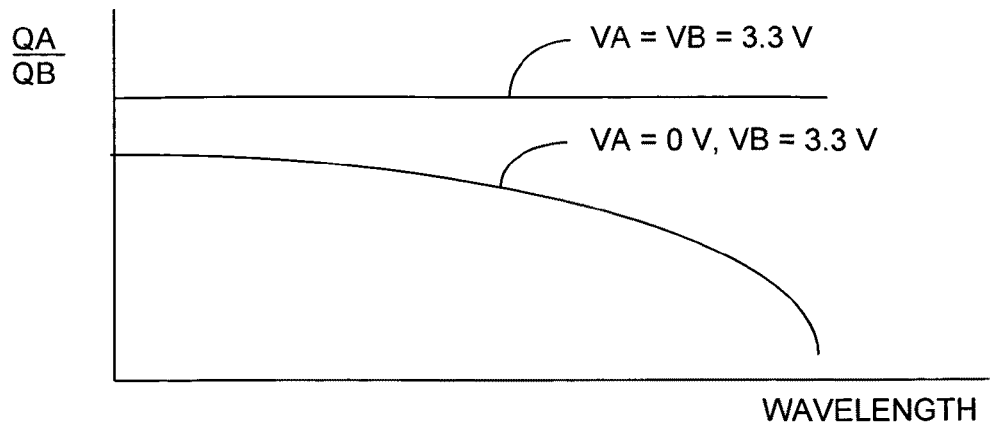
FIG. 21D is an exemplary curve of QA/QB ratio versus wavelength for different gate bias voltages, useful with embodiments of the '002 application, including embodiments shown in FIGS. 21A-21C, according to embodiments of the present invention.

In FIG. 21C, the ratio QA/QB of charge collected by gates G-A and G-B permits determining the color of the optical energy (shown as zig-zag lines) impinging upon the upper surface of structure 240"-1. Turning now to FIG. 21D, each setting of gate voltages VA and VB corresponds to a response curve QA/QB. For VA=VB the response curve is flat and is independent of wavelength. For VA=0 V, VB=3.3 V, the response curve drops off rapidly for higher wavelength since gate G-A is less able to collect photocharges from deep within silicon, substrate 410. Clearly allowing VA and VB to have various magnitudes will generate different response curves QA/QB. A set of response curves QA/QB forms a basis set with which wavelength of incoming optical energy sensed by structure 240"-1 can be measured. By combining the response for multiple curves, new QA/QB response curves with different spectral responses can be synthesized. For example by judiciously combining different curves, spectral responses that mimic RGB filters can be created. This aspect of the present invention permits structures such as 240"-1 to resolve a vast number of colors in an sensed image, but without requiring filters.

The above-described approach produces a single spectral response curve per measurement. But combining more than two classes of signals (e.g. A, B and C using groups of gates G-A, G-B, G-C) allows simultaneous generation of more than a single spectral response, e.g., (e.g. QA/QB and QB/QC). Thus in a single measurement step, which is to say a single integration frame, R G and B responses can be simultaneously generated.

It will be appreciated that various space and time trade-offs can be made between a number of signal classes and number of measurements to be made.

The above descriptions are directed to estimating three primary color components (RGB) from a total n measurements. Since n can be a very large number (n>>3), one can actually estimate the color spectrum using a much finer band, and thus represent the spectrum using more than three color components. Thus, embodiments of the present invention can provide a spectrum meter with programmable resolution. For example, images can be generated that have RGBI components, where I is the infrared component. There is similarity between the detector structures shown in FIGS. 19C, 19D, 21A, and 21B, and it will be appreciated that such structures may be used as detectors 240 (see FIG. 3) in systems to detection distance Z. Thus detector RBGI2 structures or pixels may be implemented.

With total n measurements and n estimates, each estimate has a bandwidth of $[\lambda_j, \lambda_{j+1}]$ and average absorption coefficient of $\overline{K_j}$.

Equation (6) above can be represented as equation (7) below as follows:

$$\begin{pmatrix} E_1 \\ E_2 \\ \vdots \\ E_n \end{pmatrix} = \begin{pmatrix} 1-e^{-d(v_1)\overline{K}_1} & 1-e^{-d(v_1)\overline{K}_2} & . & 1-e^{-d(v_1)\overline{K}_n} \\ 1-e^{-d(v_2)\overline{K}_1} & 1-e^{-d(v_2)\overline{K}_2} & . & 1-e^{-d(v_2)\overline{K}_n} \\ . & . & . \\ 1-e^{-d(v_n)\overline{K}_1} & 1-e^{-d(v_n)\overline{K}_2} & . & 1-e^{-d(v_n)\overline{K}_n} \end{pmatrix}^{-1} \begin{pmatrix} N(v_1) \\ N(v_2) \\ \vdots \\ N(v_n) \end{pmatrix} \quad (7)$$

Given the above-noted multiple spectrum estimation capability, embodiments of the present invention can maintain more than RGB in a database such that a scene or object can be rendered in many different ways. For example one might code the additional information within an RGB picture as disclosed in co-pending U.S. patent application Ser. No. 10/013,069 (assigned to Canesta, Inc.) to be backward compatible with an RGB picture.

The above described embodiments of the present invention provide many advantages over prior art color filter array (CFA) based RGB cameras or sensor. Embodiments of the present invention have a lower fabrication cost as there is no need for a special (and historically expensive) CFA deposition process during sensor fabrication. Using the described pixel sensor embodiments of the '002 application, color is sampled at the same location without need for interpolation, which avoids aliasing issues. By contrast, prior art CFA sensors sub-sample the image using perhaps a Bayer pattern, which may readily cause color aliasing. Sensor structures according to the '002 application can have more color sampling points than merely the three primary RGB color components. Such multiple sampling points provide much richer information, resulting in better estimation of the input color spectrum. This flexibility enables new applications for pixel sensor structures that go beyond prior art digital imaging. For example anti-counterfeiting measures might include color patterns that would fool conventional sensors, but not pixel detectors according to the present invention. Applicants' sensors can be electrically tunable using programmable (or fixed) gate bias potentials.

Embodiments of the present invention as described above provide several advantages over a prior art triple well RGB camera. For example, applicants' described structures provide more flexibility than the conventional triple well structures. Embodiments of the present invention can provide sensor structures whose wavelength sensitivity is dynamically electrically tunable, which advantage is not present in sensor structures using conventional triple well fabrication. Further, sensor structures according to the embodiments of enjoy higher voltage swings and higher dynamic range compared to prior art triple well structures. Voltage swings in such prior art triple well structures are limited due to reverse bias constraints for all the p-n junctions. Furthermore, properly biasing the n-p-n-p structure means ensuring that each junction does not have excessive voltage swing. This voltage constraint means depletion regions will be narrower, which in turn results in lower quantum efficiency. In addition to having small voltage swings, prior art triple well structures use very high doping levels. Such doping levels result in relatively small depletion regions and small QE. Further, high doping and heterogeneous structures produce undesirably high dark current. In addition, prior art triple well structures require three sets of reset and readout circuits, which contribute to a low fill factor.

Advantages of applicants' color sensor structure include matching and classification applications. For example prior art stereographic camera systems use two imagers (each acquiring its own image from a separate vantage point) to generate range information, and must perform a stereo disparity process. Such process first tries to match the corresponding pixels from left and right imagers, and then attempts to calculate range from the pixel coordinate disparities. But embodiments of the present invention can provide more color components in each pixel than merely RGB components, and should thus reduce ambiguity in the matching process to yield more precise range information. The same advantages are useful in object classification, where the additional color components enable better edge pixel distinction.

The ability of the invention of the '299 application (the '793 patent) to capture a broader spectrum with very fine resolution provides advantages in manipulation of object lighting. For example if objects in the scene are illuminated with more than two light sources, applicants' sensor structure can be used to remove from the acquired scene effects of one set of light sources that have particular spectral characteristics. In such application the sensor structure functions as a notch filter to reduce or eliminate undesired spectral components. For example, fluorescent light consists of mainly several discrete spectral components, while incandescent light has a broad spectrum. Applicants' sensor structure enables manipulating an image captured with both light sources and, if desired, rendering the image as though it were illuminated solely with incandescent light. In essence, the ability to electronically tune the spectral response of a sensor structure according to embodiments of the present invention can filter-out undesired lighting effects.

Figure 22A:
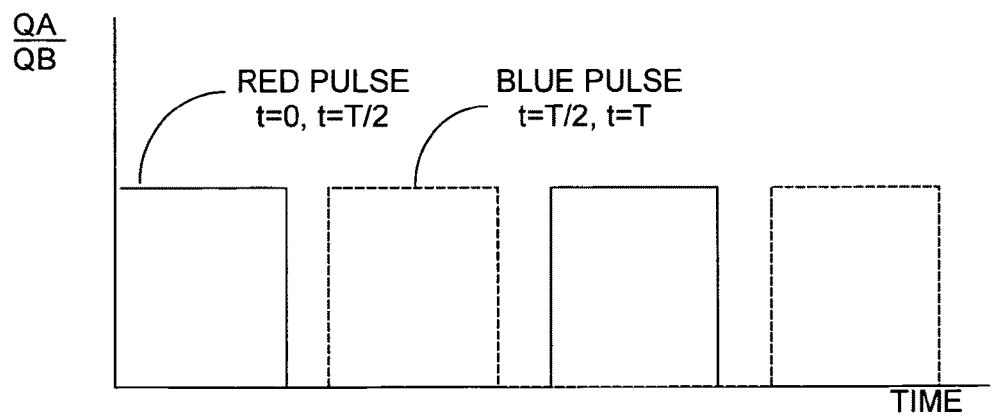
FIG. 22A depicts red and blue complementarily modulated signals with which embodiments of the present invention may be practiced.
Figure 22B:
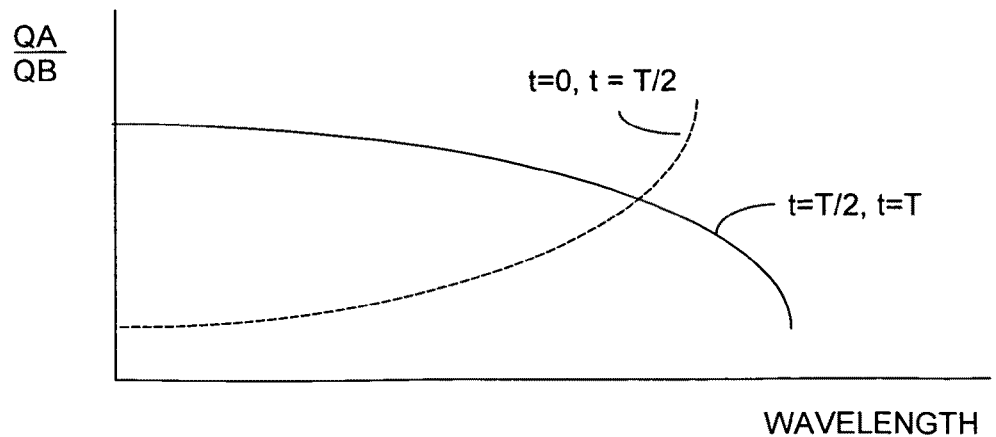
FIG. 22B is an exemplary curve of QA/QB ratio versus wavelength for a system in which source luminosity is constant but source color or chroma is modulated, according to embodiments of the present invention.

Applicants' sensor structures can also be used in demodulating chromatic signals. Provisional patent application Ser. No. 60/254,873, assigned to Canesta, Inc. described a method for detecting a luminosity-modulated signal. In a somewhat analogous fashion, embodiments of the present invention can be used to detect a chromatic modulated signal and to determine its phase and amplitude. FIG. 22A depicts red and blue signals that ideally are assumed to be exactly complementarily modulated, although less than 50% duty cycle is depicted for clarity of illustration. As such, luminosity of the source remains constant but the color (chroma) of the source is modulated. FIG. 22B depicts two different spectral response curves that can be achieved with embodiments of the present invention by selecting appropriate gate G-A and/or G-B bias potentials. The two response curves shown in FIG. 22B may be comparable in overall sensitivity across the entire spectrum of interest. In practice, overall system response is set to alternate between the two response curves at a frequency that is exactly equal to the chroma modulation frequency of the light source. Maximum overall demodulated response occurs when the red response curve is active when the red light source is operating, and the blue response curve is active when the blue light source is operating.

The various embodiments of the '299 application) the '793 patent) have now been reviewed. Although the finger-like gate structures exemplified by FIG. 19A promoted charge collection efficiency, the present invention provides still further improvement. One issue with the detector of FIG. 19A is that the close proximity of the STI to the source regions permitted dark current to flow within the STI-diffusion interface. Also, trap sites within the STI existed, which created an undesired time lag for photo-emitted electrons that became trapped in such sites for a while. Further, the modulation contrast for such detector structures would degrade as higher voltage levels were used to enhance retention of collected charge.

These areas of improvement have now been addressed in various embodiments of the present invention, depicted commencing with FIG. 23A. It is understood with reference to the present invention that gates G-A and G-B are coupled to receive G-A and G-B bias clock signals that can be synchronously generated, with respect to phase and frequency, from a master clock generator, which master clock generator also controls optical energy emitter 220. As such, frequency of the G-A and G-B bias clock signals need not be identical to frequency of the master clock generator, but they will be synchronously related. Similarly, phase of the G-A and G-B bias clock signals will be synchronously related to the master clock generator signal. One could, of course, use separate generators for each (or some) of these signals if the proper signal relationships were maintained. FIG. 23A is a cross-section of a sensor detector structure 240"-1 according to the present invention, with a plot of surface potential at the silicon-gate oxide interface versus position along the X-direction, for example a sensor structure such as shown in FIG. 19A. As with earlier described embodiments, charge transfer collection gates A (G-A) and charge transfer collection gates B (G-B) preferably are interleaved elongated or finger-shaped gate structures 620. The nomenclature gate A and gate G-A, gate B, and gate B-G may be used interchangeably, and descriptions of gate G-A are applicable to gate G-B, and vice versa. Two magnitudes of gate A potential are shown, 2.0 V and 3.3 V, with a constant 0 V gate B potential. For 2.0 V gate A potential, surface potential is drawn with solid lines, and is a somewhat idealized profile with relatively little potential migration left and right along the X-axis relative to location of the A gates G-A. Phantom lines are used to depict the 3.3 V gate G-A potential profile.

In FIG. 23A, consider the case of 2.0 V potential for gate G-A. Under this bias condition, charge-generated electrons under the gate G-B region are trapped. (The trapped electrons are depicted as encircled minus signs.) Trapping occurs because escape from this region requires the electrons to first overcome the potential barrier represented by solid line profile representing the 2 V bias. For the trapped electrons to migrate left or right in FIG. 23A requires overcoming regions of increasing negative potential, e.g., the solid line profile becomes more negative in the left or right direction. But this negative potential tends to repel the electrons, which remain trapped beneath the gate G-B region, as shown. A potential barrier as low as perhaps 100 mV will be sufficient to prevent electron migration as the thermal energy associated with the trapped electrons is insufficient to overcome this barrier. As a result, the electrons will remain trapped beneath the G-B regions, as shown in FIG. 23A.

The term modulation contrast (MC) denotes a measure of collection efficiency. As such, the term modulation contrast does not refer to dark or light contrast of an image that may be acquired by the present invention. High modulation contrast is desired for high performance sensor applications. But in a high modulation contrast application, it is desired to elevate gate potential G-A to a higher level, e.g., to 3.3 V rather than 2.0 V. But elevating gate potential G-A to 3.3 V causes the potential profile to take on the appearance represented in FIG. 23A by the phantom lines. Unfortunately the resultant potential barrier is insufficient to keep charge-generated electrons associated with (or trapped beneath) gate G-B from being attracted to gate G-A. Looking at the phantom line potential profile in FIG. 23A, migration of the trapped electrons laterally no longer requires overcoming an increasingly negative potential profile; the profile is in fact increasingly positive, a condition favorable to movement of electrons. As a result, charge-generated electrons associated with gate G-B cannot be held (or trapped) in that region and will migrate to gate region G-A. An undesired result is that effective charge collection is impaired, and detector performance is degraded, which is to say modulation contrast decreases.

Note in the above example that the barrier that existed when gate potentials G-A=2.0 V and G-B=0 V disappeared when gate potential G-A was raised to 3.3 V. Conversely the voltage barrier that may exist at gate potentials G-A=3.3 V and G-B=1.0V will disappear when gate potential G-B is lowered to 0 V. One aspect of the present invention is directed to maintaining a potential barrier when the high magnitude of the gate potential is increased or the low magnitude of the gate potential is decreased. Operation of the detector system at these upper and lower extremes of gate potential is desirable in that detector performance is enhanced.

Figure 23B:
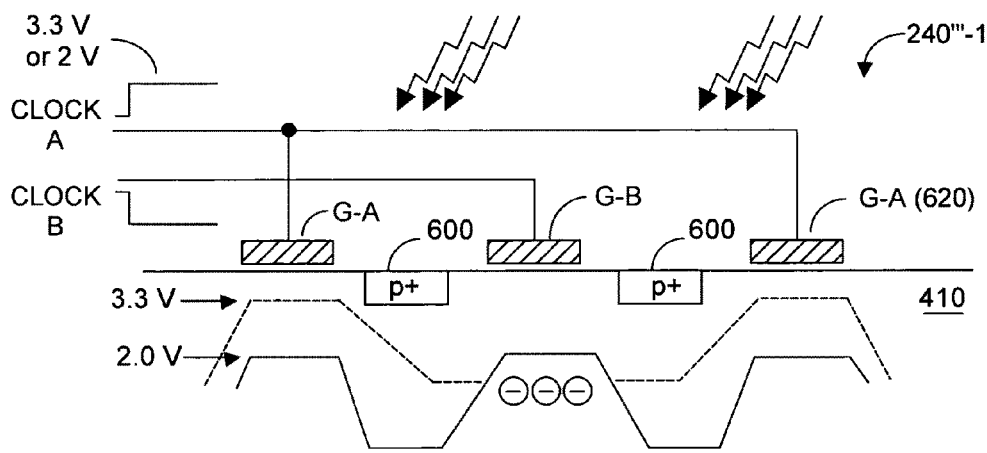
FIG. 23B is a cross-section of a sensor detector structure with a plot of surface potential at the silicon-gate oxide interface versus position along the X-direction, depicting enhanced high gate potential robustness of a detector structure provided with implanted barrier regions, according to embodiments of the present invention.

In the embodiment of the cross-sectional view shown in FIG. 23B, a sensor detector structure 240'''-1 is provided with implanted regions 600 that act as potential barriers. If one could see these implanted regions from the top of the detector substrate, they would appear to be longitudinal or finger-shaped, parallel and interleaved between adjacent finger-shaped polysilicon gates GA, GB. These potential barriers reduce migration of charge-generated electrons between adjacent finger-shaped gates, e.g., from G-A to G-B and vice versa. In the embodiment shown, structure 240'''-1 includes finger-shaped p+ doped regions 600 that act as an voltage barrier to undesired charge migration, even in the presence of large (e.g., 3.3 V) G-A gate potential. Further, barriers 600 advantageously reduce dark current that would be associated with other types of isolation barriers, e.g., shallow trench isolation, although in some applications shallow trench isolation may in fact be used.

Note in FIG. 23B that even at relatively high 3.3 V G-A gate potential and relatively low G-B gate potential, the presence of p+ regions 600 deepens the potential barrier between the interleaved finger-shaped G-A and G-B gate regions. The presence of the potential barrier advantageously enables detection-generated electron charge collected by gate G-B to remain trapped generally beneath the G-B region for a sufficiently long time to be collected, e.g., for a period of perhaps 100 μS to perhaps as long as a few mS. The charges trapped generally beneath the G-B region repel each other. This mutual repulsion results in the charges being collected at respective charge collection regions (see collector region 630, FIG. 23C) in the detector structure without any gate-induced horizontal electric field.

Advantageously, p+ doped implant regions 600 may be fabricated without need for critically controlled parameters such as magnitude of implant dosage and/or implant depth into substrate 410 of structure 240'''-1. Masking and doping steps used to create regions 600 may be shared with existing doping steps used elsewhere to fabricate overall structure 240'''-1.

Figure 23C:
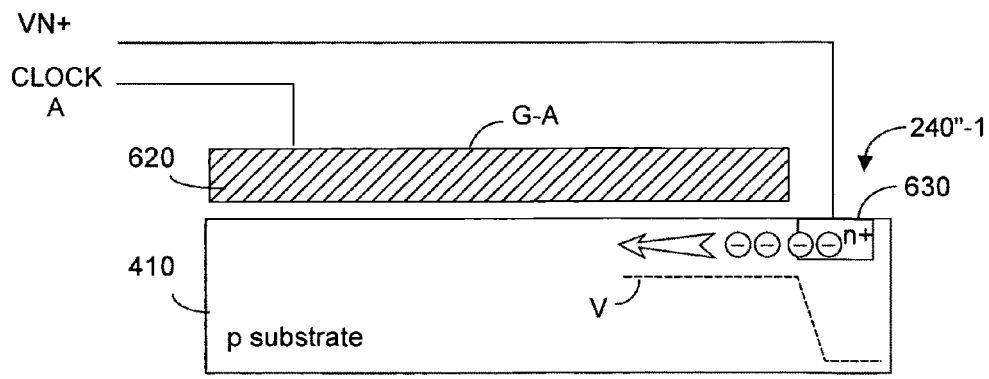
FIG. 23C is a cross-sectional view of a sensor detector structure along a finger-shaped collection G-A gate depicting loss of charge from the collector region to the G-A region if gate potential is too high absent structure modification according to an embodiment of the present invention.

As will now be described with reference to FIG. 23C, detection problems arise if charge ultimately collected at collection region 630 is drawn out by too high a gate potential at finger-shaped gate regions 620. FIG. 23C depicts structure 240''-1 cut along a preferably polysilicon finger-shaped G-A gate 620. It is understood that if gate G-A potential (drawn in phantom line) is too high, a substantial number of electrons (shown as encircled minus signs) can be drawn out of n+ collection region 630 and into the region beneath gate G-A. In FIG. 23C, the G-A potential becomes more positive in the direction of G-A relative to region 630, which potential attracts the negatively charged electrons, as suggested by the left-pointing arrow. Electrons so drawn from the desired collection region into the G-A region may overwhelm the otherwise correct detection function of structure 240'''-1, as many of these electrons may be lost to G-B gate collection regions. What is needed here is a mechanism to prevent high G-A gate potential from drawing out charge collected in n+ collection region 630. Such a mechanism is provided in the embodiment of FIG. 23D, namely bias gate 640.

Figure 23D:
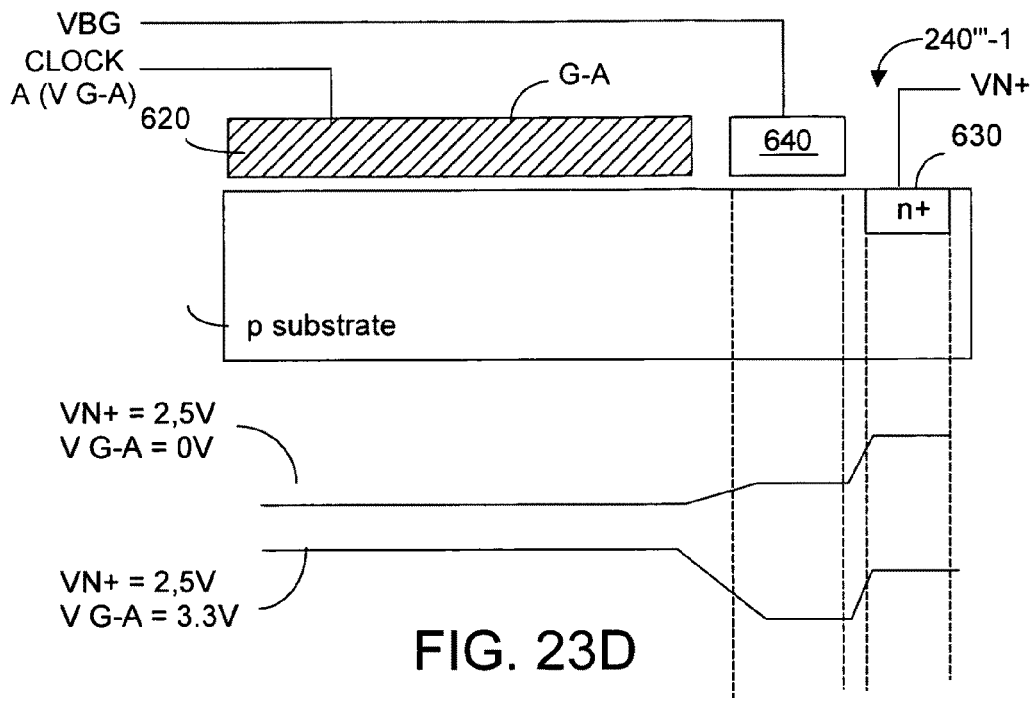
FIG. 23D is a cross-sectional view of the structure of FIG. 23C, modified to include a bias gate region to reduce loss of collected charge, and depicting surface potentials, according to embodiments of the present invention.

Turning now to FIG. 23D, a bias gate 640 has been added to structure 240''-1 in FIG. 23C, to form improved detector structure 240'''-1. Structure 240''-1 reduces or prevents charge loss from the n+ collection regions to the gate regions, even in the presence of relatively high gate potential. In the embodiment of FIG. 23D, a bias potential VN+ of about 2.5 V is coupled to n+ collection region 630, and a bias potential VBG of perhaps 1.5 V is coupled to bias gate 640. The magnitude of bias potential VBG is sufficiently low relative to magnitude of bias potential VN+ such that charges collected in bias gate 640 region will be attracted to the N+ 630 region. At the same time, bias potential VBG is sufficiently high in magnitude such that region G-A collected charges will flow in the bias gate 640 region when the modulation clock signal at gate G-A 620 is low. Preferably spacing of bias gate 640 and polysilicon gate 620 is substantially as small as can be produced by the CMOS fabrication process used to create structure 240''-1.

Also shown in FIG. 23D are potentials at the surface of silicon structure 240'''-1. The VN+=2.5 V, V G-A=0 V voltage profile is a potential regime that encourages electrons collected or trapped beneath the G-A region to move to collection source region 630 without encountering a potential barrier. The VN+=2.5 V, V G-A=3.3 V voltage profile is a potential regime in which bias gate 640 provides a potential barrier that advantageously prevents electrons collected in N+ region 630 from being pulled into the region beneath gate G-A. Thus it is seen that providing appropriate VN and V G-A bias potentials to structure 240'''-1, charge loss can be minimized if not substantially eliminated.

In an alternate embodiment to structure 240'''-1 shown in FIG. 23D, bias gate 640 may be replaced with a light p doping. The light p doping region will create a potential barrier similar to that created and described above by bias gate 640. In short, such doping has the same effect of creating a potential barrier between gates G-A (respectively G-B) and collection source 630.

Figure 23E:
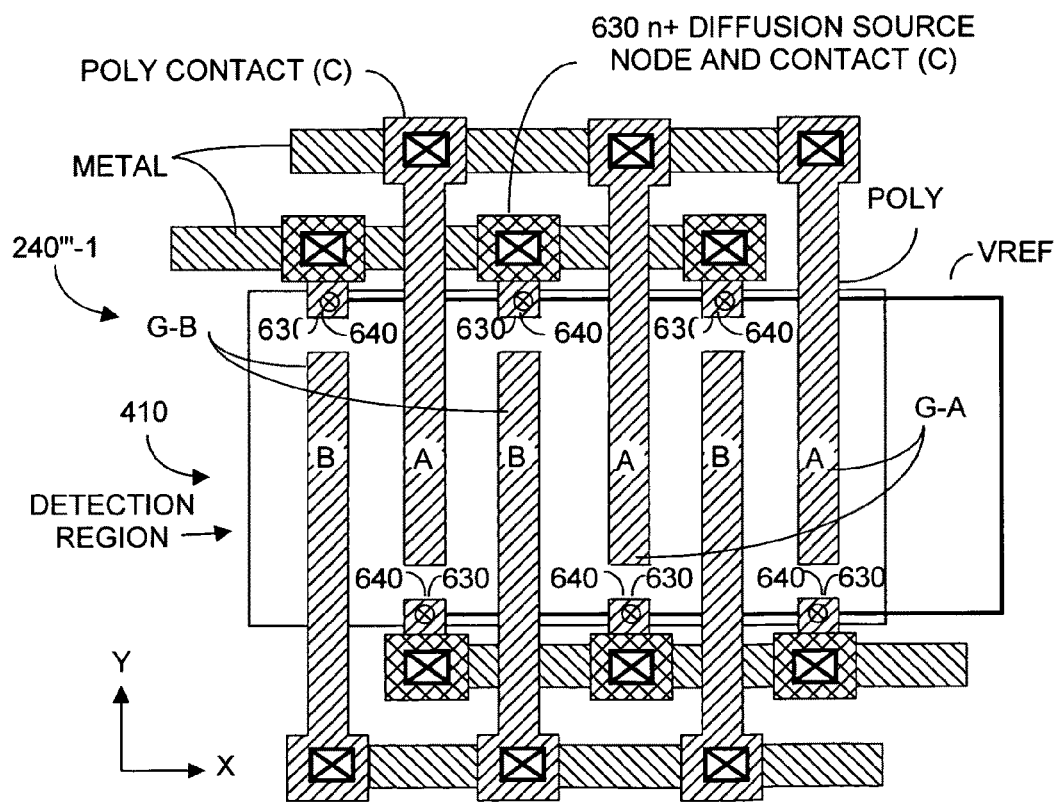
FIG. 23E is a plan view of a detector structure such as shown in FIG. 19A, but provided with bias gates, according to an embodiment of the present invention.

Turning now to the plan view of FIG. 23E, the detector structure of FIG. 19A is modified to include bias gates 640, to yield a detector structure 240'''-1 with improved charge collection characteristics. For ease of illustration, FIG. 23E does not depict the p doped barriers, and also depicting physical connections to the individual bias gates 640. Such connections are indicated symbolically as a heavy "wire", with encircled "x's" indicating electrical connection to the poly-silicon associated with elongated or long finger-shaped gates G-A or G-B. Adjacent the distal ends of finger-shaped polysilicon gate structures G-A, G-B beneath the "x" denoted contacts are bias gate 640 and collection source 630.

Note that electrons collected by a source region 630 need not be captured by gate G-A (or G-B) during a common modulation cycle of G-A (or G-B) clock signal voltage. Such electrons might have been captured by a gate a period of time ago perhaps on the order of many microseconds (µS) or perhaps milliseconds (mS). Such electrons can linger in the substrate region beneath a gate for such lengths of time until ultimately being captured by an adjacent collection source region 630. According to some embodiments of the present invention, such electrons are induced to cross over to bias gate 640 as a result of two actions: the presence of relatively larger numbers of electrons accumulated under gate regions, and the repulsion effect between these electrons.

Figure 23F:
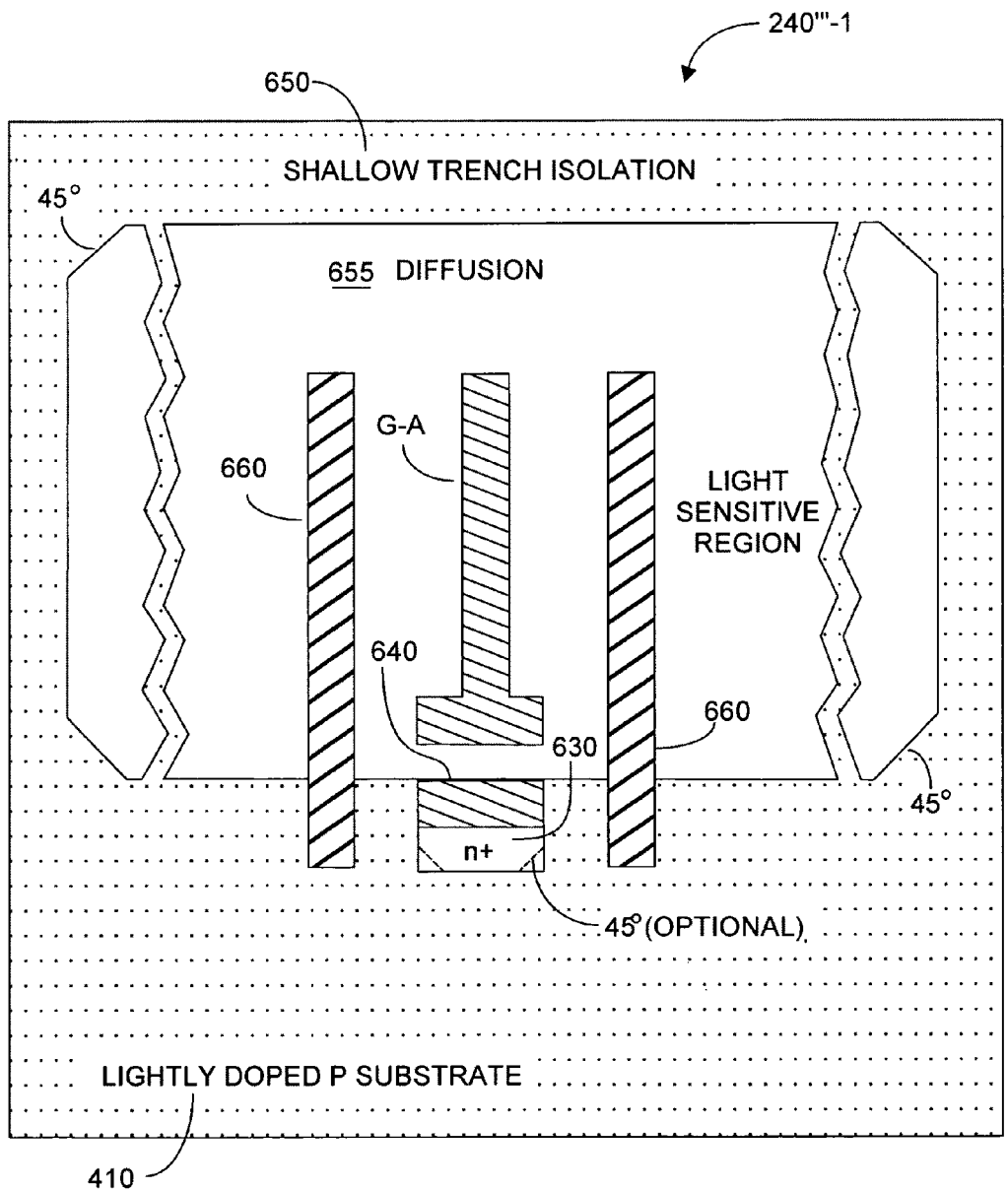
FIG. 23F is a plan view of a portion of a detector structure such as shown in FIG. 23E, but provided with a diffusion region within the shallow trench isolation, and with T-shaped gates G-A, according to an embodiment of the present invention.

FIG. 23F is a plan view of a portion of a detector structure 240'''-1 such as shown in FIG. 23E, but provided with a more optimized geometry for gates G-A, G-B, which are now "T"-shaped. This T-shape geometry improves charge collection by facilitating electron flow from G-A (or G-B) gate regions such as shown in FIGS. 23D and 23E) to bias gate region 640, and then into source collection node regions 630. This T-shaped geometry advantageously increases the length of the interface area between G-A (or G-B) gate regions, and bias gate 640. In some configurations, interface length between bias gate 640 and collection source node 630 may also be increased. Other gate geometries may be used to efficiently channel charge to be collected. Alternatively, source collection node 630 may be minimized to reduce capacitance. For ease of illustration, electrical connections are not shown in FIG. 23F. The region sensitive to optical energy will be substrate areas not covered over by metal or salicide, including preferably G-A and G-B gate regions, as shown. Note in FIG. 23F the preferred use of non-90° corners for diffusion region 655, and the optional use of non-90° corners for n+ region 630. These angles are depicted as being about 45° in the embodiment of FIG. 23F, although other preferably non-90° angles could instead be used.

Systems such as system 200 in FIG. 3 may include embodiments of the present invention to analyze or otherwise discern incoming ambient optical wavelengths of different colors, which is to say multi-spectral optical energy. As described earlier herein, device embodiments such as described with respect to FIGS. 18A-18C may be used to sense color spectra. However, other embodiments can benefit from use of the interleaved elongated finger-shaped gate devices 240''' depicted in FIGS. 23A-23G. Unless otherwise noted, the remainder of systems such as system 200 (FIG. 3) may be identical to what has been earlier described, and the mathematical analysis giving rise to color detection may be identical to what was described in the parent '017 application.

FIGS. 23H and 23I depict exemplary voltage waveforms $V_A$ and $V_B$ coupled respectively to gates G-A and to gates G-B when sensing multi-spectral ambient optical energy with a detector such as 240'''. During relatively long sub-integration periods $t_1$ (perhaps 1 mS,) the potential $V_A$ coupled to gates G-A is preferably "high" with a first magnitude, while the potential $V_B$ coupled to gates G-B is also "high" but preferably with a second, different, magnitude, to enable detector 240''' to discern optical energy of different wavelengths. During sub-integration periods $t_1$ optical energy released charge collects beneath the elongate gate structures, e.g., G-A, G-B. Many sub-integration periods $t_1$ comprise an integration period T. Preferably after each sub-integration period, the gate potentials are returned to a low state for a brief period $t_2$, perhaps a microsecond.

Sensing multi-spectral optical energy with sensors 240''' such as shown in FIGS. 23A-23G differs from color sensing with devices such as shown in FIG. 18A, primarily with respect to gate voltages $V_A$ and $V_B$. Unless otherwise noted, When using devices 240''' to detect ambient color optical energy, it is preferred that the gate voltage on the elongated fingers G-A and G-B be varied during integration, to better move collected charge beneath these gate structures to an associated source region. But if the $V_A$ and $V_B$ gate potentials coupled to G-A and G-B remained high at all times, e.g., if $t_2=0$, then the presence of bias gate 640 would oppose the desired sweeping of charges collected beneath elongated gates G-A, G-B into the associated source regions 630. See FIG. 23D, wherein when a gate voltage (e.g., $V_A$ or $V_B$) is high, electrons or charge collected beneath elongated gates G-A, G-B, cannot migrate to associated source collection regions 630. In FIGS. 23H and 23I, a relatively long integration period $t_1$ during which G-A and G-B potentials are high, e.g., $V_A$ and $V_B$ are at high levels, is followed by a typically short readout period $t_2$ during which $V_A$ and $V_B$ are at a low potential, during which short period collected charge is read-out from the device.

IThus in a preferred embodiment, and as shown by exemplary gate voltage waveforms FIG. 23H and FIG. 23I, following a typically long integration period $t_1$, the gate potential $V_A$ and $V_B$ is brought low periodically during a substantially shorter time $t_2$, to enable electrons collected beneath an elongated gate structure (G-A, G-B) to migrate to an associated source region 630 and be read-out from the detector device. It is understood that "high" and "low" reference to gate potentials is relative and for ease of illustration, the "low" potential is shown as zero volts. Conversely, the bias gate voltage could be elevated, but so doing would require that the collection region potential be at least as great as the gate potential and preferably higher than the bias gate potential. In FIGS. 23H and 23I, "high" gate potential time duration $t_1$ may be on the order of 1 ms or so, whereas "low" gate potential time duration $t_2$ can be substantially shorter, perhaps 1 µs or so. These duty cycle and time durations are exemplary and of course other time durations may be used. Having described color sensing embodiments using sensors such as depicted in FIGS. 23A-23G, a description of the fabrication of such devices will now be given. It is seen that the "high" magnitude of $V_A$ and $V_B$ preferably differ to enable respective gates G-A, G-B to discern different spectral components. In FIG. 23H, $V_A$ might be perhaps 3 V and in FIG. 23I, $V_B$ might be perhaps 1V, although these magnitudes are exemplary values.

In fabricating structure 240'''-1 as shown in FIG. 23F, total source capacitance associated with n+ source region 630 may be reduced by adding n+ dopant only adjacent bias gate 640, located adjacent the distal tip of each finger-shaped gate structure G-A, G-B. In the embodiment of FIG. 23G, total source capacitance is further reduced by providing an N+ region 630' whose width is less than the width of bias gate region 640. If desired, aspects of FIGS. 23F and 23G could be combined to reduce overall total source capacitance.

Preferably a salicide block is provided to the detector region of structure 240'''-1 (indicated in FIGS. 23F and 23G) to allow incoming optical radiation to reach the detector. As such, polysilicon elongated gates G-A and G-B preferably are non-salicided. Some applications may require more electrically conductive gates, in which case it may be desirable to allow salicide to remain on the polysilicon gates, although detection performance will be somewhat degraded as a result.

In some advanced processes, the absence of n+ in the photosensitive region can result in the gate polysilicon material having very low or perhaps zero doping. As noted, it is also preferred that salicide be suppressed in the photosensitive region of the detector structure. As a result, the gate polysilicon material may exhibit so high a resistance as to become partially nonconductive such that one cannot properly apply a rapidly varying voltage over the gate length. This problem may be somewhat remedied by applying extra doping to the polysilicon material over the light sensitive detection area without significantly affecting polysilicon elsewhere on IC chip 210. Preferable this extra doping is applied prior to polysilicon etch and thus can use a low precision mask. Alternatively a small amount of doping may be added to polysilicon over the entire IC chip. If the amount of this doping is substantially less than the amount usually used to dope polysilicon, the effect of this blanket doping may be acceptably negligible elsewhere on the IC chip.

The methodology used to create layout masks for sensor structures 240'''-1 such as depicted in FIG. 18C may be applied to more advanced sensor structure 240'''-1 such as shown in FIGS. 23F and 23G as follows. Blocking layers such as salicide block, Pwell block, n+ block, VTN block may be used as before. In producing structures 240'''-1, the salicide block will overcover the detection region to prevent polysilicon gate structures G-A, G-B from being covered with salicide. As noted, the absence of salicide improves overall detection sensitivity of the detector structure. A Pwell block is placed over the entire detector area such that gates G-A and G-B will have larger depletion regions in lightly doped p-type substrate material 410. The N+ block covers detection region 410 to prevent n+ doping between the polysilicon gate structures, which doping would substantially disturb electron collection. Similarly, a VTN block is used to prevent NLDD formation between the polysilicon gate structures. These blocking layers may be used in a generic, unmodified, CMOS fabrication process.

It should be emphasized that the above description is for an exemplary CMOS process. Modern CMOS manufacturing processes can vary in that manner in which layout masks are handled. For example, in some processes generation of layers such as n+ and Pwell is not automatic; these layers have to be drawn. In such processes, rather than usie auxiliary block layers as described above, one can place these layers where they are actually needed. For example, in fabricating embodiments of the present invention, the n+ layer would only be placed over the source collection regions, and nowhere else on the detector structure. The VTN block may not even be required if the absence of n+ implant over the detection region implies no threshold or NLDD implants in this region. Thus the actual layout masks required to implement the detector structures described here may vary somewhat with the process. However a goal is to produce sensor structure 240'''-1 as shown in FIGS. 23F and 23G using a minimum number of auxiliary masks.

A standard CMOS process can be used to implement the barrier implant between the polysilicon gate structures, for example by using an existing p doping mask such as Pwell or VTP (threshold implant for p transistors) or PLDD (lightly doped p+ drain) or even p+ diffusion. To better optimize the doping concentration and energy levels, one can implement the barrier implant with a single non-standard mask, which implementation can be negotiated with CMOS manufacturer. Understandably the fewer modifications required in a standard CMOS fabrication process, the more economical it is to produce advanced detector structures, such as described herein. However many aspects of the present invention can be added almost in retro-fit fashion to existing CMOS detector structures used described in this invention.

Detection performance of sensor structure 240'''-1 as exemplified by FIGS. 23F and 23G can be enhanced by forming angled corners on the detector periphery where there is interface with shallow trench isolation 650. By angled corners it is meant an angle other than 90°, for example 45°. Corners of 90° generate dark current and harbor trap sites that impede electron movement. Preferably 90° corners are avoided in fabricating source regions as well as the main detection area.

Applicants have discovered that further reduction in dark current and trap sites is achieved by moving the shallow trench isolation 650 away from n+ source nodes 630. Preferably the separation distance is on the order of perhaps 0.1 μm to about 0.5 μm. The desired result can be implemented by enclosing the n+ mask corresponding to the source regions within a larger diffusion mask which suppresses the shallow trench isolation in that area. Alternatively, if n+ is generated automatically by the fabrication process, n+ block is expanded to enclose the diffusion mask, but with an opening in the source region. The desired result is that the n+ source regions are surrounded by substrate instead of the usual shallow trench isolation. Care must be taken to prevent an electrical short between the source and surrounding substrate due to the salicide layer covering both areas. It is suggested that the salicide block normally used to avoid salicide formation on the polysilicon gate structures in the main detector area be expanded to enclose the source diffusion.

Additional refinement may be made to sensor structure 240'''-1 by shrinking the Pwell block so as to be enclosed within the diffusion mask. Preferably the Pwell-substrate boundary is moved inside the diffusion region within the detector a short distance (perhaps 0.1 μm) from diffusion surrounding the detector including the source regions. This improvement results in the detection area and source regions residing in the lightly-doped substrate but being surrounded by the more heavily doped Pwell. Alternatively another p type implant might be used in lieu of Pwell. The result is that the shallow trench isolation is completely isolated from the detection area and source regions. Detector performance is enhanced in that light-induced electrons are shielded from the charge traps associated with shall trench isolation. These electroncs can be collected and transported by the polysicicon G-A, G-B gates without impediment from the shallow trench isolation interface.

Preferably spacing between adjacent bias gate 640 and the distal tip of an adjacent gate G-A, or G-B is selected to maximize applicants's modulation contrast performance parameter. As previously described herein, detectors according to the present invention preferably have two collection components, denoted as A and B. Let $Q^T_A$ and $Q^T_B$ be the total charge generated by these detector components when exposed only to modulated light, e.g., from laser or other source 220. Let $Q^D_A$ and $Q^D_B$ be the charge generated by these detectors when not exposed to light. Quantities $Q^D_A$ and $Q^D_B$ represent the so-called dark current, whereby non-ideal detectors leak charge even in the absence of light. Let: $Q_A = Q^T_A - Q^D_A$ and $Q_B = Q^T_B - Q^T_B$ and represent the dark current compensated charges. Assume that the above mentioned charge quantities have a positive sign. Let:

$$MC^T_\phi = (Q^T_A - Q^T_B)/((Q^T_A + Q^T_B)/2) \text{ and}$$

$$MC_\phi = (Q_A - Q_B)/(Q_A + Q_B)/2)$$

$MC^T_\phi$ (respectively $MC_\phi$) is the ratio of the total (respectively light induced) differential charge to the common mode charge generated.

Let:

$$MC^T_{MIN} = \text{MIN}_\phi(MC^T_\phi)$$

$$MC^T_{MAX} = \text{MAX}_\phi(MC^T_\phi)$$

$$MC^T = MC^T_{MAX} - MC^T_{MIN}$$

$$MC_{MIN} = \text{MIN}_\phi)(MC_\phi)$$

$$MC_{MAX} = \text{MAX}_\phi(MC_\phi)$$

$$MC = MC_{MAX} - MC_{MIN}$$

$MC^T$ (respectively MC) is termed the modulation contrast (dark current compensated modulation contrast) and is the measure of detector performance previously referred to herein.

The maximum value for modulation contrast is four or 400%, because at best maximum value occurs when $Q^T_A=1$ and $Q^T_B=0$, and at best minimum occurs when $Q^T_A=0$ and $Q^T_B=1$ so $MC^T_{MIN}>2$ and $MC^T_{MAX}<2$. The same result is reached using dark current compensated values. When fabrication and bias parameters are optimized for high performance, exemplary values of modulation contrast for embodiments of present invention will be about 200%. This magnitude of 200% modulation contrast (out of a maximum 400%) is a substantial improvement over prior art detectors, whose modulation contrasts are perhaps in the range of about 100%.

In forming detector structures according to the present invention, if a lightly doped p substrate 410 is used (dopant concentration of about $5 \cdot 10^{14}/cm^3$) then a spaced-apart distance between adjacent finger-shaped gates G-A, G-B of about 0.5 µm to 2 µm can be realized. Following fabrication, suitable bias voltages for the n+ regions, high and low magnitudes for G-A and G-B clock voltages, and bias gate potentials will be determined. Desired operating voltages may be determined by sweeping these potentials and comparing relative detector performance for all swept operating points, and maintaining the best bias regime configurations. It is preferred that a relatively thick oxide on the order of 50 Å be employed to protect gate oxides from damage due to high gate potentials, including potential magnitudes not likely to be encountered in normal substrate operation. While various embodiments of the present invention have been described with respect to a p substrate 410, it is understood that an n substrate could instead be used, or even an n well or a p well, providing doping levels are acceptable low for all modulation regimes.

To recapitulate, the present invention provides sensor structures with improved performance for use with systems including time-of-flight and color sensing. Embodiments of the present invention are finger-shaped gate structures that extended along a y-axis, and are spaced-apart from each other a relatively short distance along the x-axis. Source collection regions are disposed adjacent distal ends of an associated elongated gate structure. Performance of structures according to the present invention is determined more by the smaller x-dimensions than by the larger y-dimensions. Performance is characterized by high x-axis electric fields and rapid charge movement, as contrasted with lower y-axis electric fields and slower charge movement. Further performance enhancement resulted from implanting a potential barrier between adjacent gates and by forming a bias gate intermediate distal ends of the elongated gates and an associated source region. The resultant detector structures are operable at the more extreme gate voltages that are desirable for high performance and high contrast modulation.

While the present invention has been described primarily for use with three-dimensional sensor systems, those skilled in the art will appreciate that detectors including color pixels can also benefit from the improved charge management structures, according to the present invention. Battery operated detection systems can be fabricated using peak and average optical emitter power in the tens or hundreds of mW range. Nonetheless cm range distance resolution, improved modulation contrast, and good signal/noise ratios can be achieved. Embodiments of the present invention may be implemented to acquire information relating solely (or otherwise) to target object brightness or color, rather than TOF z-distance. In such applications, embodiments of the present invention can be used as a filter to substantially reduce ambient light effects upon brightness information. Whereas acquiring z-information may involve operating an optical energy source at a modulation frequency in excess of 100 MHz, an application directed to acquiring brightness information could modulating the energy source at a substantially lower rate, perhaps 50 Khz or so. Further the invention could be used to measure refractive index of a target object by acquiring TOF information.

Modifications and variations may be made to the disclosed embodiments without departing from the subject and spirit of the invention as defined by the following claims.

What is claimed is:

1. A method to determine at least one spectral characteristic of multi-spectral optical energy, the method comprising the following steps:
   (a) subjecting to multi-spectral optical energy, a CMOS optical energy detector having at least one gate and an associated charge collection source region from which an output detection signal is obtainable responsive to said multi-spectral optical energy, wherein a spectral response of said detector varies dynamically as a function of voltage coupled to said gate;
   (b) collecting from said detector at least two output detection signals generated responsive to detected said multi-spectral optical energy;
   (c) determining from said at least two output detection signals at least one spectral characteristic of said multi-spectral optical energy.

2. The method of claim 1, wherein collecting at step (b) includes sequentially using at least first and second output detection signals generated by at least a single source region.

3. The method of claim 1, wherein collecting at step (b) occurs simultaneously for each said source region output detection signal.

4. The method of claim 1, wherein step (a) includes altering magnitude of said voltage coupled to said at least one gate, wherein movement of charge to said source region is altered.

5. The method of claim 1, wherein step (a) includes periodically altering magnitude of said voltage coupled to said at least one gate, wherein movement of charge to said source region is altered.

6. A system to determine at least one spectral characteristic of multi-spectral optical energy, the system including:
a CMOS optical energy detector, subjectable to said multi-spectral ambient optical energy, having at least one gate and an associated charge collection source region from which an output detection signal is obtainable, wherein a spectral response of said detector varies as a function of voltage coupled to said gate;
means for collecting from said detector at least two output detection signals generated responsive to detected said multi-spectral optical energy; and
means for determining from said at least two output detection signals at least one spectral characteristic of said multi-spectral optical energy.

7. The system of claim 6, wherein said means for collecting collects sequentially using uses at least first and second output detection signals generated by a single source region.

8. The system of claim 6, wherein said means for collecting collects simultaneously for each said source region output detection signal.

9. The system of claim 6, further including means for altering magnitude of said voltage coupled to said gate structure, wherein movement of charge to said source region is altered.

10. The system of claim 6, wherein said means for altering varies magnitude of said voltage periodically, wherein movement of charge to said source region is altered.

11. A CMOS-implementable semiconductor photodetector useable in a system that illuminates a target with optical energy having a modulated periodic waveform that includes a high frequency component, generated in response to signal provided by a clock generator, and that detects a fraction of said optical energy reflected by said target with at least one said semiconductor photodetector, said photodetector comprising:
a semiconductor substrate having a surface upon which said incoming optical energy can impinge onto an optical energy sensitive region, said surface defining an x-direction and a y-direction;
at least a first elongate-shaped polysilicon gate disposed on said surface parallel to said y-direction, said first gate coupleable to a periodic first bias clock signal, synchronously generated by said clock generator, that is periodically high during a first bias regime to detect charge beneath said first gate generated by at least a fraction of said incoming optical energy, and is periodically low otherwise;
a first source region formed in said substrate adjacent a distal end of said first gate;
at least a second elongate-shaped polysilicon gate disposed on said surface parallel to said first elongate-shaped gate and spaced-apart in said x-direction a distance substantially shorter than a length of either said gate, said second gate coupleable to a periodic second bias clock signal synchronously generated by said clock generator, said periodic second bias clock signal being periodically high during a second bias regime to detect charge beneath said second gate generated by at least a fraction of said incoming optical energy, and is low otherwise;
a second source region formed in said substrate adjacent a distal end of said second gate;
wherein a majority of optically generated charge generated in said photodetector during said first bias regime is directed to said first source region, and a majority of optically generated charge generated in said photodetector during said second bias regime is directed to said second source region.

12. A CMOS-implementable optical energy detector to detect multi-spectral incoming optical energy to determine therefrom at least one spectral characteristic of said multi-spectral optical energy, said detector comprising:
a semiconductor substrate having a surface upon which incoming said multi-spectral optical energy can impinge onto an optical energy sensitive region;
at least one gate formed on said substrate having an associated charge collection source region from which an output detection signal is obtainable responsive to said incoming multi-spectral optical energy;
means for coupling voltage to said at least one gate;
wherein a spectral response of said detector varies dynamically as a function of said voltage coupled to said gate;
wherein collection of at least two output detection signals generated by said detector responsive to detected said multi-spectral optical energy enables determination of at least one spectral characteristic of said multi-spectral optical energy.

13. The detector of claim 12, wherein said collection of at least two output detection signals occurs sequentially for each said source region output detection signal.

14. The detector of claim 12, wherein said collection of at least two output detection signals occurs simultaneously for each said source region output detection signal.

15. The detector of claim 12, wherein movement of charge to said source region alters in response to changes in magnitude of said voltage coupled to said at least one gate.

16. The detector of claim 12, wherein movement of charge to said source region alters in response to periodic changes in magnitude of said voltage coupled to said at least one gate.

* * * * *